United States Patent [19]

Shimizu et al.

[11] 4,394,425
[45] Jul. 19, 1983

[54] PHOTOCONDUCTIVE MEMBER WITH a-SI(C) BARRIER LAYER

[75] Inventors: Isamu Shimizu, Yokohama; Shigeru Shirai, Yamato; Eiichi Inoue, Tokyo, all of Japan

[73] Assignee: Canon Kabushiki Kaisha, Tokyo, Japan

[21] Appl. No.: 299,576

[22] Filed: Sep. 4, 1981

[30] Foreign Application Priority Data

| Sep. 12, 1980 | [JP] | Japan | 55-127542 |
| Sep. 12, 1980 | [JP] | Japan | 55-127543 |
| Sep. 13, 1980 | [JP] | Japan | 55-127490 |
| Sep. 24, 1980 | [JP] | Japan | 55-133209 |
| Sep. 24, 1980 | [JP] | Japan | 55-133210 |
| Sep. 24, 1980 | [JP] | Japan | 55-133211 |

[51] Int. Cl.³ .................. G03G 5/082; G03G 5/14
[52] U.S. Cl. ........................ 430/65; 430/60; 430/63; 430/66; 430/67; 430/84; 430/128; 427/74; 252/501.1; 357/2
[58] Field of Search ............. 430/57, 60, 63, 65, 430/66, 67, 84, 128, 131, 132; 427/74; 252/501.1; 357/2

[56] References Cited

U.S. PATENT DOCUMENTS

| 3,650,737 | 3/1972 | Maissel et al. | 430/67 |
| 4,217,374 | 8/1980 | Ovshinsky et al. | 427/74 X |
| 4,226,898 | 10/1980 | Ovshinsky et al. | 427/39 |
| 4,253,882 | 3/1981 | Dalal | 427/74 X |
| 4,265,991 | 5/1981 | Hirai et al. | 430/67 X |
| 4,289,822 | 9/1981 | Shimada et al. | 427/74 X |
| 4,317,844 | 3/1982 | Carlson | 427/39 |
| 4,359,512 | 11/1982 | Fukuda et al. | 430/57 |
| 4,359,514 | 11/1982 | Shimizu et al. | 430/651 |
| 4,365,013 | 12/1982 | Ishioka et al. | 430/84 X |

Primary Examiner—Roland E. Martin, Jr.
Attorney, Agent, or Firm—Fitzpatrick, Cella, Harper & Scinto

[57] ABSTRACT

A photoconductive member comprises a support, a photoconductive layer constituted of an amorphous material containing silicon atoms as matrix and containing hydrogen atoms or halogen atoms, and an intermediate layer provided between them, said intermediate layer having a function to bar penetration of carriers from the side of the support into the photoconductive layer and to permit passage from the photoconductive layer to the support of photocarriers generated in the photoconductive layer by projection of electromagnetic waves and movement of the photocarriers toward the side of the support, and said intermediate layer being constituted of an amorphous material containing silicon atoms and carbon atoms a constituents. A photoconductive member having a support, a photoconductive layer constituted of an amorphous material containing silicon atoms as matrix and containing hydrogen atoms or halogen atoms as a constituent, and an intermediate layer provided between said support and said photoconductive layer, is characterized in that said intermediate layer is constituted of an amorphous material containing silicon atoms and carbon atoms as constitution elements. A photoconductive member having a support, a photoconductive layer constituted of an amorphous material containing silicon atoms as matrix and containing hydrogen atoms or halogen atoms as a constituent, and an intermediate layer provided between said support and said photoconductive layer, characterized in that said intermediate layer is constituted of an amorphous material containing silicon atoms and carbon atoms as constitution element.

98 Claims, 18 Drawing Figures

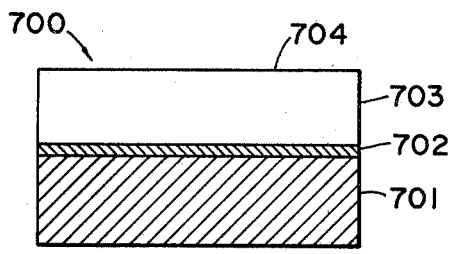
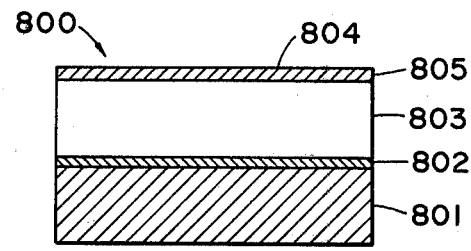
FIG. 7  FIG. 8
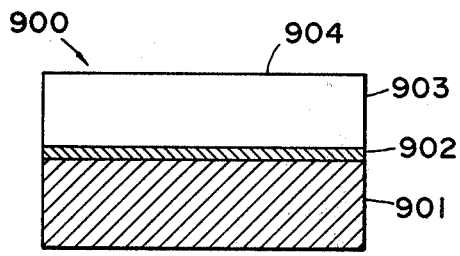
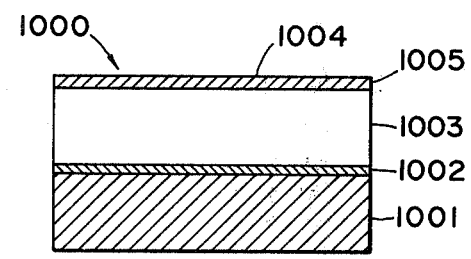
FIG. 9  FIG. 10
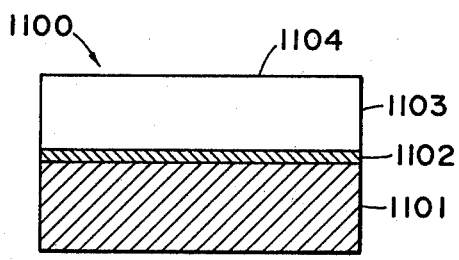
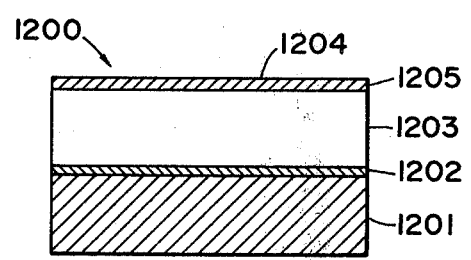
FIG. 11  FIG. 12

PHOTOCONDUCTIVE MEMBER WITH α-SI(C) BARRIER LAYER

BACKGROUND OF THE INVENTION

1. Field of the Invention

This invention relates to a photoconductive member having a sensitivity to electromagnetic waves such as light (herein used in a broad sense, including ultraviolet rays, visible light, infrared rays, X-rays, gamma-rays, and the like).

2. Description of the Prior Art

Photoconductive materials, which constitute solid state image pickup devices, image forming members for electrophotography in the field of image formation, or photoconductive layers in manuscript reading devices, are required to have a high sensitivity, a high SN ratio [photo-current($I_p$)/dark current($I_d$)], spectral characteristics corresponding to those of electromagnetic waves to be projected, a good light-response, a desired dark resistance value as well as no harm to human bodies during usage. Further, in an image pickup device, it is also required that the residual image should easily be treated within a predetermined time. In particular, in the case of image forming members for electrophotography to be assembled into an electrophotographic device to be used in an office as office apparatus, the aforesaid harmless characteristic is very important.

From the standpoint as mentioned above, amorphous silicon (hereinafter referred to as a-Si) has recently attracted attention as a photoconductive material. For example, German Laid-open Patent Publication Nos. 2,746,967 and 2,855,718 disclose applications of a-Si for use in image forming members for electrophotography, and British Laid-open Patent Publication No. 2,029,642 an application of a-Si for use in a photoelectric conversion reading device. However, the photoconductive members having photoconductive layers constituted of a-Si of prior art have various electrical, optical and photoconductive characteristics such as dark resistivity, photosensitivity and light-response as well as environmental characteristics in use such as weathering resistance and humidity resistance, which should further be improved. Thus, in a practical solid state image pickup device, reading device, an image forming member for electrophotography, and the like, they cannot be effectively used also in view of their productivity and possibility of their mass production.

For instance, when applied in an image forming member for electrophotography or an image pickup device, residual potential is frequently observed to be remained during use thereof. When such a photoconductive member is repeatedly used for a long time, there will be caused various inconveniences such as accumulation of fatigues by repeated use or so called ghost phenomenon wherein residual images are formed.

Further, according to a number of experiments by the present inventors, a-Si material constituting the photoconductive layer of an image forming member for electrophotography, while it has a number of advantages, as compared with Se, Zno or orgainc photoconductive materials such as PVCz, TNF, and the like of prior art, is also found to have several problems to be solved. Namely, even if charging treatment is applied for formation of electrostatic images on the photoconductive layer of an image forming member for electrophotography having a photoconductive member constituted of a mono-layer of a-Si which has been endowed with characteristics for use in a solar battery of prior art, dark decay is markedly rapid, whereby it is difficult to apply a conventional photographic process. This tendency is further pronounced under a humid atmosphere to such an extent in some cases that no charge is retained at all before development.

Thus, it is required upon designing a photoconductive material to make efforts to obtain desirable electrical, optical, and photoconductive characteristics along with the improvement of a-Si materials per se.

The present invention was accomplished to solve the above-mentioned problems. The followings have been found as a result of extensive stuides made comprehensively from the standpoints of applicability and utility of a-Si as a photoconductive member for image forming members for electrophotography, image pickup devices or reading devices. It has now been found that a photoconductive member manufactured to have a layer structure comprising a photoconductive layer of a so called hydrogenated amorphous silicon (hereinafter referred to as a-Si:H), which is an amorphous material containing hydrogen in a matrix of silicon, or a so called halogenated amorphous silicon (hereinafter referred to as a-Si:X), which is an amorphout material containing halogen atoms(X) in a matrix of silicon atoms, and a specific intermediate layer interposed between said photoconductive layer and a support which supports said photoconductive layer, is not only actually useful but also superior in substantially all features in comparison with photoconductive members of prior art, and has especially markedly excellent characteristics as a photoconductive member for electrophotography. The present invention is based on this finding.

SUMMARY OF THE INVENTION

The primary object of the present invention is to provide a photoconductive member having constantly stable electrical, optical and photoconductive characteristics, which is an all-environment type substantially without limitations with respect to the environment under which it is used, being markedly resistant to light-fatigue without deterioration after repeated use and free entirely or substantially from residual potentials observed.

Another object of the present invention is to provide a photoconductive member, having a high photosensitivity with a spectral sensitive region covering substantially all over the region of visible light, and having also a rapid light-response.

Still another object of the present invention is to provide a photoconductive member, which is sufficiently capable of bearing charges at the time of charging treatment for formation of electrostatic images to the extent such that a conventional electrophotographic process can be applied when it is provided for use as an image forming member for electrophotography, and which has excellent electrophotographic characteristics of which substantially no deterioration is observed even under a highly humid atmosphere.

Further, still another object of the present invention is to provide a photoconductive member for electrophotography capable of providing easily a high quality image which is high in density, clear in halftone and high in resolution.

According to one aspect of the present invention, there is provided a photoconductive member having a support, a photoconductive layer constituted of an amorphous material containing silicon atoms as matrix and containing hydrogen atoms or halogen atoms as a constituting element, and an intermediate layer provided between said support and said photoconductive layer, characterized in that said intermediate layer comprises an amorphous material constituted of silicon atoms and carbon atoms.

According to another aspect of the present invention, there is provided a photoconductive member comprising a support, a photoconductive layer constituted of an amorphous material containing silicon atoms as matrix and containing hydrogen atoms or halogen atoms, and an intermediate layer provided between them, said intermediate layer having a function to bar penetration of carriers from the side of the support into the photoconductive layer and to permit passage from the photoconductive layer to the support of photocarriers generated in the photoconductive layer by projection of electromagnetic waves and movement of the photocarriers toward the side of the support, and said intermediate layer being constituted of an amorphous material containing silicon atoms and carbon atoms as constituting elements.

BRIEF DESCRIPTION OF THE DRAWINGS

FIGS. 1 through 12 show schematic sectional views of the embodiment of the photoconductive members according to the present invention, respectively.

DETAILED DESCRIPTION OF THE PREFERRED EMBODIMENTS

Figure 1:
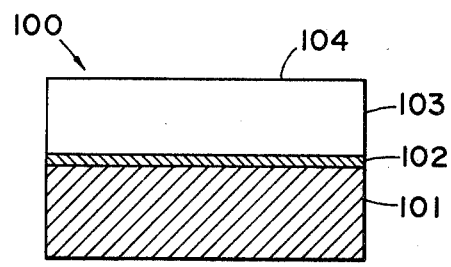

Referring now to the drawings, the photoconductive members according to the present invention are to be described in detail below.

FIG. 1 shows a schematic sectional view for illustration of the basic embodiment of the photoconductive member of this invention.

The photoconductive member 100 as shown in FIG. 1 is one of the most basic embodiment, having a layer structure comprising a support 101 for photoconductive member, an intermediate layer 102 provided on said support and a photoconductive layer 103 provided in direct contact with said intermediate layer 102.

The support 101 may be either electroconductive or insulating. As the electroconductive material, there may be mentioned metals such as NiCr, stainless steel, Al, Cr, Mo, Au, Ir, Nb, V, Ti, Pt, Pd, etc. or alloys thereof.

As insulating supports, there may be usually used films or sheets of synthetic resins, including polyesters, polyethylene, polycarbonates, cellulose actate, polypropylene, polyvinyl chloride, polyvinylidene chloride, polystyrene, polyamides, etc., glasses, ceramics, papers and the like. These insulating supports may suitably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO($In_2O_3+SnO_2$) thereon. Alternatively, a synthetic resin film such as polyester film can be subjected to the electroconductive treatment on its surface by vapor deposition, electron-beam deposition or sputtering of a metal such as NiCr, Al, Ag, Pb, Zn, Ni, Au, Cr, Mo, Ir, Nb, Ta, V, Ti, Pt, and the like or by laminating treatment with said metal. The support may be shaped in any form such as cylinders, belts, plates, and the like, and its form may be determined as desired. For example, when the photoconductive member 100 shown in FIG. 1 is to be used as an image forming member for electrophotography, it may desirably be formed into an endless belt or a cylinder for use in continuous high speed copying. The support may have a thickness, which is suitably determined so that a photoconductive member as desired may be formed. When the photoconductive member is required to have a flexibility, the support is made as thin as possible, so far as the function of a support can be sufficiently exhibited. However, in such a case, the thickness is generally $10\mu$ or more from the points of fabrication and handling of the support as well as its mechanical strength.

The intermediate layer 102 is constituted of a non-photoconductive amorphous material containing silicon atoms and carbon atoms (hereinafter referred to as a-$Si_xC_{1-x}$, wherein $0<x<1$), which has the function of a so called barrier layer capable of berring effectively penetration of carriers into the photoconductive layer 103 from the side of the support 101 and permitting easily the photocarriers, which are generated by projection of electromagnetic waves in the photoconductive layer 103 and migrate toward the support 101 to pass therethrough from the side of the photoconductive layer 103 to the side of the support 101.

The intermediate layer 102 constituted of a-$Si_xC_{1-x}$ may be formed by a sputtering method, an ion implantation method, an ion plating method, an electron-beam method or the like. These production methods are suitably selected depending on the factors such as production conditions, the degree of loading of installation capital investment, production scale, the desirable characteristics of the photoconductive members to be prepared, and the like. On the base of the advantages of relatively easy control of the conditions for preparation of photoconductive members having desired characteristics as well as easy feasibleness of introduction of carbon atoms together with silicon atoms into the intermediate layer 102 to be prepared, it is preferred to use the sputtering method, the electron-beam method or the ion plating method.

For formation of the intermediate layer 102 by the sputtering method, a single crystalline or polycrystalline Si wafer and C wafer or a wafer containing Si and C mixed therein is used as target and subjected to sputtering in an atmosphere of various gases.

For example, when Si wafer and C wafer are used as target, a gas for sputtering such as He, Ne, Ar, and the like is introduced into a deposition chamber for sputtering to form a gas plasma therein and effect sputtering of the Si wafer and C wafer. Alternatively, one sheet target of a molded mixture of Si and C can be used and by introducing a gas for sputtering into a device system, sputtering may be effected in an atmosphere of the gas.

When the electron-beam method is used, there are placed respectively single crystalline or polycrystalline high purity silicon and high purity graphite in two boats for deposition, and each may independently be irradiated by an electron beam to effect concurrently vapor deposition of both materials. Alternatively, crystalline silicon (Si) and graphite (C) placed in the same single boat for deposition may be irradiated by a single electron beam to effect vapor deposition. The ratio of silicon atoms to carbon atoms to be contained in the intermediate layer 102 is controlled in the former case by varying the acceleration voltage for electron beams applied on the crystalline silicon and graphite, respectively, and by the predetermined mixing ratio of crystalline silicon to graphite in the latter.

When the ion plating method is used, various gases are introduced into a deposition tank and a high frequency electric field is applied on the coil previously rolled around the tank to effect a glow discharge, under such state Si and C are vapor deposited by utilizing the electron beam method.

The intermediate layer 102 of the present invention is formed carefully so that the characteristics required may be given exactly as desired.

In other words, a substance constituted of silicon atoms (Si) and carbon atoms (C) can structurally take a form from a crystalline to amorphous state depending on the conditions for preparing thereof, exhibiting as electrical properties from electroconductive through semi-conductive to insulating, and from photoconductive to non-photoconductive, respectively. Hence, in the present invention, the conditions are severely selected for preparation of an a-$Si_xC_{1-x}$ non-photoconductive in so-called visible region.

Since the function of the intermediate layer 102 of this invention is to bar penetration of carriers from the side of the support 101 into the photoconductive layer 103, while the photocarriers generated in the photoconductive layer 103 are easily permitted to be migrated and passed therethrough to the side of the support 101, it is desirable that a-$Si_xC_{1-x}$ constituting the intermediate layer 102 is formed so as to exhibit insulating behaviors in the visible region.

As another critical element in the conditions for preparing a-$Si_xC_{1-x}$ so as to have a mobility value with respect to passing carriers to the extent that passing of photocarriers generated in the photoconductive layer 103 may be passed smoothly through the intermediate layer 102, there may be mentioned the support temperature during preparation thereof.

In other words, upon forming an intermediate layer 102 constituted of a-$Si_xC_{1-x}$ on the surface of the support 101, the support temperature during the layer formation is an important factor affecting the structure and characteristics of the layer formed. In the present invention, the support temperature during the layer formation is severely controlled so that the a-$Si_xC_{1-x}$ having the desired characteristics may be prepared exactly as desired.

In order that the objects of the present invention may be achieved effectively, the support temperature during formation of the intermediate layer 102, which is suitably selected within an optimum range depending on the method employed for formation of the intermediate layer 102 is generally 20° to 200° C., preferably 20° to 150° C.

For formation of the intermediate layer 102, it is advantageous to adopt a sputtering method or an electron beam method, since these methods can afford severe controlling of the atomic ratios constituting each layer or layer thicknesses with relative ease as compared with other methods and it is possible to form continuously the photoconductive layer 103 on the intermediate layer 102 and further a third layer to be formed on the photoconductive layer 103 in the same system, if desired. In case of forming the intermediate layer 102 according to these layer forming methods, the discharging power during layer formation may also be mentioned, similarly to the support temperature as described above, as an important factor influencing the characteristics of a-$Si_xC_{1-x}$ to be prepared.

In such methods for preparation of the intermediate layer, the discharging power condition for preparing effectively a-$Si_xC_{1-x}$ having characteristics for accomplishment of the object of this invention is generally 50 W to 250 W, preferably 80 W to 150 W.

The content of the carbon atoms (C) in the intermediate layer 102 in the photoconductive member of this invention is also one of the important factor for forming the intermediate layer 102 with desired characteristics to achieve the object of this invention, similarly to the condition for preparation of the intermediate layer 102. The content of carbon atoms (C) in the intermediate layer is, based on silicon atoms (Si) and carbon atoms (C), generally 60 to 90 atomic %, preferably 65 to 80 atomic %, most preferably 70 to 75 atomic %. As expressed alternatively, in terms of the previous representation a-$Si_xC_{1-x}$, x is generally 0.4 to 0.1, preferably 0.35 to 0.2, most preferably 0.3 to 0.25.

The numerical range of the layer thickness of the intermediate layer 102 is also another important factors to achieve effectively the object of this invention.

In other words, if the layer thickness of the intermediate layer is too thin, the function of barring penetration of carriers from the side of the support 101 into the photoconductive layer 103 cannot sufficiently be fulfilled. On the contrary, if the thickness is too thick, the probability of the photocarriers generated in the photoconductive layer 103 to pass to the side of the support 101 is very small. Thus, in any of the cases, the objects of this invention cannot effectively be achieved.

The layer thickness to achieve effectively the objects of this invention is generally in the range of from 30 to 1000 Å, preferably from 50 to 600 Å, most preferably from 50 to 300 Å.

In the present invention, in order to achieve its objects effectively, the photoconductive layer 103 overlaid on the intermediate layer is constituted of a-Si:H having the semiconductor characteristics as shown below.

1. p-type a-Si:H . . . Containing only acceptor or containing both donor and acceptor with higher concentration of acceptor (Na).

2. p$^-$-type a-Si:H . . . A type of 1 which contains acceptor at low concentration (Na), for example, being doped with an appropriate quantity of p-type impurities.

3. n-type a-Si:H . . . Containing only donor or containing both donor and acceptor with higher concentration of donor (Nd).

4. n$^-$-type a-Si:H . . . A type of 3 which contains donor at low concentration (Nd), for example, being doped lightly with n-type impurities or non-doped.

5. i-type a-Si:H . . . Where Na≃Nd≃O or Na≃Nd.

In the present invention, a-Si:H constituting the photoconductive layer 103, since it is provided through the intermediate layer 102 on the support, can be one having relatively lower electric resistivity, but for obtaining better results, the photoconductive layer is preferably produced, so that the dark resistivity of the photoconductive layer formed may preferably be $5 \times 10^9$ Ωcm or more, most preferably $10^{10}$ Ωcm or more.

In particular, the numerical condition for the dark resistivity values is an important factor when using the prepared photoconductive member as an image forming member for electrophotography, as a high sensitive reading device or an image pickup device to be used under low illuminance regions, or as a photoelectric converter.

In the present invention, for providing a photoconductive layer constituted of a-Si:H, hydrogen atoms (H) are incorporated during formation of such a layer in the following process.

The expression "H is contained or incorporated in a layer" herein mentioned means the state, in which "H is bonded to Si", or in which "H is ionized to be incorporated in the layer", or in which "H is incorporated in a form of $H_2$ in the layer".

As the method for incorporating hydrogen atoms (H) into the photoconductive layer, for example, silanes such as $SiH_4$, $Si_2H_6$, $Si_3H_8$, $Si_4H_{10}$ and so on is introduced in a gaseous state into a diposition device system when forming a layer, and decomposing these compounds by the glow discharge decomposition method to be incorporated in the layer simultaneously with the growth of the layer.

In forming the photoconductive layer by the glow discharge decomposition method, when a silicon hydride such as $SiH_4$, $Si_2H_6$, $Si_3H_8$, $Si_4H_{10}$ and the like is used as the starting material for supplying silicon atoms (Si), hydrogen atoms (H) are automatically incorporated in the layer when it is formed by decomposition of gases of these compounds.

When the reactive sputtering method is used, $H_2$ gas is introduced into the system wherein sputtering is effected in an atmosphere of an inert gas such as He, Ar, and a gas mixture containing these gases as the base, using Si as target, or alternatively a gas of silanes such as $SiH_4$, $Si_2H_6$, $Si_3H_8$, $Si_4H_{10}$ and the like or a gas such as $B_2H_6$, $PH_3$ to concurrently effect doping, may be introduced thereinto.

According to the experience by the present inventors, it has been found that the content of hydrogen atoms (H) in the photoconductive layer constituted of a-Si:H is one of the great factors which determine whether the photoconductive layer formed is actually useful.

In the present invention, in order that the photoconductive layer formed is sufficiently useful in practical applications, the content of hydrogen atoms (H) in the photoconductive layer is generally 1 to 40 atomic %, preferably 5 to 30 atomic %. The content of H in the layer can be controlled by the deposition support temperature or/and the quantity of the starting material to be introduced into the deposition device for incorporation of H, discharging power or others.

In order to make the photoconductive layer n-type, p-type or i-type, n-type impurity, p-type impurity or both can be added into the layer in a controlled amount during formation of the layer by the glow discharge method or the reactive sputtering method.

As the impurity to be added into the photoconductive layer to make it p-type, there may be mentioned preferably elements in Group III A of the periodic table, for example, B, Al, Ga, In, Tl, etc.

On the other hand, for obtaining a n-type, there may preferably be used elements in the Group VA of the periodic table, such as N, P, As, Sb, Bi, etc.

In case of a-Si:H, the so called non-doped a-Si:H, which is formed without addition of the n-type impurity or the p-type impurity, generally shows slightly the tendency of n-type ($n^-$-type). Accordingly, in order to obtain an i-type a-Si:H, it is necessary to add an appropriate, although very small, quantity of p-type impurity into the non-doped a-Si:H. Since a photoconductive member for electrophotography is required to have a sufficiently large dark resistivity, it is desirable to constitute a photoconductive layer of non-doped a-Si:H or an i-type a-Si:H in which a p-type impurity such as B is added in a small quantity.

The impurities as described above are contained in the layer in an amount in an order of ppm. so that it is not necessary to pay such a great attention to the pollution caused thereby as in the case of the principal ingredients constituting the photoconductive layer, but it is also preferable to use a substance which is as less pollutive as possible. From such a standpoint, also in view of the electrical and optical characteristics of the layer formed, a material such as B, As, P, Sb and the like is most preferred. In addition, for example, it is also possible to control the layer to n-type by interstitial doping of Li or others through thermal diffusion or implantation.

The amount of the impurity to be added into the photoconductive layer, which is determined suitably depending on the electrical and optical characteristics desired, but in the range of, in case of an impurity in Group III A of the periodic table, generally from $10^{-6}$ to $10^{-3}$ atomic ratio, preferably from $10^{-5}$ to $10^{-4}$ atomic ratio, and, in case of an impurity in the Group VA of the periodic table, generally from $10^{-8}$ to $10^{-3}$ atomic ratio, preferably from $10^{-8}$ to $10^{-4}$ atomic ratio.

Figure 2:
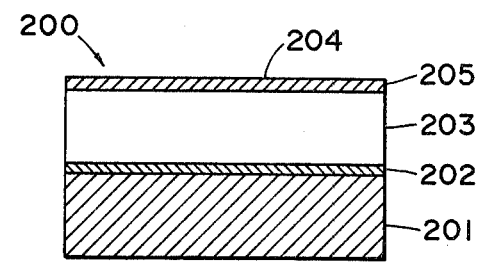

FIG. 2 shows a schematic sectional view of another embodiment of the photoconductive member of this invention. The photoconductive member 200 as shown in FIG. 2 has the same layer structure as that of the photoconductive member 100 shown in FIG. 1, except that the upper layer 205 having the same function as the intermediate layer 202 is provided on the photoconductive layer 203.

The photoconductive member 200 is provided with an intermediate layer 202 a-$Si_xC_{1-x}$ formed of the same material as that of the intermediate layer 102 so as to have the same function that of the layer 102, a photoconductive layer 203 constituted of a-Si:H similar to the photoconductive layer 103, and the upper layer 205 having the free surface 204 which is provided on said photoconductive layer 203.

The upper layer 205 has the following functions. For example, when the photoconductive member 200 is used in a manner so as to form charge images by applying charging treatment on the free surface 204, the upper layer functions to bar penetration of charges to be retained on the free surface 204 into the photoconductive layer 203, and, when projecting electromagnetic waves, also to permit easily passage of the photocarriers generated in the photoconductive layer 203 so that the carriers may be recombined with the charges at portions projected by electromagnetic waves.

The upper layer 205 may be constituted by a-$Si_xC_{1-x}$ having the same characteristics as that of the intermediate layer 202. Moreover, the upper layer may be constituted of an amorphous material comprising any one of silicon atoms (Si), carbon atoms (C), nitrogen atoms (N), and oxygen atoms (O), which are the matrix atoms constituting the photoconductive layer 203, or the amorphous material containing further at least one of hydrogen atoms (H) and halogen atoms (X); for example, a-$Si_xC_{1-x}$ containing at least one of hydrogen atoms (H) and halogen atoms (X), a-$Si_yN_{1-y}$, a-$Si_zN_{1-z}$ containing at least one of hydrogen atoms (H) and halogen atoms (X), $a\text{-}Si_aO_{1-a}$, $a\text{-}Si_bO_{1-b}$ containing at least one of hydrogen atoms (H) and halogen atoms (X). Further, the upper layer may also be constituted by an inorganic insulating material such as $Al_2O_3$ or organic insulating materials such as polyesters, poly-p-xylylene, polyurethanes, and the like. However, in view of the productivity, mass productivity as well as the electrical and environmental stabilities during use, the material constituting the upper layer 205 is desirably $a\text{-}Si_xC_{1-x}$ having the same characteristics as that of the intermediate layer 202 or $a\text{-}Si_xC_{1-x}$ containing at least one of hydrogen atoms (H) and halogen atoms (X). In addition to those mentioned above, other materials suitable for constituting the upper layer 205 may include amorphous materials containing as matrix at least two of C, N and O together with silicon atoms, and also containing hydrogen atoms or halogen atoms or both. As the halogen atom, there may be mentioned F, Cl, Br, etc., but an amorphous material containing F is effective with respect to thermal stability.

When the photoconductive member 200 is used in such a way that projection of electromagnetic waves to which the photoconductive layer 203 is sensitive is conducted from the side of the upper layer 205, selection of the material constituting the upper layer 205 and determination of its layer thickness are conducted carefully so that a sufficient amount of the electromagnetic waves projected may reach the photoconductive layer 203 to cause generation of photocarriers with good efficiency.

The upper layer 205 may be formed by use of the same method and the same material as those in preparation of the intermediate layer 102. It is also possible to use the glow discharge method similarly as in formation of the photoconductive layer 103 or 203. Further, it can be formed according to the reactive sputtering method, using a gas for introduction of hydrogen atoms, a gas for introduction of halogen atoms or both thereof.

As the starting materials to be used for formation of the upper layer 205, there may be employed those mentioned above which are used for formation of the intermediate layer 102 or the photoconductive layer 103. In addition, the effective starting material to be the starting gas for introduction of halogen atoms is preferably various halogen compounds such as a halogen gas or a halide or an interhalogen compound which is gaseous or gassifiable.

Alternatively, it is also effective in the present invention to use gaseous or gassifiable silicon compound containing halogen atoms which can supply both silicon atoms (Si) and halogen atoms (X) at the same time.

Typical examples of halogen compounds preferably used in the present invention may include halogen gases such as fluorine, chlorine, bromine and iodine and interhalogen compounds such as BrF, ClF, ClF$_3$, BrF$_5$, BrF$_3$, IF$_7$, IF$_5$, ICl, IBr, and the like.

As the silicon compound containing halogen atoms, silicon halides such as SiF$_4$, Si$_2$F$_6$, SiCl$_4$, SiBr$_4$, and the like are preferred.

When the upper layer 205 is formed according to a glow discharge method by use of a silicon compound containing halogen atoms, it is not necessary to use a silicon hydride gas as the starting gas capable of supplying Si. In forming the upper layer 205 according to the glow discharge method, the basic procedure comprises feeding a starting gas for supplying Si such as silicon hydride or a gas of silicon halide, a gas of a starting material for introduction of carbon atoms, oxygen atoms or nitrogen atoms and, if necessary, a gas such as Ar, H$_2$, He, and the like at a predetermined ratio in a suitable gas flow amount into the deposition chamber for formation of the photoconductive member, followed by excitation of glow discharge to form a plasma atmosphere of these gases, thereby forming an upper layer on the photoconductive layer.

Each of the gases for introduction of respective atoms may be used not only alone a single species but with mixing plural species at a predetermined ratio.

In case of the reactive sputtering method, sputtering can be effected by using a target of Si in a plasma atmosphere of a gas comprising desired starting substances for introduction of desired atoms to form the upper layer. For example, when halogen atoms are to be introduced into the upper layer formed, a gas of the aforesaid halogen compound or the silicon compound containing halogen atoms may be introduced into the deposition chamber to form a plasma atmosphere therein. Likewise, for introducing carbon atoms, oxygen atoms or nitrogen atoms into the upper layer, a corresponding starting gas for introduction of these atoms is introduced into the deposition chamber.

Alternatively, the upper layer can be formed according to the reactive sputtering method by using a single crystalline or polycrystalline Si wafer, Si$_3$N$_4$ wafer, a wafer containing Si and Si$_3$N$_4$ mixed therein, SiO$_2$ wafer or a wafer containing Si and SiO$_2$ mixed therein as target, and effecting sputtering of these in various gas atmospheres so that desired upper layer may be formed. For example, when Si wafer is used as target, the starting gas for introduction of N and H, for example, H$_2$ and N$_2$ or NH$_3$, which may optionally be diluted with a diluting gas, if desired, are introduced into the deposition chamber for sputtering to form a gas plasma of these gases and effect sputtering of the aforesaid Si wafer. As other methods, by use of separate targets of Si and Si$_3$N$_4$ or one sheet of a mixture of Si and Si$_3$N$_4$, sputtering can be effected in a gas atmosphere containing at least hydrogen atoms (H).

In the present invention, as the starting material for introduction of halogen atoms in forming the upper layer, the halogen compounds of silicon compounds containing halogens as mentioned above can effectively be used. In addition, it is also possible to use effectively a gaseous or gassifiable halide containing hydrogen atom such as hydrogen halide, including HF, HCl, HBr, HI and the like or halogen-substituted silicon hydride, including SiH$_2$F$_2$, SiH$_2$Cl$_2$, SiHCl$_3$, SiH$_2$Br$_2$, SiHBr$_3$ and the like.

These halides containing hydrogen atom can preferably be used as the starting material for introduction of halogen atoms, since these halides can introduce hydrogen atoms (H) very effectively for controlling electrical or optical characteristics into the layer during formation of the upper layer simultaneously with introduction of halogen atoms (X).

As the starting material for introduction of carbon atoms in forming the upper layer, there may be mentioned saturated hydrocarbons having 1 to 4 carbons, ethylenic hydrocarbons having 1 to 4 carbon atoms and acetylenic compounds having 2 to 3 carbon atoms. Typical examples are saturated hydrocarbons such as methane (CH$_4$), ethane (C$_2$H$_6$), propane (C$_3$H$_8$), n-butane (n-C$_4$H$_{10}$), pentane (C$_5$H$_{12}$) and the like; ethylenic hydrocarbons such as ethylene (C$_2$H$_4$), propylene (C$_3$H$_6$), butene-1 (C$_4$H$_8$), butene-2 (C$_4$H$_8$), isocutylene ($C_4H_8$), pentene ($C_5H_{10}$) and the like; and acetylenic hydrocarbons such as acetylene ($C_2H_2$), methylacetylene ($C_3H_4$), butyne ($C_4H_6$) and the like.

The starting material for incorporating oxygen atoms into the upper layer may include, for example, oxygen ($O_2$), ozone ($O_3$), carbon monoxide (CO), carbon dioxide ($CO_2$), nitrogen monoxide (NO), nitrogen dioxide ($NO_2$), dinitrogen monoxide ($N_2O$), etc.

The starting material for incorporating nitrogen atoms into the upper layer may include compounds containing nitrogen within the above-mentioned starting material for incorporating oxygen atoms, and also include, for example, gaseous or gassifiable nitrogen compounds such as nitrogen, nitrides or azides constituted of nitrogen or nitrogen and hydrogen, as exemplified by nitrogen ($N_2$), ammonia ($NH_3$), hydrazine ($H_2NNH_2$), hydrogen azide ($HN_3$), ammonium azide ($NH_4N_3$), etc.

In addition to those mentioned above, as the starting materials useful for formation of the upper layer, there are halogen-substituted paraffinic hydrocarbons such as $CCl_4$, $CHF_3$, $CH_2F_2$, $CH_3F$, $CH_3Cl$, $CH_3Br$, $CH_3I$, $C_2H_5Cl$, etc.; fluorinated sulfur compounds such as $SF_4$, $SF_6$, etc.; alkyl silanes such as $Si(CH_3)_4$, $Si(C_2H_5)$, etc.; and halogen-containing alkyl silanes such as $SiCl(CH_3)_3$, $SiCl_2(CH_3)_2$, $SiCl_3CH_3$, etc.

These starting materials for formation of the upper layer are suitably selected in forming the layer so that the required atoms may be contained as constituent atoms in the upper layer formed.

For example, when using the glow discharge method, there may be employed a single gas such as $Si(CH_3)_4$, $SiCl_2(CH_3)_2$, and the like, or a gas mixture such as $SiH_4$-$N_2O$ system, $SiH_4$-$O_2$ (-Ar) system, $SiH_4$-$NO_2$ system, $SiH_4$-$O_2$-$N_2$ system, $SiCl_4$-$CO_2$-$H_2$ system, $SiCl_4$-NO-$H_2$ system, $SiH_4$-$NH_3$ system, $SiCl_4$-$NH_4$ system, $SiH_4$-$N_2$ system, $SiH_4$-$NH_3$-NO system, $Si(CH_3)_4$-$SiH_4$ system, $SiCl_2(CH_3)_2$-$SiH_4$ system, and the like, as the starting material for formation of the upper layer.

Figure 3:
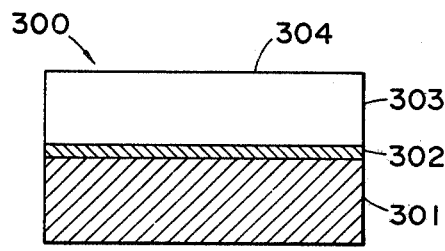

FIG. 3 shows a schematic sectional view for illustration of another basic embodiment of the photoconductive member of this invention.

The photoconductive member 300 as shown in FIG. 3 is one of the most basic embodiment, having a layer structure comprising a support 301 for photoconductive member, an intermediate layer 302 provided on said support, and a photoconductive layer 303 provided in direct contact with said intermediate layer 302. The support 301 and the photoconductive layer 303 are constituted of the same materials as described for the support 101 and the photoconductive layer 103 in FIG. 1, respectively.

The intermediate layer 302 is constituted of a non-photoconductive amorphous material containing as a matrix silicon atoms (Si) and carbon atoms (C), and containing hydrogen atoms (H) [hereinafter referred to as a-$(Si_xC_{1-x})_y$: $H_{1-y}$, where $0<x<1$, $0<y<1$], and has the same function as the intermediate layer 102 as described in FIG. 1.

The intermediate layer 302 constituted of a-$(Si_xC_{1-x})_y$: $H_{1-y}$ may be formed by a glow discharge method, a sputtering method, an ion implantation method, an ion plating method, an electron-beam method, or the like. These production methods are suitably selected, but it is preferred to use the glow discharge method or the sputtering method for the advantages of relatively easy control of the conditions for preparation of photoconductive members having desired characteristics as well as easy feasibleness of introduction of carbon atoms and hydrogen atoms together with silicon atoms into the intermeidate layer 302 to be prepared.

Further, in the present invention, the glow discharge method and the sputtering method can be used in combination in the same apparatus system to form the intermediate layer 302.

For formation of the intermediate layer 302 according to the glow discharge method, starting gases for formation of a-$(Si_xC_{1-x})_y$: $H_{1-y}$, which may optionally be mixed with a diluting gas at a predetermined ratio, are introduced into the deposition chamber for vacuum deposition in which the support 301 is placed, whereupon gas plasma is formed by exciting glow discharge of the gases introduced thereby to effect deposition of a-$(Si_xC_{1-x})_y$: $H_{1-y}$ on the aforesaid support 301.

As the starting gas to be used for formation of a-$(Si_xC_{1-x})_y$: $H_{1-y}$, most of gaseous substances of gassified products of gassifiable substances containing at least one of Si, C and H as constituent atoms may be available.

When a starting gas having Si as constituent atoms is to be used, it is possible to use a mixture of a starting gas having Si as constituent atom, a starting gas having C as constituent atom, and a gas having H as constituent atom at a desired mixing ratio. Alternatively, a mixture of a starting gas having Si as constituent atom and a starting gas having C and H as constituent atoms at a desired mixing ratio can also be used. Further it is also possible to use a mixture of starting gas having Si as constituent atom and a starting gas having the three atoms of Si, C and H as constituent atoms.

As another method, it is also possible to use a mixture of a starting gas having Si and H as constituent atoms and a starting gas having C as constituent atom.

In the present invention, the starting gas to be effectively used for formation of the intermediate layer 302 is silanes gas such as $SiH_4$, $Si_2H_6$, $Si_3H_8$, $Si_4H_{10}$ and the like and a gas having C and H as constituent atoms, such as saturated hydrocarbons having 1 to 4 carbon atoms, ethylenic carbon atoms having 2 to 4 carbon atoms and acetylenic hydrocarbons having 2 to 3 carbon atoms. Typical examples are saturated hydrocarbons such as methane ($CH_4$), ethane ($C_2H_6$), propane ($C_3H_8$), n-butane (n-$C_4H_{10}$), pentane ($C_5H_{12}$) and the like; ethylenic hydrocarbons such as ethylene ($C_2H_4$), propylene ($C_3H_6$), butene-1 ($C_4H_8$), butene-2 ($C_4H_8$), isobutylene ($C_4H_8$), pentene ($C_5H_{10}$) and the like; and acetylenic hydrocarbons such as acetylene ($C_2H_2$), methylacetylene ($C_3H_4$), butyne ($C_4H_6$) and the like.

Typical examples of the starting gas having Si, C and H as constituent atoms are alkyl silanes such as $Si(CH_3)_4$, $Si(C_2H_5)_4$ and the like. In addition to these starting gases, $H_2$ can of course be effectively used as the starting gas for introduction of hydrogen atoms (H).

For formation of the intermediate layer 302 by a sputtering method, there may be used a single crystalline or polycrystalline Si wafer, C wafer or a wafer containing Si and C mixed therein as target, and effecting sputtering of these in various gas atmospheres so that desired intermediate layer may be formed. For example, when Si wafer is used as target, the starting gas for introduction of C and H, which may optionally be diluted with a diluting gas, if desired, are introduced into the deposition chamber for sputtering to form a gas plasma of these gases and effect sputtering of the aforesaid Si wafer. As other methods, by use of separate targets of Si and C or one sheet of a molded mixture of Si and C, sputtering can be effected in a gas atmosphere containing at least hydrogen atoms (H).

As the starting gases for introduction of carbon atoms (C) and hydrogen atoms (H), there may be employed the starting gases exemplified in the glow discharge method as effective gases also in the sputtering.

In the present invention, the diluting gas to be used in forming the intermediate layer 302 by the glow discharge method or the sputtering method is preferably a so-called rare gas such as He, Ne, Ar, etc.

The intermediate layer 302 in the present invention is formed carefully so that the characteristics required may be given exactly as desired.

A substance constituted of silicon atoms (Si), carbon atoms (C) and hydrogen atoms (H) can structurally take a form from a crystalline to amorphous state, exhibiting as electrical properties from electroconductive through semi-conductive to insulating, and from photoconductive to non-conductive, respectively. Hence, in the present invention, the conditions are severely selected for preparation of an a-$(Si_xC_{1-x})_y$:$H_{1-y}$ non-photoconductive to so-called visible region.

Since the function of a-$(Si_xC_{1-x})_y$: $H_{1-y}$ constituting the intermediate layer 302 of this invention is to bar penetration of carriers from the side of the support 301 into the photoconductive layer 303, while permitting easily the photocarriers generated in the photoconductive layer 303 to be migrated and passed therethrough to the side of the support 301, it is desirable that the intermediate layer 302 is formed so as to exhibit insulating behaviors in the visible region.

As another critical element in the conditions for preparing a-$(Si_xC_{1-x})_y$:$H_{1-y}$ so as to have a mobility value with respect to passing carriers to the extent that passing of photocarriers generated in the photoconductive layer 303 may be passed smoothly through the intermediate layer 302, there may be mentioned the support temperature during preparation thereof.

In other words, upon forming an intermediate layer 302 constituted of a-$(Si_xC_{1-x})_y$:$H_{1-y}$ on the surface of the support 301, the support temperature during the layer formation is an important factor affecting the structure and characteristics of the layer formed. In the present invention, the support temperature during the layer formation is severely controlled so that a-$(Si_xC_{1-x})_y$:$H_{1-y}$ having the desired characteristics may be prepared exactly as desired.

In order that the objects of the present invention may be achieved effectively, the support temperature during formation of the intermediate layer 302, which is suitably selected within an optimum range depending on the method employed for formation of the intermediate layer 302, is generally 100 to 300° C., preferably 150° to 250° C.

For formation of the intermediate layer 302, it is advantageous to adopt a glow discharge method or a reaction sputtering method, since these methods can afford severe controlling of the atomic ratios constituting each layer or layer thicknesses with relative ease as compared with other methods and it is possible to form continuously the photoconductive layer 303 on the intermediate layer 302 and further a third layer to be formed on the photoconductive layer 303 in the same system, if desired. In case of forming the intermediate layer 302 according to these layer forming methods, the discharging power and the gas pressure during layer formation may also be mentioned, similarly as the support temperature as described above, as an important factor influencing the characteristics of a-$(Si_xC_{1-x})_y$:$H_{1-y}$ to be prepared.

In such methods for preparation of the intermediate layer, the discharging power condition for preparing effectively with good productivity a-$(Si_xC_{1-x})_y$:$H_{1-y}$ having characteristics for accomplishment of the object of this invention is generally 1 W through 300 W, preferably 2 W to 100 W. The gas pressure in the deposition chamber is generally in the range of from 0.01 to 5 Torr, preferably from 0.1 to 0.5 Torr.

The contents of the carbon atoms and hydrogen atoms in the intermediate layer 302 in the photoconductive member 300 of this invention are also important factors for forming the intermediate layer 302 with desired characteristics to achieve the objects of this invention, similarly to the condition for preparation of the intermediate layer 302.

The content of carbon atoms (C) in the intermediate layer 302 of this invention is generally 30 to 90 atomic %, preferably 40 to 90 atomic %, most preferably 50 to 80 atomic %. As for the content of the hydrogen atoms (H), it is generally 2 to 35 atomic %, preferably 5 to 30 atomic %. The photoconductive member with the content of hydrogen atoms within the specified range can be sufficiently useful in practical applications.

In terms of the representation a-$(Si_xC_{1-x})_y$:$H_{1-y}$ as previously indicated, x is generally 0.1 to 0.5, preferably 0.1 to 0.35, most preferably 0.15 to 0.30, and y is generally 0.99 to 0.60, preferably 0.98 to 0.65, most preferably 0.95 to 0.70.

The layer thickness of the intermediate layer 302 in the present invention is also another important factor to achieve effectively the objects of the present invention and it is desired to be within the same numerical range as specified with respect to the intermediate layer 102 in FIG. 1.

Figure 4:
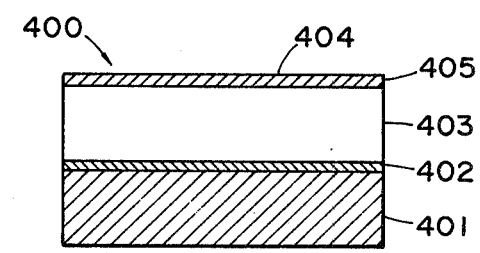

FIG. 4 shows a schematic sectional view of another embodiment in which the layer constitution of the photoconductive member as shown in FIG. 3 is modified.

The photoconductive member 400 as shown in FIG. 4 has the same layer structure as that of the photoconductive member 300 shown in FIG. 3, except that the upper layer 405 having the same function as the intermediate layer 402 is provided on the photoconductive layer 403.

In other words the photoconductive member 400 has an intermediate layer 402, which is made of the same material a-$(Si_xC_{1-x})_y$:$H_{1-y}$ as that of the intermediate layer 302 so as to have the same function, as that of the intermediate layer 302, on the support 401 similar to the support 101, a photoconductive layer 403 constituted of a-Si:H similar to the photoconductive layer 103, and the upper layer 405 having the free surface 404 which is provided on said photoconductive layer 403.

The upper layer 405 has the same function as that of the upper layer 205 shown in FIG. 2.

The upper layer 405 may be constituted of a-$(Si_xC_{1-x})_y$:$H_{1-y}$ having the same characteristics as that of the intermediate layer 402. Alternatively, the upper layer 405 may be constituted of an amorphous material comprising silicon atoms (Si) and nitrogen atoms (N) or oxygen atoms (O), which are the matrix atoms constituting the photoconductive layer or comprising these matrix atoms containing further hydrogen atoms; such as a-$Si_aN_{1-a}$, (a-$Si_aN_{1-a}$)$_b$:$H_{1-b}$, a-$Si_cO_{1-c}$, (a-$Si_cO_{1-c}$)$_d$:$H_{1-d}$ and the like; an inorganic insulating material such as SiNO, $Al_2O_3$, and the like; or organic insulating materials such as polyesters, poly-p-xylylene, polyurethanes, and the like. However, in view of the productivity, mass productivity as well as the electrical and environmental stabilities during use, the material constituting the upper layer 405 is desirably a-$(Si_xC_{1-x})_y$:$H_{1-y}$ having the same characteristics as that of the intermediate layer 402 or a-$Si_xC_{1-x}$ containing no hydrogen atom.

In addition to those mentioned above, other materials suitable for constituting the upper layer 405 may include amorphous materials containing as matrix at least two of C, N and O together with silicon atoms, and also containing halogen atoms, or halogen atoms and hydrogen atoms.

As the halogen atom, there may be mentioned F, Cl, Br, etc., but an amorphous material containing F is effective with respect to thermal stability.

Figure 5:
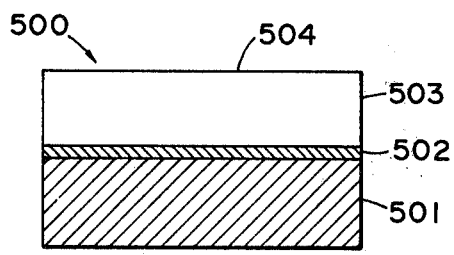

FIG. 5 shows a schematic sectional view of still another embodiment of the photoconductive member of this invention.

The photoconductive member 500 shown in FIG. 5 has a layer structure comprising a support 501 for photoconductive member, an intermediate layer 502 provided on said support and a photoconductive layer 503 provided in direct contact with said intermediate layer 502.

The support 501 and the photoconductive layer 503 are constituted of the same materials as described for the support 101 and the photoconductive layer 103 in FIG. 1, respectively.

The intermediate layer 502 is constituted of a non-photoconductive amorphous material contains as matrix silicon atoms and carbon atoms, and also containing halogen atoms (X) [hereinafter referred to as a-$(Si_xC_{1-x})_y$:$X_{1-y}$], where $0<x<1$, $0<y<1$.

The intermediate layer 502 constituted of a-$(Si_xC_{1-x})_y$:$X_{1-y}$ may be formed according to the same method as described in formation of the intermediate layer 302 in FIG. 3.

For formation of the intermediate layer 502 according to the glow discharge method, a starting gas for formation of a-$(Si_xC_{1-x})_y$:$X_{1-y}$, which may optionally be mixed with a diluting gas at a predetermined ratio, is introduced into the deposition chamber for vacuum deposition in which the support 501 is placed, whereupon gas plasma is formed by exciting glow discharge of the gas introduced thereby to effect deposition of a-$(Si_xC_{1-x})_y$:$X_{1-y}$ on the aforesaid support 501.

As the starting gas to be used for formation of a-$(Si_xC_{1-x})_y$:$X_{1-y}$, most of gaseous substances or gassified products of gassifiable substances containing at least one of Si, C and X as constituent atoms may be available.

When a starting gas having Si as constituent atoms is to be used, it is possible to use a mixture of starting gas having Si as constituent atom, a starting gas having C as constituent atom, and a gas having X as constituent atom at a desired mixing ratio. Alternatively, a mixture of a starting gas having Si as constituent atom and a starting gas having C and X as constituent atoms at a desired mixing ratio can also be used. Further it is also possible to use a mixture of a starting gas having Si as constituent atom and a starting gas having the three atoms of Si, C and X as constituent atoms.

As another method, it is also possible to use a mixture of a starting gas having Si and X as constituent atoms and a starting gas having C as constituent atom.

In the present invention, preferable halogen atoms (X) are F, Cl, Br and I, especially F and Cl.

In the present invention, the intermediate layer 502, which is constituted of a-$(Si_xC_{1-x})_y$:$X_{1-y}$, may further contain hydrogen atoms (H) incorporated therein. In the case of such a system of layer structure containing hydrogen atoms incorporated in the intermediate layer 502, a part of the starting gases can commonly be used in continuous formation of layers subsequent to the formation of the photoconductive layer 503 to a great advantage in production cost.

In the present invention, the starting gases which can effectively be used in formation of the intermediate layer 502 are those which are gaseous at normal temperature under normal pressure or which can readily be gassified.

Such materials for formation of the intermediate layer may include, for example, saturated hydrocarbons having 1 to 4 carbon atoms, ethylenic hydrocarbons having 1 to 4 carbon atoms and acetylenic compounds having 2 to 3 carbons atoms as mentioned above. In addition, it is also possible to use simple substances of halogen, hydrogen halides, interhalogen compounds, silicon halides, halogen-substituted silicon hydrides, silanes, etc. More specifically, there may be included simple substances of halogen such as halogenic gases of fluorine, chlorine, bromine and iodine; hydrogen halides such as HF, HI, HCl, HBr, etc.; interhalogen compounds such as BrF, ClF, ClF$_3$, ClF$_5$, BrF$_5$, BrF$_3$, IF$_7$, IF$_5$, ICl, IBr, etc.; silicon halides such as SiF$_4$, Si$_2$F$_6$, SiCl$_4$, SiCl$_3$Br, SiCl$_2$Br$_2$, SiClBr$_3$, SiCl$_3$I, SiBr$_4$, etc.; halogen-substituted silicon hydrides such as SiH$_2$F$_2$, SiH$_2$Cl$_2$, SiHCl$_3$, SiH$_3$Cl, SiH$_3$Br, SiH$_2$Br$_2$, SiHBr$_3$; and silanes such as SiH$_4$, Si$_2$H$_6$, Si$_3$H$_8$, Si$_4$H$_{10}$, and the like.

In addition to those mentioned above, as the starting materials useful for formation of the intermediate layer 502, there are halogen-substituted paraffinic hydrocarbons such as CCl$_4$, CHF$_3$, CH$_2$F$_2$, CH$_3$F, CH$_3$Cl, CH$_3$Br, CH$_3$I, C$_2$H$_5$Cl, and the like; fluorinated sulfur compounds such as SF$_4$, SF$_6$, and the like; alkyl silanes such as Si(CH$_3$)$_4$, Si(C$_2$H$_5$), etc; and halogen-containing alkyl silanes such as SiCl(CH$_3$)$_3$, SiCl$_2$(CH$_3$)$_2$, SiCl$_3$CH$_3$, and the like.

The starting materials for formation of these intermediate layers are selected and used in formation of the intermediate layers so that the silicon atoms (Si), carbon atoms (C) and halogen atoms (X), and, if necessary, hydrogen atoms (H) may be contained at a predetermined ratio in the intermediate layer to be formed.

For example, an intermediate layer comprising a-$Si_xC_{1-x}$:Cl:H can be formed by introducing Si(CH$_3$)$_4$, which can form readily the intermediate layer with desired characteristics containing silicon atoms, carbon atoms and hydrogen atoms, and a gas such as SiHCl$_3$, SiCl$_4$, SiH$_2$Cl$_2$, SiH$_3$Cl and the like for incorporation of halogen atoms at a predetermined mixing ratio in a gaseous state into the device for formation of the intermediate layer, followed by excitation of glow discharge therein.

For formation of the intermediate layer 502 by a sputtering method, there may be used a single crystalline or polycrystalline Si wafer, C wafer or a wafer containing Si and C mixed therein as target, and effecting sputtering of these in various gas atmospheres, containing halogens and, if necessary, hydrogens as constituent elements.

For example, when Si wafer is used as target, the starting gas for introduction of C and X, which may optionally be diluted with a diluting gas, if desired, are introduced into the deposition chamber for sputtering to form a gas plasma of these gases and effect sputtering of the aforesaid Si wafer. As other methods, by use of separate targets of Si and C or one sheet of a molded mixture of Si and C, sputtering can be effected in a gas atmosphere containing at least halogen atoms.

As the starting gases for introduction of carbon atoms (C) and halogen atoms (X), if necessary, and hydrogen atoms (H), there may be employed the starting gases exemplified in the above-mentioned glow discharge method as effective gases also in the sputtering.

In the present invention, the diluting gas to be used in forming the intermediate layer 502 by the glow discharge method or the sputtering method is preferably a so-called rare gas such as He, Ne, Ar, and the like.

The intermediate layer 502 in the present invention is formed carefully so that the characteristics required may be given exactly as desired.

Since the function of the intermediate layer 502 is the same as that of the intermediate layer described above, a-$(Si_xC_{1-x})_y$:$X_{1-y}$ constituting the intermediate layer 502 is formed so as to exhibit electrically insulating behaviors.

a-$(Si_xC_{1-x})_y$:$X_{1-y}$ is prepared so that the a-$(Si_xC_{1-x})_y$:$X_{1-y}$ can possess a mobility value with respect to passing carriers to the extent that passing of photocarriers generated in the photoconductive layer 503 may be passed smoothly through the intermediate 502. As an important element in the conditions for preparing a-$(Si_xC_{1-x})_y$:$X_{1-y}$ having the above-mentioned characteristics, there may be mentioned the support temperature during preparation thereof. In the present invention, the support temperature during the layer formation, is severely controlled so that the a-$(Si_xC_{1-x})_y$:$X_{1-y}$ having the desired characteristics may be prepared exactly as desired.

In order that the objects of the present invention may be achieved effectively, the support temperature during formation of the intermediate layer 502, which is suitably selected conveniently within an optimum range depending on the method employed for formation of the intermediate layer 502, is generally 100° to 300° C., preferably 150° to 250° C.

For formation of the intermediate layer 502, it is advantageous to adopt a glow discharge method or a sputtering method, since these methods can afford severe controlling of the atomic ratios constituting each layer or layer thicknesses with relative ease as compared with other methods and it is possible to form continuously the photoconductive layer 503 on the intermediate layer 502 and further a third layer to be formed on the photoconductive layer 503 in the same system, if desired. In case of forming the intermediate layer 502 according to these layer forming methods, the discharging power during layer formation may also be mentioned, similarly to the support temperature as described above, as an important factor influencing the characteristics of a-$(Si_xC_{1-x})_y$:$X_{1-y}$ to be prepared.

In such methods for preparation of the intermediate layer, the discharging power condition for preparing effectively with good productivity a-$(Si_xC_{1-x})_y$:$X_{1-y}$ having characteristics for accomplishment of the object of this invention is generally 10 W to 200 W, preferably 20 W to 100 W. The gas pressure in the deposition chamber is generally in the range of from 0.01 to 1 Torr, preferably from 0.1 to 0.5 Torr.

The contents of the carbon atoms (C) and halogen atoms (X) in the intermediate layer 502 in the photoconductive member of this invention are also important factors for forming the intermediate layer 502 with desired characteristics to achieve the objects of this invention, similarly to the condition for preparation of the intermediate layer 502.

The content of carbon atoms (C) in the intermediate layer 502 of this invention is generally 40 to 90 atomic %, preferably 50 to 90 atomic %, most preferably 60 to 80 atomic %. As for the content of the halogen atoms (X), it is generally 1 to 20 atomic %, preferably 2 to 15 atomic %. The photoconductive member formed with the content of halogen atoms within the specified range can be sufficiently useful in practical applications. As the content of hydrogen atoms (H) contained, if necessary, it is generally 19 atomic % or less, preferably 13 atomic % or less.

In terms of the representation a-$(Si_xC_{1-x})_y$:$X_{1-y}$ as previously indicated, x is generally 0.1 to 0.47, preferably 0.1 to 0.35, most preferably 0.15 to 0.30, and y is generally 0.99 to 0.80, preferably 0.99 to 0.82, most preferably 0.98 to 0.85.

When both of halogen atoms and hydrogen atoms are contained, the numerical ranges for x and y in terms of representation of a-$(Si_xC_{1-x})_y$:$(H+X)_{1-y}$ are substantially the same as in the case of a-$(Si_xC_{1-x})_y$:$X_{1-y}$.

The layer thickness of the intermediate layer 502 in the present invention is also another important factor to achieve effectively the objects of the present invention and it is desired to be within the same numerical range as specified with respect to the intermediate layers previously described.

Figure 6:
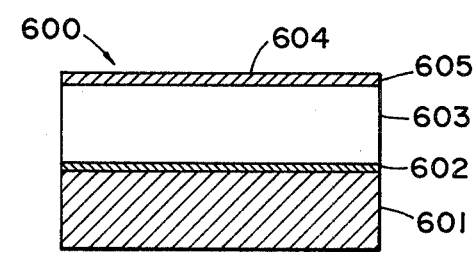

FIG. 6 shows a schematic sectional view of another embodiment in which the layer constitution of the photoconductive member as shown in FIG. 5 is modified.

The photoconductive member 600 shown in FIG. 6 has the same layer structure as that of the photoconductive member 500 shown in FIG. 5, except that the upper layer 605 having the same function as the intermediate layer 602 is provided on the photoconductive layer 603.

In other words, the photoconductive member 600 has an intermediate layer 602, which is made of the same material as that of the intermediate layer 502 so as to have the same function as that of the layer 502, on the support 601 a photoconductive layer 603 constituted of a-Si:H similar to the photoconductive layer 503, and the upper layer 605 having the free surface 604 which is provided on said photoconductive layer 603.

The upper layer 605 has the same function as that of the upper layer 205 shown in FIG. 2 or the upper layer 405 shown in FIG. 4.

The upper layer 605 has the same characteristics as that of the intermediate layer 602, and is constituted of a-$(Si_xC_{1-x})_y$:$X_{1-y}$ which may contain hydrogen atoms, if necessary. Alternatively, the upper layer 605 may be constituted of an amorphous material comprising silicon atoms (Si) and nitrogen atoms (N) or oxygen atoms (O), which are matrix atoms constituting the photoconductive layer 603 or constituted of these matrix atoms containing further hydrogen atoms or/and halogen atoms, such as a-$Si_aN_{1-a}$, a-$(Si_aN_{1-a})_b$:$H_{1-b}$, a-$(Si_aN_{1-a})_b$:$(H+X)_{1-b}$, a-$Si_cO_{1-c}$, a-$(Si_cO_{1-c})_d$:$H_{1-d}$, a-$(Si_cO_{1-c})_d$:$(H+X)_{1-d}$, and the like; an amorphous material containing these atoms as matrix and containing hydrogen atoms or/and halogen atoms; an inorganic insulating material such as SiNO, $Al_2O_3$, and the like; or organic insulating materials such as polyesters, poly-p-xylylene and polyurethanes and the like. However, in view of the productivity, mass productivity as well as the electrical and environmental stabilities during use, the material constituting the upper layer 605 is desirably a-$(Si_xC_{1-x})_y:X_{1-y}$ having the same characteristics as that of the intermediate layer 602, a-$Si_xC_{1-x}$ containing no halogen atom, or a-$(Si_xC_{1-x})_y:H_{1-y}$. As the materials constituting the upper layer 605 in addition to those as mentioned above, there may preferably be used amorphous materials having silicon atom and at least two atoms of C, N and O as matrix atoms, and containing halogen atoms, or halogen atoms and hydrogen atoms. As the halogen atoms, there may be mentioned F, Cl, Br, and the like, but among the amorphous materials as mentioned above, those containing F are effective from standpoint of thermal stability.

FIG. 7 shows a schematic sectional view for illustration of the basic embodiment of the photoconductive member of this invention.

The photoconductive member 700 shown in FIG. 7 is one of the most basic embodiment, having a layer structure comprising a support 701 for photoconductive member, an intermediate layer 702 provided on said support, and a photoconductive layer 703 provided in direct contact with said intermediate layer 702.

The support 701 and the intermediate layer 702 are made of the same materials as that of the support 101 and the intermediate layer 102, respectively, and can be prepared by the same method and under the same conditions as those, respectively.

In the present invention, in order to achieve its objects effectively, the photoconductive layer 703 overlaid on the intermediate layer 702 is constituted of a-Si:X having the semi-conductor characteristics as shown below.

6. p-type a-Si:X . . . Containing only acceptor or containing both donor and acceptor with higher concentration of acceptor (Na).

7. $p^-$-type a-Si:X . . . A type of 6, that containing acceptor at low concentration (Na), for example, being doped very lightly with so-called p-type impurities.

8. n-type a-Si:X . . . Containing only donor or containing both donor and acceptor with higher concentration of donor (Nd).

9. $n^-$-type a-Si:X . . . A type of 8 which contains donor at low concentration (Nd), for example, being doped very lightly witn n-type impurities or non-doped.

10. i-type a-Si:X . . . Wherein Na$\simeq$Nd$\simeq$O or Na$\simeq$Nd, for example, being lightly doped with p-type impurities.

In the present invention, a-Si:X constituting the photoconductive layer 703, since it is provided through the intermediate layer 702 on the support, one having relatively lower electric resistivity can be used, but for obtaining better results, the dark resistivity of the photoconductive layer 703 formed may preferably be $5\times10^9$ $\Omega$cm or more, most preferably $10^{10}$ $\Omega$cm or more.

In particular, the numerical condition for the dark resistivity values is an important factor when using the prepared photoconductive member as an image forming member for electrophotography, as a high sensitive reading device or an image pickup device to be used under low illuminance regions, or as a photoelectric converter.

In the present invention, typical examples of halogen atoms (X) incorporated in the photoconductive layer 703 may include fluorine, chlorine, bromine and iodine. Among them, fluorine and chlorine are particularly preferred.

The expression "X contained or incorporated in the layer" herein mentioned means the state, in which "X is bonded to Si", or in which "X is ionized to be incorporated in the layer", or in which "X is incorporated in a form of $X_2$ in the layer".

In the present invention, the layer constituted of a-Si:X is formed by the vacuum deposition method, utilizing discharging phenomenon, such as the glow discharge method, the sputtering method, the ion plating method, and the like. For example, in order to form a-Si:X layer according to the glow discharge method, a starting gas for introduction of halogen atoms together with a Si-supplying starting gas capable of supplying Si are fed into a deposition chamber, which can be brought internally to reduced pressure, and glow discharging is excited in said deposition chamber thereby to form a layer of a-Si:X on the surface of the support previously placed at a predetermined position therein. When the layer is formed according to the sputtering method, a gas for introduction of halogen atoms may be introduced into the deposition chamber for sputtering when effecting sputtering of Si target in an atmosphere of an inert gas such as Ar or He, or a gas mixture principally composed of these gases.

The starting gas for supplying Si to be used in the present invention for formation of the photoconductive layer 703 may include those as described above for formation of the photoconductive layer 103 shown in FIG. 1.

In the present invention, the effective starting gases for introduction of halogen atoms in forming the photoconductive layer 703 may include a number of halogen compounds, preferably gaseous or gassifiable halogen compounds, such as, for example, halogen gases, halides, interhalogen compounds and halogen-substituted silane derivatives.

Further it is also possible to use effectively a gaseous or gassifiable silicon compound containing halogen atoms, which is capable of supplying silicon atoms (Si) and halogen atoms (X) in the same time.

The halogen compounds preferably used in the present invention are halogenic gases such as fluorine, chlorine, bromine and iodine; interhalogen compounds such as BrF, ClF, $ClF_3$, $BrF_5$, $BrF_3$, $IF_7$, $IF_5$, ICl, IBr, and the like.

As a silicon compound containing halogen atoms, namely so called halogen-substituted silane derivative, silicon halides such as $SiF_4$, $Si_2F_6$, $SiCl_4$, $SiBr_4$, and the like are preferred.

When the photoconductive layer 703 is formed according to a glow discharge method by use of such a halogen-containing silicon compound, a photoconductive layer of a-$Si_x$:X can be formed on a predetermined support without use of silane gas as a starting gas capable of supplying Si.

In forming the photoconductive layer of a-Si:X according to a glow discharge method, the basic procedures comprises feeding a starting silicon halide gas for supplying Si together with a gas such as Ar, $H_2$, He, and the like at a predetermined mixing ratio in a suitable gas flow amount into the deposition chamber for formation of the photoconductive layer of a-Si:X, followed by excitation of glow discharge to form a plasma atmosphere of these gases, thereby forming photoconductive layer of a-Si:X in contact with the intermediate layer formed on a support. It is also possible to mix further a gas of a silicon compound containing hydrogen atoms together with these gases in a suitable amount.

Each of these gases may be used not only along a single species but with mixing of plural species at a predetermined ratio. In forming the photoconductive layer of a-Si:X by a reactive sputtering method or an ion plating method, for example, in case of the reactive sputtering method, sputtering can be effected by using a target of Si in a plasma atmosphere. In case of the ion plating method, a polycrystalline silicon or a single crystalline silicon is placed as a source in a vapor deposition boat, which silicon source is vaporized by heating according to a resistance heating method or an electron beam method, thereby permitting the vapors dissipated from the boat to pass through a gas plasma atmosphere.

In either of the sputtering method and the ion plating method, halogen atoms can be introduced into the layer to be formed by feeding a gas of the aforesaid halogen compound or the aforesaid halogen-containing silicon compound into the deposition chamber to form a plasma atmosphere of said gas therein.

In the present invention, the above halogen compounds or halogen-containing silicon compounds can effectively be used. Additionally, it is also possible to use as effective substance for formation of the photoconductive layer a gaseous or a gassifiable halide containing hydrogen as one of the constituent elements, as exemplified by hydrogen halides such as HF, HCl, HBr, HI, and the like; halogen-substituted silanes such as $SiH_2F_2$, $SiH_2Cl_2$, $SiHCl_3$, $SiH_2Br_2$, $SiHBr_3$, and the like.

In the present invention these halides containing hydrogen atoms may preferably be used as starting gases for introduction of halogen atoms, since they can also introduce hydrogen atoms, which can very effectively control the electrical or photoconductive characteristics, simultaneously with introduction of halogen atoms into the photoconductive layer.

Alternatively, in order to incorporate hydrogen atoms structurally into the photoconductive layer of a-Si:X, it is also possible to use materials outside those as mentioned above, such as $H_2$ or silane gases such as $SiH_4$, $Si_2H_6$, $Si_3H_8$, $Si_4H_{10}$, and the like. Such gases can be permitted to coexist with a silicon compound for formation of Si in the deposition chamber for conducting discharge.

For example, in a reactive sputtering method, Si target is used, and a gas for introduction of halogen atoms and $H_2$ gas together with, if necessary, an inert gas such as He, Ar, and the like are introduced into the deposition chamber to form a plasma atmosphere, thereby effecting sputtering of the aforesaid Si target, to form on the surface of a support a photoconductive layer of a-Si:X having desired characteristics with hydrogen atoms incorporated therein.

Further, it is also possible to introduce a gas such as $B_2H_6$, $PH_3$, $PF_3$, and the like so that addition of impurities may also concurrently be effected.

In the present invention, the content of halogen atoms or the total contents of halogen atoms (X) and hydrogen atoms (H) in the photoconductive layer is generally 1 to 40 atomic %, preferably 5 to 30 atomic %.

The content of H in the layer can be controlled by the depositing support temperature or/and the quantity of the starting material for incorporation of H to be introduced into the deposition device, discharging power and the like.

In order to make the photoconductive layer 703 of n-type, p-type or n-type impurity, or both may be added into the layer in a controlled amount during formation of the layer by the glow discharge method or the reactive sputtering method.

As the impurity to be doped into the photoconductive layer 703 to make it p-type or i-type, there may be mentioned preferably an elements in Group III A of the periodic table, for example, B, Al, Ga, In, Tl, and the like.

On the other hand, for obtaining a n-type, there may preferably be used elements in Group V A, of the periodic table, such as N, P, As, Sb, Bi, and the like.

In addition, for example, it is also possible to control the layer to n-type by interstitial addition of Li or others though thermal diffusion or implantation. The amount of the impurity to be added into the photoconductive layer 703, which is determined suitably depending on the electrical and optical characteristics desired, but in the range of, in the case of elements in Group III A of the periodic table, generally from $10^{-6}$ to $10^{-3}$ atomic ratio, preferably from $10^{-5}$ to $10^{-4}$ atomic ratio, and, in the case of elements in Group V A of the periodic table, generally from $10^{-8}$ to $10^{-3}$ atomic ratio, preferably from $10^{-8}$ to $10^{-4}$ atomic ratio.

FIG. 8 shows a schematic sectional view of another embodiment of the photoconductive member of this invention in which the layer structure shown in FIG. 7 is modified. The photoconductive member 800 as shown in FIG. 8 has the same layer structure as that of the photoconductive member 700 shown in FIG. 7, except that the upper layer 805 having the same function as that of the intermediate layer 802 is provided on the photoconductive layer 803.

In other words, the photoconductive member 800 has an intermediate layer 802, which is made of the same material, a-$Si_xC_{1-x}$, as that of the intermediate layer 702 so as to have the same function as that of the layer 702, on the support 801, a photoconductive layer 803 constituted of a-Si:X to which H may be optionally introduced in a similar manner to described in the case of the photoconductive layer 703 shown in FIG. 7, and the upper layer 805 having the free surface 804, which is provided on the photoconductive layer 803.

The upper layer 805 has the same functions as described above for the embodiments as shown above and is constituted of the same material.

The photoconductive member 900 shown in FIG. 9 has a layer structure comprising a support 901 for photoconductive member, an intermediate layer 902 similar to the intermediate layer shown in FIG. 3 provided on said support, and a photoconductive layer 903 provided in direct contact with said intermediate layer 902.

The support 901 may be either electroconductive, or insulating in nature as previously described for the support in the embodiments set forth above.

The photoconductive member 1000 shown in FIG. 10 has the same layer structure as the photoconductive member 900 shown in FIG. 9, except that the upper layer 1005 having the same function as that of the intermediate layer 1002 is provided on the photoconductive layer 1003.

In other words, the photoconductive member 1000 has an intermediate layer 1002, which is made of the same material, a-$(Si_xC_{1-x})_y{:}H_{1-y}$ as that of the intermediate layer 902 so as to have the same function as that of the layer 902, on the support 1001, a photoconductive layer 1003 constituted of a-Si:X similar to the photoconductive layer 703 further containing hydrogen atoms (H) if desired, and the upper layer 1005 having the free surface 1004, which is provided on said photoconductive layer 1003.

The upper layer 1005 may be constituted of a-$(Si_xC_{1-x})_y$:$H_{1-y}$ having the same characteristic as that of the intermediate layer 1002. Alternatively, it may be constituted of the same material as those of the upper layers in the embodiments as set forth above.

FIG. 11 shows a schematic sectional view of still another embodiment of the photoconductive member of this invention.

The photoconductive member 1100 shown in FIG. 11 has a layer structure comprising a support 1101 for photoconductive member, an intermediate layer 1102 similar to the intermediate layer 502 shown in FIG. 5 provided on said support, and a photoconductive layer 1103 similar to the intermediate layer 703 shown in FIG. 7 provided in direct contact with said intermediate layer 1102.

FIG. 12 shows a schematic sectional view of another embodiment in which the layer structure of the photoconductive member shown in FIG. 11 is modified.

The photoconductive member 1200 shown in FIG. 12 has the same structure as that of the photoconductive member 1100 shown in FIG. 11 except that the upper layer having the same function as that of the intermediate layer 1202 is provided on the photoconductive layer 1203.

In other words, the photoconductive member 1200 has an intermediate layer 1202, which is made of the same material as in the intermediate layer 1102 so as to have the same function on the support 1201, a photoconductive layer 1203 constituted of a-Si:X similar to in the photoconductive layer 703 shown in FIG. 7, further containing hydrogen atoms if desired, and the upper layer 1205 having the free surface 1204, which is provided on said photoconductive layer 1203.

The upper layer 1205 has the same characteristics as that of the intermediate layer 1202, similarly in the upper layers shown in the above embodiments, and is constituted of a-$(Si_xC_{1-x})_y$:$X_{1-y}$ which may further contain hydrogen atoms (H) if necessary. Alternatively, the upper layer 1205 may be constituted of an amorphous material comprising silicon atoms (Si) and nitrogen atoms (N) or oxygen atoms (O), which are matrix atoms constituting the photoconductive layer, or comprising these matrix atoms containing further hydrogen atoms or/and halogen atoms; such as, a-$Si_aN_{1-a}$, a-$(Si_aC_{1-a})_b$:$X_{1-b}$, a-$(Si_aH_{1-a})_b$:$(H+X)_{1-b}$, a-$Si_cO_{1-c}$, a-$(Si_cO_{1-c})_d$:$X_{1-d}$, a-$(Si_cO_{1-c})_d$:$(H+X)_{1-d}$, and the like; an inorganic insulating material such as SiNO, $Al_2O_3$, and the like; or organic insulating materials such as polyesters, poly-p-xylylene and polyurethanes.

The layer thickness of the photoconductive member in this invention is determined suitably depending on the purposes of application such as reading devices, image pickup devices, image forming members for electrophotography, and the like.

In the present invention, the layer thickness of the photoconductive member may be determined suitably in connection with the relation to the thickness of the intermediate layer so that the functions of both photoconductive layer and intermediate layer can effectively be exhibited. Ordinarily, the thickness of the photoconductive layer is preferably some hundred to some thousand times as thick as the intermediate layer. More specifically, it is generally in the range of from 1 to $100\mu$, preferably from 2 to $50\mu$.

The material constituting the upper layer provided on the photoconductive layer as well as its thickness may be determined carefully so that generation of photocarriers may be effected with good efficiency by permitting the electromagnetic waves projected to reach the photoconductive layer in a sufficient quantity, when the photoconductive member is to be employed such that the electromagnetic waves to which the photoconductive layer is sensitive is projected from the side of the upper layer.

The thickness of the upper layer may suitably be determined depending on the material constituting the layer and the conditions for forming the layer so that the function as described above may be sufficiently exhibited. Ordinarily, it is in the range of 30 to 1000 Å, preferably from 50 to 600 Å.

Wnen a certain kind of electrophotographic process is to be employed in using the photoconductive member of this invention as an image forming member for photography, it is also required to provide further a surface coating layer on the free surface of the photoconductive member according to the layer structure as shown in any of FIG. 1 to FIG. 12. Such a surface coating layer is required to be insulating and have a sufficient ability to hold electrostatic charges when subjected to charging treatment and also a thickness to some extent, when applied in an electrophotographic process like NP-system as disclosed in U.S. Pat. Nos. 3,666,363 and 3,734,609. On the other hand, when applied in an electrophotographic process such as Carlson process, the surface coating layer is required to have a very thin thickness, since the potential at the light portions after formation of electrostatic charges is desired to be very small. The surface coating layer is required to have, in addition to satisfactory desired electrical characteristics, no bad influence, both physically and chemically on the photoconductive layer or the upper layer as well as good electrical contact and adhesion to the photoconductive layer or the upper layer. Further, humidity resistance, abrasion resistance, cleaning characteristic, etc. are also taken into consideration in forming the surface coating layer.

Typical examples of materials effectively used for formation of the surface coating layer may include polyethylene terephthalate, polycarbonates, polypropylene, polyvinyl chloride, polyvinylidene chloride, polyvinyl alcohol, polystyrene, polyamides, polytetrafluoroethylene, polytrifluorochloroethylene, polyvinyl fluoride, polyvinylidene fluoride, hexafluoropropylene-tetrafluoroethylene copolymer, trifluoroethylene-vinylidene fluoride copolymer, polybutene, polyvinyl butyral, polyurethanes, poly-p-xylylene and other organic insulating materials; and silicon nitrides, silicon oxides and other inorganic insulating materials. Among these materials, synthetic resins or cellulose derivatives may be formed into a film, which is in turn laminated on the photoconductive layer or the upper layer. Alternatively, coating solutions of such materials may be prepared and coated on the photoconductive layer or the upper layer to form a layer. The thickness of the surface coating layer, which may be determined suitably depending on the characteristics desired or the material selected, may generally be about 0.5 to $70\mu$. In particular, when the protective function as described above is required of the surface coating layer, the thickness is usually $10\mu$ or less. On the contrary, when a function as an insulating layer is more desirable, a thickness of $10\mu$ or more is usually used. However, a line of demarcation between thickness values distinguishing the protective layer from the electrical insulating layer is variable depending on the electrophotographic process to be applied and the structure of the image forming member for electrography designed. Therefore, the value of 10μ above-mentioned should not be appreciated as absolute.

The surface coating layer may also be endowed with a role as a reflection preventive layer by suitable selection of materials, whereby its function can further be enlarged.

The photoconductive member according to this invention, which has been described in detail above with reference to typical examples of layer structures, can overcome all the previously described problems and exhibit very excellent electrical, optical and photoconductive characteristics as well as good environmental characteristics during use.

Particularly, when applied for an image forming member for electrophotography or an image pickup device, it has an advantageously good retentivity of electrostatic charges during charging treatment, with no influence of residual potential on image formation, having also stable electrical properties even in a highly humid atmosphere, with high sensitivity and high SN ratio, being also excellently resistant to optical fatigue or repeated uses, and can give a visible image of high quality and good resolving power, which is high in concentration and clear in halftone.

Further, when a layer structure of photoconductive layer of prior art was applied as an image forming member for electrophotography, a-Si:H and a-Si:X with high dark resistivity was low in photosensitivity, while a-Si:H and a-Si:X with high photosensitivity was low in dark resistivity, which was about $10^8 \Omega$ cm, thus failing to be poorly applicable for an image forming member for electrophotography. In contrast, according to the present invention, even a-Si:H or a-Si:X having a relatively low resistivity ($5 \times 10^9 \Omega$ cm or more) can constitute the photoconductive layer for electrophotography. Therefore, a-Si:H and a-Si:X with relatively lower dark resistivity but having a high sensitivity can satisfactorily be used. This reduces restrictions caused characteristics of a-Si:H and a-Si:X.

EXAMPLE 1

Figure 13:
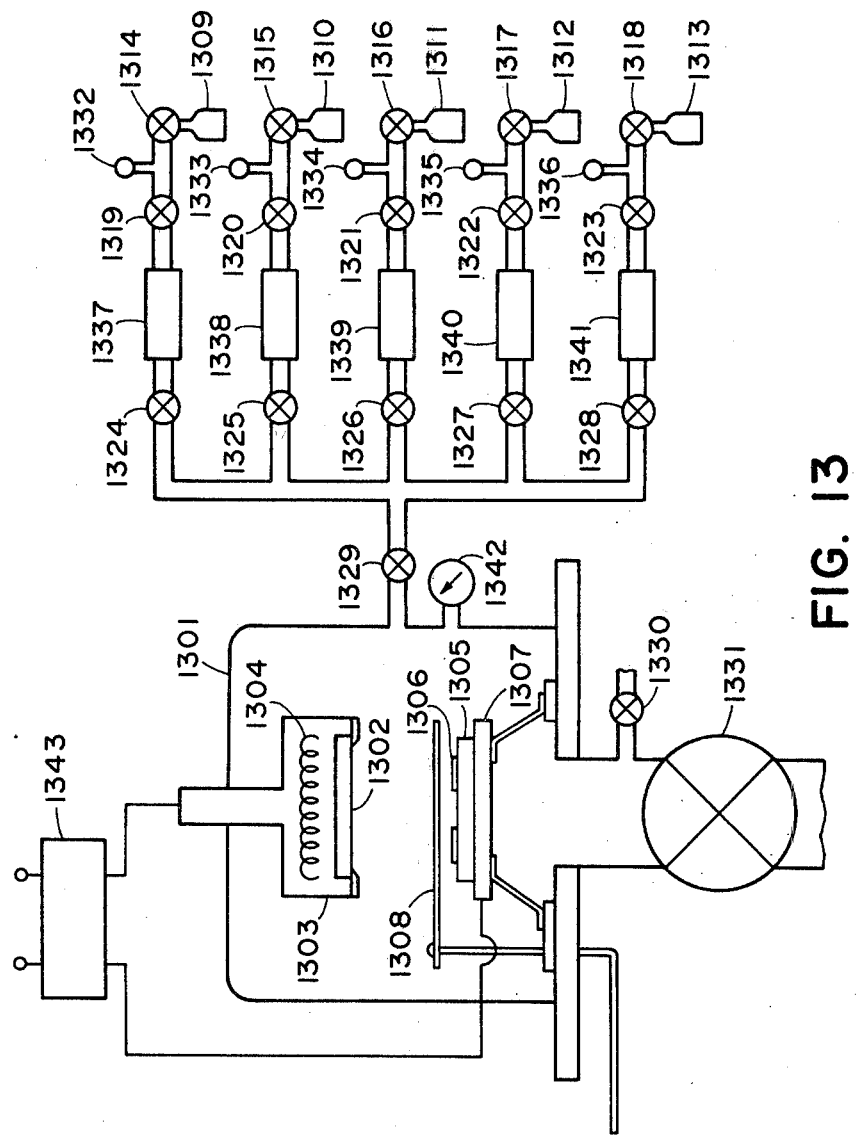
FIGS. 13 through 18 show schematic flow charts for illustration of the devices for preparation of the photoconductive members according to the present invention, respectively.

Using a device shown in FIG. 13 placed in a clean room which had been completely shielded, an image forming member for electrography was prepared according to the following procedures.

A substrate 1302 of molybdenum of 10 cm square having a thickness of 0.5 mm, whose surface had been cleaned, was fixed firmly on a fixing member 1303 disposed at a predetermined position in a deposition chamber 1301. The targets 1305 and 1306 were formed by mounting polycrystalline high purity silicons (99.999%) on a high purity graphite (99.999%). The substrate 1302 was heated by a heater 1304 within the fixing member 1303 with a precision of ±0.5° C. The temperature was measured directly at the backside of the substrate by an alumel-chromel thermocouple. Then, after confirming that all the valves in the system were closed, the main valve 1331 was fully opened, and evacuation was effected once to $5 \times 10^{-7}$ torr (during the evacuation, all the other valves in the system are closed). This step was followed by opening the auxiliary valve 1329 and the outflow valves 1324, 1325, 1326, 1327 and 1328 to remove sufficiently the gases in the flowmeters 1337, 1338, 1339, 1340 and 1341, and thereafter the outflow valves 1324, 1325, 1326, 1327, 1328 and the auxiliary valve 1329 were closed. The valve 1318 of the bomb 1313 containing argon gas (purity: 99.999%) was opened until the reading on the outlet pressure gauge 1336 was adjusted to 1 kg/cm², and then the inlet valve 1323 was opened, followed by gradual opening of the outflow valve 1328, thereby to permit argon gas to flow into the deposition chamber 1301. The outflow valve 1328 was opened until the indication on the Pirani gauge 1342 became $5 \times 10^{-4}$ torr, which state was maintained until the flow amount was steady. Thereafter, the main valve 1331 was gradually closed to narrow the opening to adjust the inner pressure in the chamber at $1 \times 10^{-2}$ torr. With the shutter 1308 opened, the flowmeter 1341 was confirmed to be stabilized, whereupon the high frequency power source 1343 was turned on to input an alternate current of 13.56 MHz, 100 W between the targets 1305 and 1306 and the fixing member 1303. Under these conditions, a layer was formed while taking matching so that stable discharging may be continued. In this manner, discharge was continued for one minute to form an intermediate layer of a thickness of 100 Å. Then, the high frequency power source 1343 was turned off for intermission of discharge. Subsequently, the outflow valve 1328 was closed and the main valve 1331 fully opened to discharge the gas in the chamber 1301 until it was evacuated to $5 \times 10^{-7}$ torr. Thereafter, the input voltage for the heater 1304 was elevated by varying the input voltage while detecting the substrate temperature until the temperature was stabilized constantly at 200° C.

Then, the auxiliary valve 1329, subsequently the outflow valve 1328 and the inflow valve 1323, were opened fully to effect degassing sufficiently in the flowmeter 1341 to vacuo. After closing the auxiliary valve 1329 and the outflow valve 1328, the valve 1314 of the bomb 1309 containing SiH₄ gas (purity: 99.999%) diluted with H₂ to 10 vol.% [hereinafter referred to as SiH₄(10)/H₂] and the valve 1316 of the bomb 1311 containing B₂H₆ gas diluted with H₂ to 50 vol ppm [hereinafter referred to as B₂H₆(50)/H₂] were respectively opened to adjust the pressures at the outlet pressure gauges 1332 and 1334, respectively, at 1 kg/cm², whereupon the inflow valves 1319 and 1321 were gradually opened to permit SiH₄(10)/H₂ gas and B₂H₆(50)/H₂ gas to flow into the flowmeters 1337 and 1339, respectively. Subsequently, the outflow valves 1324 and 1326 were gradually opened, followed by opening of the auxiliary valve 1329. The inflow valves 1319 and 1321 were adjusted thereby so that the gas flow amount ratio of SiH₄(10)/H₂ to B₂H₆(50)/H₂ was 50:1. Then, while carefully reading the Pirani gauge 1342, the opening of the auxiliary valve 1329 was adjusted and the auxiliary valve 1329 was opened to the extent until the inner pressure in the chamber 1301 became $1 \times 10^{-2}$ torr. After the inner pressure in the chamber 1301 was stabilized, the main valve 1331 was gradually closed to narrow its opening until the indication on the Pirani gauge 1342 became 0.5 torr. After confirming that the gas feeding and the inner pressure were stable, the shutter 1308 was closed, followed by turning on the high frequency power source 1343, to input a high frequency power of 13.56 MHz between the electrodes 1303 and 1308, thereby generating glow discharge in the chamber 1301 to provide an input power of 10 W. After glow discharge was continued for 3 hours to form a photoconductive layer, the heater 1304 was turned off with the high frequency power source 1343 being also turned off, the substrate was left to cool to 100° C., whereupon the outflow valves 1324, 1326 and the inflow valves 1319, 1321 were closed, with the main valve 1331 fully opened, thereby to make the inner pressure in the chamber 1301 to less than $10^{-5}$ torr. Then, the main valve 1331 was closed and the inner pressure in the chamber was made atmospheric through the leak valve 1330, and the substrate having formed each layer thereon was taken out. In this case, the entire thickness of the layers was about 9μ. The thus prepared image forming member for electrophotography was placed in an experimental device for charge and exposure to light, and corona charge was effected at ⊕6.0 KV for 0.2 sec., followed immediately by projection of a light image. The light image was projected through a transmission type test chart using a tungsten lamp as light source at a dosage of 0.8 lux.sec.

Immediately thereafter, a negatively charged developer (containing toner and carrier) was cascaded on the surface of the member to obtain a good toner image on the image forming member for electrophotography. When the toner image on the image forming member for electrography was copied on a copying paper by corona charge at ⊕5.0 KV, there was obtained a clear image of high density which was excellent in resolving power as well as in gradation reproducibility.

Next, the above image forming member was subjected to corona charging by means of a charge light-exposure experimental device at ⊖5.5 KV for 0.2 sec., followed immediately image exposure to light at a dosage of 0.8 lux.sec., and thereafter immediately a positively charged developer was cascaded on the surface of the member. Then, by copying on a copying paper and fixing, there was obtained a very clear image.

As apparently seen from the above results, in combination with the previous result, the image forming member for electrophotography obtained in the present Example has the characteristics of a both-polarity image forming member having no dependency on the charged polarity.

EXAMPLE 2

The image forming members shown by Sample No. A1 through A8 were prepared under the same conditions and procedures as in Example 1 except that the sputtering time in forming the intermediate layer on the molybdenum substrate was varied as shown below in Table 1, and image formation was effected by placing in entirely the same device as in Example 1 to obtain the results as shown in Table 1.

TABLE 1

| Sample No. | A1 | A2 | A3 | A4 | A5 | A6 | A7 | A8 |
|---|---|---|---|---|---|---|---|---|
| Time for formation of intermediate layer (sec.) | 10 | 30 | 50 | 150 | 300 | 500 | 1000 | 1200 |
| Image quality Charge polarity ⊕ | △ | O | ⊚ | ⊚ | ⊚ | O | △ | X |
| Charge polarity ⊖ | X | △ | ⊚ | ⊚ | ⊚ | O | △ | X |

Ranks for evaluation: ⊚Excellent; O Good; △ Practically usable; X not good
Deposition speed of intermediate layer: 1 Å/sec.

As apparently seen from the results shown in Table 1, it is necessary to form the intermediate layer constituted of a-SiC to a thickness within the range of from 30 Å to 1000 Å.

EXAMPLE 3

The image forming members for electrophotography as shown by Samples Nos. A9 through A17 were prepared under the same conditions and procedures as those in Example 1 except that the area ratio of Si to C in the target was varied as shown below in Table 2, and image formation was effected by placing in the same device as that of Example 1 to obtain the results shown in Table 2. For only Samples Nos. A11 through A17, intermediate layers were analyzed by the electron microprobe method to give the results as shown in Table 3.

As apparently seen from the results shown in Tables 2 and 3, it is necessary to form an intermediate layer wherein the ratio of Si to C ranges from 0.4 to 0.1 for attain the objects of the present invention.

TABLE 2

| Sample No. | A9 | A10 | A11 | A12 | A13 | A14 | A15 | A16 | A17 |
|---|---|---|---|---|---|---|---|---|---|
| Si/C (area ratio) | 4:6 | 3:7 | 2:8 | 1.7:8.3 | 1.5:8.5 | 1:9 | 0.7:9.3 | 0.5:9.5 | 0.2:9.8 |
| Copied image quality: Charge polarity ⊕ | X | X | X | △ | ⊚ | ⊚ | O | △ | X |
| Charge polarity ⊖ | X | X | X | △ | ⊚ | ⊚ | O | △ | X |

TABLE 3

| $Si_xC_{1-x}$ Sample No. | A11 | A12 | A13 | A14 | A15 | A16 | A17 |
|---|---|---|---|---|---|---|---|
| x | 0.45 | 0.4 | 0.35 | 0.28 | 0.2 | 0.1 | 0.04 |

EXAMPLE 4

After providing an intermediate layer on a molybdenum substrate similarly to that in Example 1 and degassing the deposition chamber 1301, the main valve 1331 was closed with opening of the lead valve 1330, the deposition chamber was leaked to atmospheric and the C target 1306 was removed from the targets 1305 and 1306, to leave only the Si target alone. Then, with closing the leak valve 1330, the chamber was evacuated to about $5 \times 10^{-7}$ torr, and the auxiliary valve 1329 and the outflow valves 1325, 1326 and 1328 were opened to degas sufficiently the flowmeters 1338, 1339 and 1341, followed by closing of the outflow valves 1325, 1326, 1328 and the auxiliary valve 1329.

The substrate 1302 was maintained at 200° C. by inputting power source for the heater. And, by opening the valve 1315 of the bomb 1310 containing hydrogen gas (purity: 99.999%), the outlet pressure was adjusted to 1 kg/cm² by the outlet pressure gauge 1333. Subsequently, the inflow valve was gradually opened to introduce hydrogen gas into the flowmeter 1338, followed successively by opening gradually of the outflow valve 1325 and further by opening the auxiliary valve 1329.

While detecting the inner pressure in the chamber 1301 by the Pirani gauge 1342, the outflow 1325 valve was adjusted to introduce hydrogen gas to $5 \times 10^{-5}$ torr. Subsequently, the valve 1318 of the bomb 1313 containing argon gas (purity: 99.999%) was opened and the reading on the outlet pressure gauge 1336 was adjusted to 1 kg/cm$^2$. Thereafter, the inflow valve 1323 was opened, followed by gradual opening of the outflow valve 1328 to introduce argon gas into the chamber 1301. The outflow valve 1328 was gradually opened until the indication on the Pirani gauge 1342 became $5 \times 10^{-4}$ torr. After the flow amount was stabilized under this state, the main valve 1330 was gradually closed to narrow its opening until the inner pressure in the chamber became $1 \times 10^{-2}$ torr. Then, the valve 1316 of the B$_2$H$_6$(50)/H$_2$ gas bomb 1311 was opened and, with adjustment of the outlet pressure gauge 1334 at 1 kg/cm$^2$, the inflow valve 1321 was opened. Subsequently, the outflow valve 1326 was opened and, while reading the flowmeter 1339, the outflow valve 1326 was adjusted so that the B$_2$H$_6$(50)/H$_2$ gas was flown in a quantity of about 1.5% of the flow amount of hydrogen gas indicated by the flowmeter 1338. After confirming stabilization of the flowmeters 1338, 1339 and 1341, the high frequency power source 1343 was turned on and an alternate current of 13.56 MHz, 100 W was inputted between the Si target and the supporting member 1303. Matching was taken so that stable discharge could be continued under these conditions to form a layer. By continuing discharge for 3 hours in such a manner, there was formed an intrinsic (i-type) a-Si:H layer having a thickness of 9μ. Thereafter, the high frequency power source 1343 was turned off and the source for the heater 1304 also turned off. After the substrate temperature was lowered to 100° C. or lower, the outflow valves 1325, 1326 and 1328 were closed with also closing of the auxiliary valve 1329, followed by full opening of the main valve, to draw out the gas in the chamber. The main valve 1331 was then closed, with opening of the leak valve 1330, to leak the deposition chamber 1301 to atmospheric, whereupon the substrate having formed respective layers was taken out.

Using the thus prepared image forming member, toner image was formed similarly as in Example 1. As the results, there were obtained images excellent in resolution, gradation as well as image density, with respect to both combinations of ⊖6 KV charge/positively charged developer and of ⊕6 KV charge/negatively charged developer.

EXAMPLE 5

An intermediate layer comprising a-Si$_x$C$_{1-x}$ was formed by previously co-depositing silicon and carbon on a molybdenum substrate by a electron-beam method. The composition ratio of Si to C in said layer was such that x was about 0.3. This substrate was fixed in the deposition chamber 1301 and an intrinsic (i-type) a-Si:H layer was formed as upper layer similarly to that in Example 1 thereon. When toner image was formed similarly to that in Example 1, using the thus prepared image forming member for electrophotography, there was obtained an image excellent in resolution, gradation as well as image density, with respect to both combinations of ⊖6 KV charging/⊕ charged developer and of ⊕6 KV charging/⊖ charged developer.

EXAMPLE 6

After conducting formation of an intermediate layer for one minute and then formation of a photoconductive layer for 5 hours on a molybdenum substrate according to the same procedures under the same conditions as in Example 1, the high frequency power source 1343 was turned off for intermission of glow discharge. Under this state, the outflow valves 1324 and 1326 were closed and the outflow valve 1328 was opened again with opening of the shutter 1308, thus creating the same conditions as in formation of the intermediate layer. Subsequently, the high frequency power source was turned on to recommence glow discharge. The input power was 100 W, which was also the same as in formation of the intermediate layer. Thus, glow discharge was continued for 2 minutes to form a upper layer on the photoconductive layer. Then, the high frequency power source was turned off and the substrate was left to cool. Upon reaching 100° C. or lower of the substrate temperature, the outflow valve 1328 and the inflow valve 1323 were closed, with full opening of the main valve, thereby evacuating the chamber to $1 \times 10^{-5}$. Then, the main valve 1331 was closed to return the chamber 1301 to atmospheric through the leak valve 1330 so as to be ready to take out the substrate having formed respective layers.

The thus prepared image forming member for electrophotography was place in the same charging-light exposure experimental device as used in Example 1, wherein corona charge was effected at ⊕6 KV for 0.2 sec., followed immediately by projection of a light image. Irradiation of the light image was effected through a transmission type test chart, using a tungsten lamp as light source, at a dosage of 1.0 lux.sec.

Immediately thereafter, a negatively charged developer (containing toner and carrier) was cascaded on the surface of the member, whereby there was obtained a good image on the surface of the member. When the toner image on the member was copied on a copying paper by corona discharge at ⊕5.0 KV. As a result, a clear and high density image was obtained with excellent resolution and good gradation reproducibility.

EXAMPLE 7

After an intermediate layer comprising a-Si$_x$C$_{1-x}$ was provided on a molybdenum substrate according to the same procedures as used in Example 1, the input voltage for the heater 1304 was increased by varying the input voltage while detecting the substrate temperature, until it was constant at 200° C.

Thereafter, the auxiliary valve 1329 and then the outflow valve 1324 and the inflow valve 1319 were opened fully to effect evacuation to vacuum also in the flowmeter 1337. After closing the auxiliary valve 1329 and the valves 1319 and 1324, the valve 1314 of the bomb 1309 containing SiH$_4$(10)/H$_2$ was opened and the pressure at the outlet pressure gauge 1332 was adjusted to 1 kg/cm$^2$, followed by opening gradually the inflow valve 1319 to introduce the SiH$_4$(10)/H$_2$ gas into the flowmeter 1337. Subsequently, the outflow valve 1324 was opened gradually and then the auxiliary valve 1329 gradually opened. Next, while reading carefully the Pirani gauge 1342, the opening of the auxiliary valve 1329 was adjusted and it was opened until the inner pressure in the chamber 1301 became $1 \times 10^{-2}$ torr. After the inner pressure in the chamber 1301 was stabilized, the main valve 1331 was gradually closed to narrow its opening until the indication on the Pirani gauge 1342 became 0.5 torr. Confirming stabilization of gas feeding and of inner pressure, the shutter 1308 was closed, followed by turning on the high frequency power source 1343 to input a high frequency power of 13.56 MHz between the electrodes 1308 and 1303, thereby exciting glow discharge in the chamber 1301, to provide an input power of 10 W. Glow discharge was continued for 3 hours to form a photoconductive layer, and thereafter the heater 1304 was turned off, and also the high frequency power source 1343 turned off. Upon cooling of the substrate to a temperature to 100° C., the outflow valve 1324 and the inflow valve 1319 were closed, with full opening of the main valve 1331 to evacuate the chamber 1301 to $10^{-5}$ torr or less. Thereafter, the main valve 1331 was closed, and the inner pressure in the chamber 1301 was brought to atmospheric through the leak valve 1330, and the substrate having formed respective layers was taken out. In this case, the total thickness of the layers was found to be about 9μ. The thus prepared image forming member for electrophotography was subjected to image formation on a copying paper. As a result, the image formed by $\ominus$ corona discharge was better in quality and very clear, as compared with that formed by $\oplus$ corona discharge. The results show that the image forming member prepared in this Examples is dependent on the charging polarity.

EXAMPLE 8

After an intermediate layer was formed for one minute on a molybdenum substrate using conditions and procedures similar to those of Example 1, the deposition chamber was evacuated to $5 \times 10^{-7}$ torr, whereupon $SiH_4(10)/H_2$ gas was introduced into the deposition chamber according to the same procedures as used in Example 1. Thereafter, under the gas pressure at 1 kg/cm² (reading on the outlet pressure gauge 1335) through the inflow valve 1322 from bomb 1312 containing $PH_3$ gas diluted with $H_2$ to 25 vol ppm [hereinafter referred to as $PH_3(25)/H_2$], the inflow valve 1322 and the outflow valve 1327 were adjusted to determine the opening of the outflow valve 1327 so that the reading on the flowmeter 1340 may be 1/50 of the flow amount of $SiH_4(10)/H_2$, followed by stabilization.

Subsequently, with the shutter 1308 closed and the high frequency power source 1343 turned on, the glow discharge was recommenced. The input voltage applied thereby was 10 W. Thus, glow discharge was continued for additional 4 hours to form a photoconductive layer on the intermediate layer. The heater 1304 and the high frequency power source 1343 were then turned off, and, upon cooling of the substrate to 100° C., the outflow valves 1327 and 1324, and the inflow valves 1319 and 1322 were closed, with full opening of the main valve 1331 to evacuate the chamber 1301 to $10^{-5}$ torr, followed by leaking of the chamber 1301 to atmospheric through the leak valve 1330 with closing of the main valve 1331. Under such a state, the substrate having formed layers thereon was taken out. In this case, the total thickness of the layers formed was about 11μ.

The thus prepared image forming member for electrophotography was used for forming the image on a copying paper according to the same procedures under the same conditions as used in Example 1, whereby the image formed by $\ominus$ corona discharge was more excellent and clear, as compared with that formed by $\oplus$ corona discharge. From the results, the image forming member prepared in this Example was recognized to have a dependency on the charging polarity.

EXAMPLE 9

After an intermediate layer was formed for one minute on a molybdenum substrate according to the same procedures and under the same conditions as those in Example 1, the deposition chamber was evacuated to $5 \times 10^{-7}$ torr and $SiH_4(10)/H_2$ gas was introduced into the chamber 1301 according to the same procedures as those in Example 1. Then, under the pressure of $B_2H_6(50)/H_2$ gas from the bomb 1311 through the inflow valve 1321 at 1 kg/cm² (reading on the outlet pressure gauge), the inflow valve 1321 and the outflow valve 1326 were adjusted to determine the opening of the outflow valve 1326 so that the reading on the flowmeter 1339 was 1/10 of the flow amount of $SiH_4(10)/H_2$ gas, followed by stabilization.

Subsequently, with the shutter 1308 closed, the high frequency power source 1343 was turned on again to recommence glow discharge. The input voltage applied was 10 W. Thus, glow discharge was continued for additional 4 hours to form a photoconductive layer on the intermediate layer. The heater 1304 and the high frequency power source 1343 were turned off and, upon cooling of the substrate to 100° C., the outflow valves 1324 and 1326, and the feed valves 1319 and 1321 were closed, with full opening of the main valve 1331 to evacuate the chamber to $10^{-5}$ torr or below. Then, the chamber 1301 was brought to atmospheric through the leak valve 1330 with closing of the main valve 1331, and the substrate having formed respective layers was taken out. In this case, the total thickness of the layers formed was about 10μ.

The thus prepared image formng member for electrophotography was used for forming an image on a copying paper according to the same procedures and under the same conditions as those in Example 1. As a result, the image formed by $\oplus$ corona discharge was more excellent in image quality and extremely clear, as compared with that formed by $\ominus$ corona discharge. The results show that the image forming member obtained in this Example has a dependency on charging polarity, however the dependency was opposite to those in the image forming members obtained in Examples 7 and 8.

EXAMPLE 10

Example 1 was repeated except that the $Si_2H_6$ gas bomb without dilution was used in place of the $SiH_4(10)/H_2$ bomb 1309, and a $B_2H_6$ gas bomb diluted with $H_2$ to 500 vol. ppm (hereinafter referred to as $B_2H_6(500)/H_2$) in place of the $B_2H_6(50)/H_2$ bomb 1311, thereby to form an intermediate layer and a photoconductive layer on a molybdenum substrate. Then, taking out from the deposition chamber 1301, the image forming member prepared was subjected to the test for image formation by placing in the same experimental device for charging and exposure to light similarly to that of in Example 1. As a result, in case of the combination of $\ominus$5.5 KV corona discharge with a $\oplus$ charged developer as well as the combination of $\oplus$6.0 KV corona discharge with a $\ominus$ charged developer, a toner image of very high quality with high contrast was obtained.

EXAMPLE 11

Figure 14:
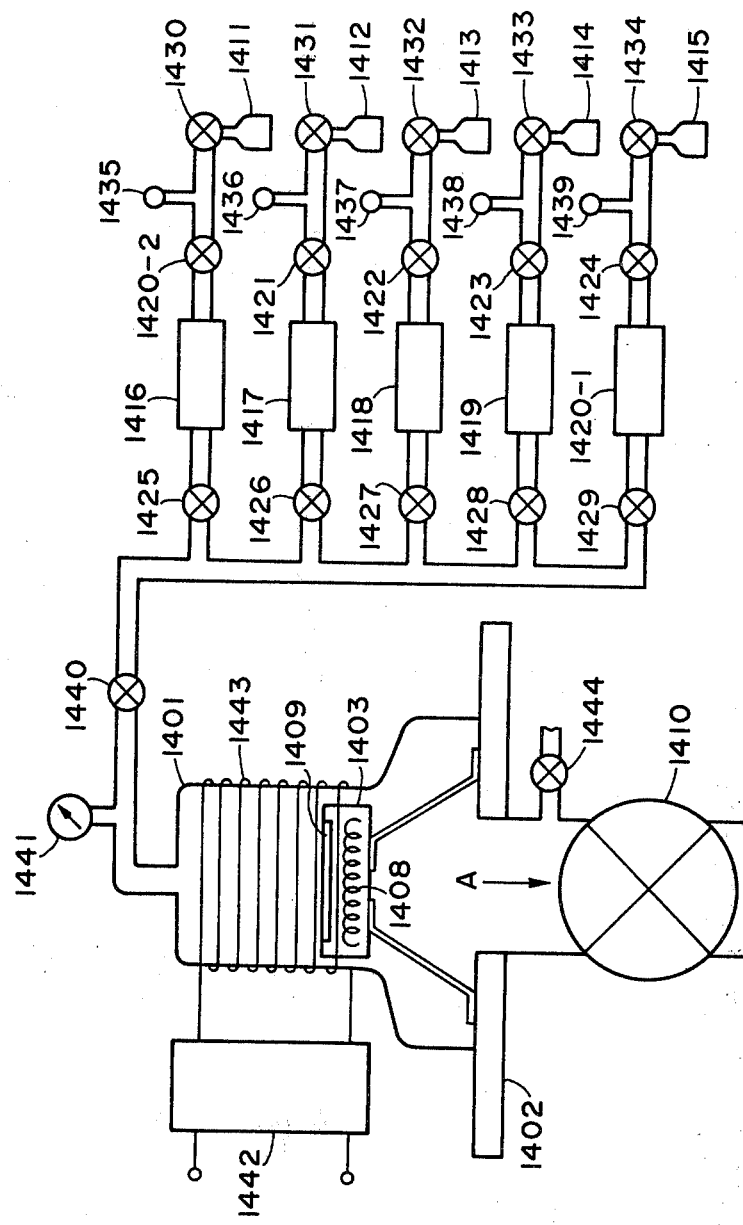

Using a device as shown in FIG. 14 placed in a clean room which had been completely shielded, an image forming member for electrography was prepared according to the following procedures.

A substrate 1409 of molybdenum of 10 cm square having a thickness of 0.5 mm, whose surface had been cleaned, was fixed firmly on a fixing member 1402 disposed at a predetermined position in a glow discharge deposition chamber 1401. The substrate 1409 was heated by a heater 1408 within the fixing member 1403 with a precision of ±0.5° C. The temperature was measured directly at the backside of the substrate by an alumel-chromel thermocouple. Then, after confirming that all the valves in the system were closed, the main valve 1410 was fully opened, and evacuation of the chamber 1401 was effected to about $5 \times 10^{-6}$ torr (during the evacuation, all the other valves in the system are closed). Thereafter, the input voltage for the heater 1408 was elevated by varying the input voltage while detecting the substrate temperature until the temperature was stabilized constantly at 200° C.

Then, the auxiliary valve 1440, subsequently the outflow valves 1425, 1426 and 1427 and the inflow valves 1420-2, 1421 and 1422, were opened fully to effect degassing sufficiently in the flowmeters 1416, 1417 and 1418 to vacuo. After closing the auxiliary valve 1440 and the valves 1425, 1426, 1427, 1420-2, 1421 and 1422, the valve 1430 of the bomb 1411 containing SiH$_4$ gas (purity: 99.999%) diluted with H$_2$ to 10 vol% [hereinafter referred to as SiH$_4$(10)/H$_2$] and the valve 1431 of the bomb 1412 containing C$_2$H$_4$ gas diluted with H$_2$ to 10 vol% [hereinafter referred to as C$_2$H$_4$(10)/H$_2$] were respectively opened to adjust the pressures at the output pressure gauges 1435 and 1436, respectively, at 1 kg/cm$^2$, whereupon the inflow valves 1420-2 and 1421 were gradually opened to introduce SiH$_4$(10)/H$_2$ gas and C$_2$H$_4$(10)/H$_2$ gas into the flowmeters 1416 and 1417, respectively. Subsequently, the outflow valves 1425 and 1426 were gradually opened, followed by gradual opening of the auxiliary valve 1440. The inflow valves 1420-2 and 1421 were adjusted thereby so that the gas feed ratio of SiH$_4$(10)/H$_2$ to C$_2$H$_4$(10)/H$_2$ was 1:9. Then, while carefully reading the Pirani gauge 1441, the opening of the auxiliary valve 1440 was adjusted and the auxiliary valve 1440 was opened to the extent until the inner pressure in the chamber 1401 became $1 \times 10^{-2}$ torr. After the inner pressure in the chamber 1401 was stabilized, the main valve 1410 was gradually closed to narrow its opening until the indication on the Pirani gauge 1441 became 0.5 torr. After confirming that the gas feeding and the inner pressure were stabilized, the high frequency power source 1442 was turned on to input a high frequency power of 13.56 MHz to the induction coil 1443, thereby exciting glow discharge in the chamber 1401 at the coil portion (upper part of the chamber) to provide an input power of 3 W. The above conditions were maintained for one minute to form an intermediate layer a-$(Si_xC_{1-x})_y$:H$_{1-y}$ on the substrate. Then, with the high frequency power source 1442 turned off for intermission of the glow discharge, the outflow valve 1426 was closed, and thereafter, under the pressure of B$_2$H$_6$(50)/H$_2$ gas from the bomb 1413 through the inflow valve 1422 at 1 kg/cm$^2$ (reading on the outlet pressure gauge), the inflow valve 1422 and the outflow valve 1427 were adjusted to determine the opening of the outflow valve 1427 so that the reading on the flowmeter 1418 was 1/50 of the flow amount of SiH$_4$(10)/H$_2$ gas, followed by stabilization. Subsequently, the high frequency power source 1442 was turned on to recommence glow discharge. The input power was 10 W, which was increased higher than before.

After glow discharge was continued for additional 3 hours to form a photoconductive layer, the heater 1408 was turned off with the high frequency power source 1442 being also turned off, the substrate is left to cool to 100° C., whereupon the outflow valves 1425, 1427 and the feed valves 1420-2, 1422 were closed, with the main valve 1410 fully opened, thereby to make the inner pressure in the chamber 1401 to $10^{-5}$ torr. or below. Then, the main valve 1410 was closed and the inner pressure in the chamber 1401 was made atmospheric through the leak value 1444, and the substrate having formed each layer thereon was taken out. In this case, the total thickness of the layers was about 9μ. The thus prepared image forming member for electrophotography was placed in an experimental device for charge and exposure to light, and corona charge was effected at ⊕6.0 KV for 0.2 sec., followed immediately by projection of a light image. The light image was projected through a transmission type test chart using a tungsten lamp as light source at a dosage of 1.0 lux.sec.

Immediately thereafter, a negatively charged developer (containing toner and carrier) was cascaded on the surface of the member to obtain a good toner image on the image forming member for electrophotography. When the toner image on the image forming member for electrography was copied on a copying paper by corona charge at ⊖5.0 KV, there was obtained a clear image at high density which was excellent in resolving power as well as in gradation reproducibility.

Next, the above image forming member was subjected to corona charging by means of a charge light-exposure experimental device at ⊖5.5 KV for 0.2 sec., followed immediately image exposure to light at a dosage of 0.8 lux.sec., and thereafter immediately a positively charged developer was cascaded on the surface of the member. Then, by copying on a copying paper and fixing, there was obtained a very clear image.

As apparently seen from the above results, in combination with the previous result, the image forming member for electrophotography obtained in this Example has the characteristics of a both-polarity image forming member having no dependency on the charging polarity.

EXAMPLE 12

The image forming members as shown by Samples Nos. B1 through B8 were prepared under the same conditions and procedures as in Example 11 except that the sputtering time in forming the intermediate layer on the molybdenum substrate was varied as shown below in Table 4, and image formation was effected by placing in entirely the same device as in Example 11 to obtain the results as shown in Table 4.

As apparently seen from the results shown in Table 4, it is necessary to form the intermediate layer constituted of a-SiC to a thickness within the range of from 30 Å to 1000 Å.

TABLE 4

| Sample No. | B1 | B2 | B3 | B4 | B5 | B6 | B7 | B8 |
|---|---|---|---|---|---|---|---|---|
| Time for formation of intermediate layer (sec.) | 10 | 30 | 50 | 180 | 420 | 600 | 1000 | 1200 |
| Image quality Charge polarity ⊕ | Δ | O | ⊙ | ⊙ | ⊙ | O | Δ | X |
| Charge polarity ⊖ | X | Δ | ⊙ | ⊙ | ⊙ | O | Δ | X |

Ranks for evaluation: ⊙Excellent; O Good; Δ Practically Usable; X Not Good
Deposition speed of intermediate layer: 1 Å/sec.

EXAMPLE 13

The image forming member for electrophotography as shown by Samples Nos. B9 through B15 were prepared under the same conditions and procedures as those in Example 11 except that the flow amount ratio of $SiH_4(10)/H_2$ gas to $C_2H_4(10)/H_2$ gas was varied in forming the intermediate layer on a molybdenum substrate as shown below in Table 5, and image formation was effected by placing in the same device as that of Example 11 to obtain the results shown in Table 5. For only Samples Nos. B11 through B15, intermediate layers of B11 through B15 were analyzed by the electron microprobe method and the hydrogen gas generated by heating by means of the mass analysis to give the results as shown in Table 6.

TABLE 5

| Sample No. | B9 | B10 | B11 | B12 | B13 | B14 | B15 |
|---|---|---|---|---|---|---|---|
| $SiH_4/C_2H_4$ (feed ratio) | 7:3 | 6:4 | 4.5: 5.5 | 3.5: 6.5 | 1.5: 8.5 | 0.5: 9.5 | 0.25: 9.75 |
| Copied image quality: | | | | | | | |
| Charge polarity ⊕ | X | X | X | Δ | ⊙ | ⊙ | O |
| Charge polarity ⊖ | X | X | X | Δ | ⊙ | ⊙ | O |

TABLE 6

| $Si_xC_{1-x}$ Sample No. | B11 | B12 | B13 | B14 | B15 |
|---|---|---|---|---|---|
| x | 0.55 | 0.51 | 0.34 | 0.19 | 0.11 |

As apparently seen from the results shown in Tables 5 and 6, it is desirable to form an intermediate layer wherein X relating to the ratio of Si to C ranges preferably 0.35–0.1 for attaining the objects of the present invention.

EXAMPLE 14

The molybdenum substrate was placed in a similar way to described in Example 11, and the glow discharge deposition chamber 1401 shown in FIG. 14 was evacuated to $5 \times 10^{-6}$ torr. After the substrate temperature was maintained at 200° C., the outflow valves 1425, 1426, and the inflow valves 1420-2, 1421 were fully opened to evacuate sufficiently the flowmeters 1416 and 1417. After closing the auxiliary valve 1440 and the valves 1425, 1426, 1420 and 1421 the valve 1430 of the bomb 1411 containing $SiH_4(10)/H_2$ and the valve 1431 of the bomb 1412 containing $C_2H_4(10)/H_2$ were opened and the pressures at the outlet pressure gauges 1435, 1436 adjusted to 1 kg/cm², followed by opening gradually the inflow valves 1420, 1421 to introduce the $SiH_4(10)/H_2$ gas and $C_2H_4(10)/H_2$ into the flowmeters 1416, 1417, respectively. Subsequently, the outflow valves 1425, 1426 were opened gradually and then the auxiliary valve 1440 gradually opened. The inflow valves 1420-2 and 1421 were adjusted so that the feeding ratio of $SiH_4(10)/H_2$ gas to $C_2H_4(10)/H_2$ gas was 1:9. Next, while reading carefully the Pirani gauge 1441, the opening of the auxiliary valve 1440 was adjusted and it was opened until the inner pressure in the chamber 1401 became $1 \times 10^{-2}$. After the inner pressure in the chamber was stabilized, the main valve 1410 was gradually closed to narrow its opening until the indication on the Pirani gauge 1441 became 0.5 torr. Confirming stabilization of gas feeding and of inner pressure, the shutter was closed, followed by turning on the high frequency power source 1442 to input a high frequency power of 13.56 MHz into the induction coil 1443, thereby exciting glow discharge in the chamber 1401 at the coil portion (upper part of chamber), to provide an input power of 3 W. The above conditions were maintained for one minute to deposit an intermediate layer a-$(Si_xC_{1-x})_y$:$H_{1-y}$ on the substrate. Then, with the high frequency power source 1442 turned off for intermission of the glow discharge, the outflow valve 1426 was closed. Subsequently, the high frequency power source as turned on to recommence glow discharge. The input power was 10 W, which was increased higher than before. Glow discharge was thus continued for additional 5 hours to form a photoconductive layer, and thereafter the heater 1408 was switched off, and also the high frequency power source 1442 turned off. Upon cooling of the substrate to a temperature to 100° C., the outflow valve 1425 and the inflow valves 1420-2, 1421 were closed, with full opening of the main valve 1410 to evacuate the chamber 1401 to $10^{-5}$ torr or less. Thereafter, the main valve 1410 was closed, and the inner pressure in the chamber 1401 to atmospheric through the leak valve 1444, and the substrate having formed respective layers was taken out. In this case, the total thickness of the layers was found to be about 15μ. The thus prepared image forming member for electrophotography was subjected to image formation on a copying paper under the same conditions according to the same procedures as those in Example 11. As a result, the image formed by ⊖ corona discharge was better in quality and very clear, as compared with that formed by ⊕ corona discharge. The results show that the image forming member prepared in this Example is dependent on the charging polarity.

EXAMPLE 15

After conducting formation of an intermediate layer for one minute on a molybdenum substrate according to the same procedures under the same conditions as described in Example 1, the high frequency power source 1442 was turned off for intermission of glow discharge. Under this state, the outflow valve 1426 was closed. Then, under the pressure of $PH_3(25)/H_2$ gas from the bomb 1414 through the inflow valve 1423 at 1 kg/cm² (reading on the outlet pressure gauge 1438), the inflow valve 1423 and the outflow valve 1428 were adjusted to determine the opening of the outflow valve 1428 so that the reading on the flowmeter 1419 was 1/50 of the flow amount of $SiH_4(10)/H_2$ gas, followed by stabilization.

Subsequently, the high frequency power source 1442 was turned on again to recommence glow discharge. The input voltage applied was increased to 10 W. Thus, glow discharge was continued for additional 4 hours to form a photoconductive layer on the intermediate layer. The heater 1408 and the high frequency power source 1442 were turned off and, upon cooling of the substrate to 100° C., the outflow valves 1425, 1428 and the inflow valves 1420-2, 1423 were closed, with full opening of the main valve 1410 to evacuate the chamber 1401 to $10^{-5}$ torr or below. Then, the chamber 1401 was brought to atmospheric through the leak valve 1444 with closing of the main valve 1410, and the substrate having formed respective layers was taken out. In this case, the total thickness of the layers formed was about 11μ.

The thus prepared image forming member for electrophotography was used for forming an image on a copying paper according to the same procedures and under the same conditions as described in Example 11. As a result, the image formed by ⊖ corona discharge was more excellent in image quality and extremely clear, as compared with that formed by ⊕ corona discharge. The results show that the image forming member obtained in this Example has a dependency on charging polarity.

EXAMPLE 16

After an intermediate layer was formed for one minute on a molybdenum substrate using conditions and procedures in a similar way to that described in Example 11, the high frequency power source 1442 was turned off, for intermission of glow discharge. Under this state, with closing of the outflow valve 1426 and under the gas pressure at 1 kg/cm$^2$ (reading on the outlet pressure gauge 1437) through the inflow valve 1422 from bomb 1413 containing B$_2$H$_6$(50)/H$_2$, the inflow valve 1422 and the outflow valve 1427 were adjusted to determine the opening of the outflow valve 1427 so that the reading on the flowmeter 1418 may be 1/10 of the flow amount of SiH$_4$(10)/H$_2$, followed by stabilization.

Subsequently, with the high frequency power source 1442 turned on again, the glow discharge was recommenced. The input voltage applied thereby was increased to 10 W. Thus, glow discharge was continued for additional 3 hours to form a photoconductive layer on the intermediate layer. The heater 1408 and the high frequency power source 1442 were then turned off, and, upon cooling of the substrate to 100° C., the outflow valves 1425, 1427 and the inflow valves 1420-2, 1422 were closed, with full opening of the main valve 1410 to evacuate the chamber 1401 to 10$^{-5}$ torr or below, followed by leaking of the chamber 1401 to atmospheric through the leak valve 1443 with closing of the main valve 1410. Under such a state, the substrate having formed layers thereon was taken out. In this case, the total thickness of the layers formed was about 10μ.

The thus prepared image forming member for electrophotography was used for forming the image on a copying paper according to the same procedures under the same conditions as described in Example 11, whereby the image formed by ⊕ corona discharge was more excellent and clear, as compared with that formed by ⊖ corona discharge. From the results, the image forming member prepared in this Example was recognized to have a dependency on the charging polarity, however the depending on the charging polarity was opposite to those obtained in Examples 13 and 14.

EXAMPLE 17

After conducting formation of an intermediate layer for one minute and then formation of a photoconductive layer for 5 hours on a molybdenum substrate according to the same procedures under the same conditions as described in Example 1, the high frequency power source 1442 was turned off for intermission of glow discharge. Under this state, the outflow valve 1427 was closed and the outflow valve 1426 was opened again, thus creating the same conditions as in formation of the intermediate layer. Subsequently, the high frequency power source was turned on to recommence glow discharge. The input power was 3 W, which was also the same as that of in formation of the intermediate layer. Thus, glow discharge was continued for 2 minutes to form an upper layer on the photoconductive layer. Then, the heater 1408 was turned off simultaneously with the high frequency power source and the substrate was left to cool. Upon reaching 100° C. of the substrate temperature, the outflow valves 1425, 1427 and the inflow valves 1420-2, 1422 were closed, with full opening of the main valve 1410, thereby evacuating the chamber 1401 to 1×10$^{-5}$ or below. Then, the main valve 1410 was closed to return the chamber 1401 to atmospheric through the leak valve 1443 so as to be ready to take out the substrate having formed respective layers.

The thus prepared image forming member for electrophotography was placed in the same charge-light exposure experimental device as used in Example 11, wherein corona charge was effected at ⊕6.0 KV for 0.2 sec., followed immediately by projection of a light image. Projection of the light image was effected through a transmission type test chart, using a tungsten lamp as light source, at a dosage of 1.0 lux.sec.

Immediately thereafter, a negatively charged developer (containing toner and carrier) was cascaded on the surface of the member, whereby there was obtained a good image on the surface of the member. When the toner image on the member was copied on a copying paper by corona discharge at ⊖5.0 KV. As a result, a clear and high density image was obtained with excellent resolving power and good gradation reproducibility.

EXAMPLE 18

Corning 7059 glass (1 mm thick, 4×4 cm, polished on both surfaces) with cleaned surfaces, having on one surface ITO in thickness of 1000 Å deposited by the electron beam vapor deposition method, was placed in the same device as used in Example 11 (FIG. 14) with the ITO-deposited surface as upper surface. Subsequently, according to the same procedures as described in Example 11, the glow discharge deposition chamber 1401 was evacuated to 5×10$^{-6}$ torr, and the substrate temperature was maintained at 200° C. Thereafter, the auxiliary valve 1440 and then the outflow valves 1425, 1426, 1427, 1429 and the feed valves 1420-2, 1421, 1422, 1424 were opened fully to effect evacuation to vacuum also in the flowmeters 1416, 1417, 1418, 1420-1. After closing the auxiliary valve 1440 and the valves 1425, 1426, 1427, 1429, 1416, 1417, 1418, 1420-2, the valve 1434 of the bomb 1415 containing Si(CH$_3$)$_4$ gas diluted to 10 vol% with H$_2$ [hereinafter referred to as Si(CH$_3$)$_4$(10)/H$_2$] was opened and the pressure at the outlet pressure gauge was adjusted to 1 kg/cm$^2$, followed by opening gradually of the inflow valve 1424 to introduce the Si(CH$_3$)$_4$(10)/H$_2$ gas into the flowmeter 1420-1. Subsequently, the outflow valve 1429 was opened gradually. Next, while reading carefully the Pirani gauge 1441, the opening of the auxiliary valve 1440 was adjusted and it was opened until the inner pressure in the chamber 1401 became 1×10$^{-2}$ torr. After the inner pressure in the chamber 1401 was stabilized, the main valve 1410 was gradually closed to narrow its opening until the indication on the Pirani gauge 1441 became 0.5 torr. Confirming stabilization of gas feeding and of inner pressure, the high frequency power source 1442 was turned on to input a high frequency power of 13.56 MHz into the induction coil 1443, thereby generating glow discharge in the chamber 1401 at the coil portion (upper part of chamber), to provide an input power of 3 W. The above conditions were maintained for one minute to deposit an intermediate layer on the substrate. Then, with the high frequency power source 1442 turned off for intermission of the glow discharge, the outflow valve 1429 and the inflow valve 1424 were closed, and next the valve 1432 of the bomb 1413 containing $B_2H_6(50)/H_2$ and the valve 1430 of the bomb 1411 containing $SiH_4(10)/H_2$ were respectively opened to adjust the pressures at the output pressure gauges 1435 and 1437, respectively, at 1 kg/cm$^2$, whereupon the inflow valves 1420 and 1422 were gradually opened to introduce $B_2H_6(50)/H_2$ gas and $SiH_4(10)/H_2$ gas into the flowmeters 1416 and 1418, respectively. Subsequently, the outflow valves 1425 and 1427 were gradually opened. The inflow valves 1425 and 1427 were adjusted thereby so that the gas feed ratio of $B_2H_6(50)/H_2$ to $SiH_4(10)/H_2$ was 1:50. Then, as in formation of the intermediate layer adjusted of valves was conducted so that the inner pressure in 1401 was 0.5 torr. Subsequently, the high frequency power source 1442 was turned on to recommence glow discharge. The input power was 10 W, which was increased higher than before. After glow discharge was continued for additional 3 hours to form a photoconductive layer, the heater 1408 was turned off with the high frequency power source 1442 being also turned off, the substrate is left to cool to 100° C., whereupon the outflow valves 1425, 1429 and the inflow valves 1420-2, 1424 were closed, with the main valve 1410 fully opened, thereby to make the inner pressure in the chamber 1401 to $10^{-5}$ torr or below. Then, the main valve 1410 was closed and the inner pressure in the chamber 1401 was made atmospheric through the leak valve 1443, and the substrate having formed each layer thereon was taken out. In this case, the total thickness of the layers was about 9μ. The thus prepared image forming member for electrophotography was placed in an experimental device for charge and exposure to light. and corona charge was effected at ⊕6.0 KV for 0.2 sec., followed immediately by projection of a light image. The light image was projected through a transmission type test chart using a tungsten lamp as light source at a dosage of 1.0 lux.sec.

Immediately thereafter, a negatively charged developer (containing toner and carrier) was cascaded on the surface of the member to obtain a good toner image on the image forming member for electrophotography. When the toner image on the image forming member for electrography was copied on a copying paper by corona charge at ⊖5.0 KV, there was obtained a clear image of high density which was excellent in resolving power as well as in gradation reproducibility.

When the above image forming member was subjected to ⊖ corona charging by using a positively charged developer, there was obtained a clear and good image, simiarly as in Example 11.

EXAMPLE 19

Example 11 was repeated except that the $Si_2H_6$ gas bomb without dilution was used in place of the $SiH_4(10)/H_2$ bomb 1411, and a $B_2H_6$ gas bomb diluted with $H_2$ to 500 vol.ppm (hereinafter referred to as $B_2H_6(500)/H_2$) in place of the $B_2H_6(50)/H_2$ bomb 1413, thereby to form an intermediate layer and a photoconductive layer on a molybdenum substrate. Then, taking out from the deposition chamber 1401, the image forming member prepared was subjected to the test for image formation by placing in the same experimental device for charge and exposure to light similarly as described in Example 1. As a result, in case of the combination of ⊖5.5 KV corona discharge with a ⊕ charged developer as well as the combination of ⊕6.0 KV corona discharge with a ⊕ charged developer, a toner image of very high quality with high contrast was obtained on a copying paper.

EXAMPLE 20

Using a device shown in FIG. 14 placed in a clean room which had been completely shielded, an image forming member for electrography was prepared according to the following procedures. In carrying out these procedures, each bomb had been previously with necessary gases.

A substrate 1409 of molybdenum of 10 cm square having a thickness of 0.5 mm, whose surface had been cleaned, was fixed firmly on a fixing member 1403 disposed at a predetermined position in deposition chamber 1401, mounted on a supporting stand 1402. The substrate 1409 was heated by a heater 1408 within the supporting member 1403 with a precision of ±0.5° C. The temperature was measured directly at the backside of the substrate by an alumel-chromel thermocouple. Then, after confirming that all the valves in the system were closed, the main valve 1410 was fully opened to discharge the gas in the chamber 1401 until it was evacuated to about $5 \times 10^{-6}$ torr. Thereafter, the input voltage for the heater 1408 was elevated by varying the input voltage while detecting the substrate temperature until the temperature was stabilized constantly at 200° C.

Then, the auxiliary valve 1440, subsequently the outflow valves 1425, 1426, 1427, 1429 and the inflow valves 1420-2, 1421, 1422, 1424 were opened fully to effect degassing sufficiently in the flowmeters 1416, 1417, 1418, 1420-1 to vacuo. After closing the auxiliary valve 1440 and the valves 1425, 1426, 1427, 1429, 1420-2, 1421, 1422, 1424, the valve 1430 of the bomb 1411 containing $SiF_4$ gas (purity: 99.999%) diluted with $H_2$ to 70 vol.%[hereinafter referred to as $SiF_4(70)/H_2$] and the valve 1431 of the bomb 1412 containing $C_2H_4$ gas diluted with $H_2$ to 10 vol.% [hereinafter referred to as $C_2H_4(10)/H_2$] were respectively opened to adjust the pressures at the outlet pressure gauges 1435 and 1436, respectively, at 1 kg/cm$^2$, whereupon the inflow valves 1420-2 and 1421 were gradually opened to permit $SiF_4(70)/H_2$ gas and $C_2H_4(10)/H_2$ gas to flow into the flowmeters 1416 and 1417, respectively. Subsequently, the outflow valves 1425 and 1426 were gradually opened, followed by opening of the auxiliary valve 1440. The inflow valves 1420-2 and 1421 were adjusted thereby so that the gas feed ratio of $SiF_4(70)/H_2$ to $C_2H_4(10)/H_2$ was 1:60. Then, while carefully reading the Pirani gauge 1441, the opening of the auxiliary valve 1440 was adjusted and the auxiliary valve 1440 was opened to the extent until the inner pressure in the chamber 1401 became $1 \times 10^{-2}$ torr. After the inner pressure in the chamber 1401 was stabilized, the main valve 1410 was gradually closed to narrow its opening until the indication on the Pirani gauge 1441 became 0.5 torr. After confirming that the gas feeding and the inner pressure were stable, followed by turning on the high frequency power source 1442, to input a high frequency power of 13.56 MHz to the induction coil 1443, thereby generating glow discharge in the chamber 1401 at the coil portion (upper part of the chamber) to provide an input power of 60 W. The above conditions were maintained for one minute to form an intermediate layer on the substrate. Then, with the high frequency power source 1442 turned off for intermission of the glow discharge, the outflow valves 1425 and 1426 were closed, and next valve 1432 of the bomb 1413 containing $B_2H_6$ gas diluted with $H_2$ to 50 vol. ppm[hereinafter referred to as $B_2H_6(50)/H_2$] and the valve 1434 of the bomb 1415 containing $SiH_4$ gas diluted with $H_2$ to 10 vol.% [hereinafter referred to as $SiH_4(10)/H_2$] were respectively opened to adjust the pressures at the outlet pressure gauges 1437 and 1439, respectively, at 1 kg/cm$^2$, whereupon the inflow valves 1422 and 1424 were gradually opened to permit $B_2H_6(50)/H_2$ gas and $SiH_4(10)/H_2$ gas to flow into the flowmeters 1418 and 1420-1, respectively. Subsequently, the outflow valves 1427 and 1429 were gradually opened. The feed valves 1422 and 1424 were adjusted thereby so that the gas feed ratio of $B_2H_6(50)/H_2$ to $SiH_4(10)/H_2$ was 1:50. Then, as in formation of the intermediate layer, openings of the auxiliary valve 1440 and the main valve 1410 were adjusted so that the indication on the Pirani gauge was 0.5 torr, followed by stabilization. Subsequently, the high frequency power source 1442 was turned on to recommerce glow discharge. The input power was 10 W, which was reduced lower than before. After glow discharge was additionally continued for 3 hours to form a photoconductive layer, the heater 1408 was turned off with the high frequency power source 1442 being also turned off, the substrate is left to cool to 100° C., whereupon the outflow valves 1427, 1429 and the inflow valves 1420-2, 1421, 1422, 1424 were closed, with the main valve 1410 fully opened, thereby to make the inner pressure in the chamber 1401 to $10^{-3}$ torr or below. Then, the main valve 1410 was closed and the inner pressure in the chamber 1401 was made atmospheric through the leak valve 1443, and the substrate was taken out. In this case, the total thickness of the layers was about 9$\mu$. The thus prepared image forming member for electrophotography was placed in an experimental device for charge and exposure to light, and corona charge was effected at $\oplus$6.0 KV for 0.2 sec., followed immediately by projection of a light image. The light image was projected through a transmission type test chart using a tungsten lamp as light source at a dosage of 0.8 lux.sec.

Immediately thereafter, a negatively charged developer (containing toner and carrier) was cascaded on the surface of the member to obtain a good toner image on the image forming member for electrophotography. When the toner image on the image forming member for electrography was copied on a copying paper by corona charging at $\ominus$5.0 KV, there was obtained a clear image of high density which was excellent in resolving power as well as in gradation reproducibility.

Next, the above image forming member was subjected to corona charge by means of a charge light-exposure experimental device at $\ominus$5.5 KV for 0.2 sec., followed immediately by image exposure to light at a dosage of 0.8 lux.sec., and thereafter immediately a positively charged developer was cascaded on the surface of the member. Then, by copying on a copying paper and fixing, there was obtained a very clear image.

As apparently seen from the above result, in combination with the previous result, the image forming member for electrophotography obtained in this Example has the characteristics of a both-polarity image forming member having no dependency on the charge polarity.

EXAMPLE 21

The image forming members as shown by Sample No. C1 through C8 were prepared under the same conditions and procedures as described in Example 20 except that the glow discharge time in forming the intermediate layer on the molybdenum substrate was varied as shown below in Table 7, and image formation was effected by placing in entirely the same device as in Example 20 to obtain the results as shown in Table 7.

As apparently seen from the results shown in Table 7, it is necessary to form a intermediate layer having a thickness within the range of from 30 Å to 1000 Å.

TABLE 7

| Sample No. | C1 | C2 | C3 | C4 | C5 | C6 | C7 | C8 |
|---|---|---|---|---|---|---|---|---|
| Time for formation of intermediate layer (sec.) | 10 | 30 | 50 | 180 | 420 | 600 | 1000 | 1200 |
| Image quality Charge polarity $\oplus$ | Δ | O | ⊚ | ⊚ | ⊚ | O | Δ | X |
| Charge polarity $\ominus$ | X | Δ | ⊚ | ⊚ | ⊚ | O | Δ | X |

Ranks for evaluation: ⊚ excellent; O good; Δ practically useable; X not good
Deposition speed of intermediate layer: 1 Å/sec.

EXAMPLE 22

The image forming members for electrophotography as shown by Sample No. C9 through C15 were prepared under the same conditions and procedures as described in Example 20 except that the flow amount ratio of $SiF_4$ (70) /$H_2$ gas to $C_2H_4$ (10) /$H_2$ gas was varied as shown below in Table 8, and image formation was effected by placing in the same device as described in Example 20 to obtain the results shown in Table 8. For only Samples No. C11 through C15, intermediate layers were analyzed by the electron microbe method to give the results as shown in Table 9.

As apparently seen from the results in Tables 8 and 9, it is desirable to form an intermediate layer in which the ratio of Si to C, x, is within the range of from 0.1 to 0.47.

TABLE 8

| Sample No. | C9 | C10 | C11 | C12 | C13 | C14 | C15 |
|---|---|---|---|---|---|---|---|
| $SiF_4(70)/H_2$: $C_2H_4(10)/H_2$ (flow amount ratio) | 7:3 | 6:4 | 4:6 | 3:7 | 1.5: 8.5 | 0.5: 9.5 | 0.2: 9.8 |
| Copied image quality Charge polarity $\oplus$ | X | X | X | Δ | ⊚ | ⊚ | O |
| Charge polarity $\ominus$ | X | X | X | Δ | ⊚ | ⊚ | O |

TABLE 9

| Sample No. | C11 | C12 | C13 | C14 | C15 |
|---|---|---|---|---|---|
| x | 0.55 | 0.47 | 0.33 | 0.21 | 0.11 |

EXAMPLE 23

The molybdenum substrate was placed similarly as described in Example 20, and the glow discharge deposition chamber 1401 shown in FIG. 14 was evacuated to $5 \times 10^{-6}$ torr. After the substrate temperature had been maintained at 200° C., the gas introducing systems for SiF$_4$(70)/H$_2$,C$_2$H$_4$(10)/H$_2$ and SiH$_4$(10)/H$_2$ were brought to vacuo of $5 \times 10^{-6}$ torr according to the same procedures as described in Example 20. After closing the auxiliary valve 1440, the outflow valves 1425, 1426, 1429 and the inflow valves 1420-2, 1421, 1424, the valve 1430 of the bomb 1411 of SiF$_4$(70)/H$_2$ gas and the valve 1431 of the bomb 1412 of C$_2$H$_4$(10)/H$_2$ gas were respectively opened to adjust the pressures at the output pressure gauges 1435 and 1436, respectively, at 1 kg/cm$^2$, whereupon the inflow valves 1420-2 and 1421 were gradually opened to introduce SiF$_4$(70)/H$_2$ gas and C$_2$H$_4$(10)/H$_2$ gas into the flowmeters 1416 and 1417, respectively. Subsequently, the outflow valves 1425 and 1426 were gradually opened, followed by opening of the auxiliary valve 1440. The inflow valves 1420-2 and 1421 were adjusted thereby so that the gas feed ratio of SiF$_4$(70)/H$_2$ to C$_2$H$_4$(10)/H$_2$ was 1:60. Then, while carefully reading the Pirani gauge 1441, the opening of the auxiliary valve 1440 was adjusted and the auxiliary valve 1440 was opened to the extent until the inner pressure in the chamber 1401 became $1 \times 10^{-2}$ torr. After the inner pressure in the chamber 1401 was stabilized, the main valve 1410 was gradually closed to narrow its opening until the indication on the Pirani gauge 1441 became 0.5 torr. After the gas flow was stabilized to give a constant inner pressure in the chamber and the substrate temperature stabilized to 200° C., in a similar way to described in Example 20 the high frequency power source 1442 was turned on to commence a glow discharge at an input power of 60 W, which condition was maintained for 1 minute to form an intermediate layer on the substrate. Then, the high frequency power source 1442 was turned off for intermission of glow discharging. Under this state, the outflow valves 1425, 1426, 1422 were closed, followed by opening of the valve 1434 of the SiH$_4$(10)/H$_2$ of bomb 1415 to adjust the outlet pressure gauge 1439 at 1 kg/cm$^2$, and the inflow valve 1424 was opened gradually to introduce the SiH$_4$(10)/H$_2$ gas into the flowmeter 1420-1. Subsequently, the outflow valve 1429 was gradually opened, and the openings of the auxiliary valve 1440 and the main valve 1410 adjusted and stabilized until the indication on the Pirani gauge was 0.5 torr.

Subsequently, by turning on of the high frequency power source 1442, glow discharge was recommenced at a reduced power of 10 W, which was reduced lower than before. After glow discharge was continued for additional 5 hours to form a photoconductive layer, the heater 1408 was turned off with the high frequency power source 1442 being also turned off, the substrate is left to cool to 100° C., whereupon the outflow valves 1429 and the inflow valves 1420-2, 1421, 1424 were closed, with the main valve 1410 fully opened, thereby to make the inner pressure in the chamber 1401 to $10^{-5}$ torr or less. Then, the main valve 1410 was closed and the inner pressure in the chamber was made atmospheric through the leak valve 1444, and the substrate having formed each layer thereon was taken out. In this case, the total thickness of the layers was about 15μ.

The thus prepared image forming member for electrophotography was used for forming the image on a copying paper according to the same procedures under the same conditions as described in Example 20, whereby the image formed by ⊖ corona discharge was more excellent and clear, as compared with that formed by ⊕ corona discharge. From the results, the image forming member prepared in this Example was recognized to have a dependency on the charge polarity.

EXAMPLE 24

After conducting formation of an intermediate layer for one minute on a molybdenum substrate according to the same procedures under the same conditions as described in Example 20, the high frequency power source 1442 was turned off for intermission of glow discharge. Under this state, the outflow valves 1425, 1426 were closed, and the valve 1433 of the bomb 1414 containing PH$_3$ diluted to 25 vol.ppm with H$_2$ [hereinafter referred to as PH$_3$(25)/H$_2$] and the valve 1434 of the bomb 1415 containing SiH$_4$(10)/H$_2$ gas were opened and the pressures at the outlet pressure gauges 1438, 1439 were adjusted to 1 Kg/cm$^2$, respectively, followed by opening gradually of the inflow valves 1423, 1424 to let in the PH$_3$(25)/H$_2$ gas and the SiH$_4$(10)/H$_2$ gas into the flowmeters 1419, 1420-1, respectively. Subsequently, the outflow valves 1428 and 1429 were opened gradually. The inflow feed valves 1423 and 1424 were thereby adjusted so that the flow amount ratio of PH$_3$(25)/H$_2$ gas to SiH$_4$(10)/H$_2$ was 1:50.

Next, the openings of the auxiliary valve 1440 and the main valve 1410 were adjusted and stabilized, similarly as described in formation of the intermediate layer, so that the indication on the Pirani gauge 1441 was 0.5 torr. Subsequently, the high frequency power source 1442 was turned on again to recommence glow discharge again with an input power of 10 W. After glow discharge was continued for additional 4 hours to form a photoconductive layer, the heater 1408 was turned off with the high frequency power source 1442 being also turned off, the substrate is left to cool to 100° C., whereupon the outflow valves 1428, 1429 and the inflow valves 1420-2, 1421, 1423, 1424 were closed, with the main valve 1410 fully opened, thereby to make the inner pressure in the chamber 1401 to $10^{-5}$ torr or below. Then, the main valve 1410 was closed and the inner pressure in the chamber 1401 was made atmospheric through the leak valve 1444, and the substrate having formed each layer thereon was taken out. In this case, the total thickness of the layers was about 11μ.

The thus prepared image forming member for electrophotography was subjected to image formation on a copying paper. As a result, the image formed by ⊖ corona discharge was better in quality and very clear, as compared with that formed by ⊕ corona discharge. The results show that the image forming member prepared in this Example is dependent on the charge polarity.

EXAMPLE 25

The intermediate layer and the photoconductive layer were formed on the molybdenum substrate under the same conditions according to the same procedures as described in Example 20, except that, after formation of the intermediate layer on the molybdenum substrate, the flow amount ratio of B$_2$H$_6$(50)/H$_2$ gas to SiH$_4$(10)/H$_2$ gas was changed to 1:10 in forming the photoconductive layer.

The thus prepared image forming member for electrophotography was subjected to image formation on a copying paper. As a result, the image formed by ⊕ corona discharge was better in quality and very clear, as compared with that formed by ⊖ corona discharge. The results show that the image forming member prepared in this Example is dependent on the charging polarity. But the charge polarity dependency was opposite to those of the image forming members obtained in Examples 22 and 23.

EXAMPLE 26

After conducting formation of an intermediate layer for one minute and then formation of a photoconductive layer for 5 hours on a molybdenum substrate according to the same procedures under the same conditions as described in Example 20, the high frequency power source 1442 was turned off for intermission of glow discharge. Under this state, the outflow valves 1427, 1429 were closed and the outflow valves 1425, 1426 were opened again, thus creating the same conditions as used in formation of the intermediate layer. Subsequently, the high frequency power source was turned on to recommence glow discharge. The input power was 60 W, which was also the same as in formation of the intermediate layer. Thus, glow discharge was continued for 2 minutes to form an upper layer on the photoconductive layer. Then, the heater 1408 and the high frequency power source 1442 were turned off and the substrate was left to cool. Upon reaching 100° C. of the substrate temperature, the outflow valves 1425, 1426 and the inflow valves 1420-2, 1421, 1422, 1424 were closed, with full opening of the main valve 1410, thereby evacuating the chamber 1401 to $1 \times 10^{-5}$. Then, the main valve 1410 was closed to return the chamber 1401 to atmospheric through the leak valve 1443, followed by taking out of the substrate having formed respective layers.

The thus prepared image forming member for electrophotography was placed in the same charge-light exposure experimental device as used in Example 1, wherein corona charge was effected at ⊕6.0 KV for 0.2 sec., followed immediately by projection of a light image. Projection of the light image was effected through a transmission type test chart, using a tungsten lamp as light source, at a dosage of 1.0 lux.sec.

Immediately thereafter, a negative charged developer (containing toner and carrier) was cascaded on the surface of the member, whereby there was obtained a good image on the surface of the member. When the toner image on the member was copied on a copying paper by corona discharge at ⊖5.0 KV. As a result, a clear image of high density was obtained with excellent resolving power and good gradation reproducibility.

EXAMPLE 27

Prior to formation of the image forming member, the $C_2H_4(10)/H_2$ gas bomb 1412 shown in FIG. 14 was replaced with a bomb containing $SiCl(CH_3)_3$ gas (purity: 99.999%) diluted to 10 vol. % with $H_2$[hereinafter referred to as $SiCl(CH_3)_3(10)/H_2$]. Then, Corning 7059 glass (1 mm thick, 4×4 cm, polished on both surfaces) with cleaned surfaces, having on one surface ITO in thickness of 1000 Å. deposited by the electron beam vapor deposition method, was placed in the same device as used in Example 20 (FIG. 14) with the ITO-deposited surface as upper surface. Subsequently, according to the same procedures as described in Example 20, the glow discharge deposition chamber 1401 was evacuated to $5 \times 10^{-6}$ torr, and the substrate temperature was maintained at 150° C. Then, the auxiliary valve 1440, subsequently the outflow valves 1426, 1427, 1429 and the inflow valves 1421, 1422, 1424 were opened fully to effect degassing sufficiently also in the flowmeters 1417, 1418, 1420-1 to vacuo. After closing the auxiliary valve 1440 and the valves 1426, 1427, 1429, 1417, 1418, 1420-2, the valve 1431 of the bomb 1412 of $SiCl(CH_3)_3$ was opened to adjust the pressure at the output pressure gauge at 1 kg/cm², whereupon the inflow valve 1421 was gradually opened to introduce $SiCl(CH_3)_3(10)/H_2$ gas into the flowmeter 1417. Subsequently, the outflow valve 1421 was gradually opened. Then, while carefully reading the Pirani gauge 1441, the opening of the auxiliary valve 1440 was adjusted and the auxiliary valve 1440 was opened to the extent so that the inner pressure in the chamber 1401 became $1 \times 10^{-2}$ torr. After the inner pressure in the chamber 1401 was stabilized, the main valve 1410 was gradually closed to narrow its opening so that the indication on the Pirani gauge 1441 became 0.5 torr. After confirming that the gas feeding and the inner pressure were stable, the high frequency power source 1442 was turned on to input a high frequency power of 13.56 MHz into the induction coil 1443, thereby generating glow discharge in the chamber 1401 at the coil portion (upper part of chamber) to provide an input power of 20 W. The above conditions were maintained for one minute to deposit an intermediate layer. Then with the high frequency power source 1442 turned off for intermission of the glow discharge, the outflow valve 1429 and inflow valve 1426 were closed, and the substrate temperature was raised to 200° C. Next the valve 1432 of the bomb 1413 containing $B_2H_6(50)/H_2$ and the valve 1434 of the bomb 1415 containing $SiH_4(10)/H_2$ were respectively opened to adjust the pressures at the output pressure gauges 1437 and 1439, respectively, at 1 kg/cm², whereupon the feed valves 1422 and 1424 were gradually opened to introduce $B_2H_6(50)/H_2$ gas and $SiH_4(10)/H_2$ gas into the flowmeters 1418 and 1420-1, respectively. Subsequently, the outflow valves 1427 and 1429 were gradually opened. The inflow valves 1422 and 1424 were adjusted thereby so that the gas feed ratio of $B_2H_6(50)/H_2$ to $SiH_4(10)/H_2$ was 1:50. Then, as described in formation of the intermediate layer, adjustment of valves was conducted so that the inner pressure in the chamber 1401 was 0.5 torr.

Subsequently, the high frequency power source 1442 was turned on to recommence glow discharge. After glow discharge was further continued for 3 hours to form a photoconductive layer, the heater 1408 was turned off with the high frequency power source 1442 being also turned off, the substrate is left to cool to 100° C., whereupon the outflow valves 1427, 1429 and the inflow valves 1421, 1422, 1424 were closed, with the main valve 1410 fully opened, thereby to make the inner pressure in the chamber 1401 to $10^{-5}$ torr or less. Then, the main valve 1410 was closed and the inner pressure in the chamber 1401 was made atmospheric through the leak valve 1444, and the substrate having formed each layer thereon was taken out. In this case, the total thickness of the layers was about 9μ. The thus prepared image forming member for electrophotography was placed in an charge light-exposure experimental device, and corona charge was effected at ⊕6.0 KV for 0.2 sec., followed immediately by projection of a light image. The light image was projected through a transmission type test chart using a tungsten lamp as light source at a dosage of 1.0 lux.sec.

Immediately thereafter, a negatively charged developer (containing toner and carrier) was cascaded on the surface of the member to obtain a good toner image on the image forming member for electrophotography. When the toner image on the image forming member for electrography was copied on a copying paper by corona charging at ⊖5.0 KV, there was obtained a clear image of high density which was excellent in resolving power as well as in gradation reproducibility.

When the corona charge polarity was changed to ⊖ and the polarity of the developer to ⊕, there was also obtained a clear and good image similarly to described in Example 20.

EXAMPLE 28

Example 1 was repeated except that the $Si_2H_6$ gas bomb without dilution was used in place of the $SiH_4(10)/H_2$ bomb 1415, and a $B_2H_6$ gas bomb diluted with $H_2$ to 500 vol. ppm [hereinafter referred to as $B_2H_6(500)/H_2$] in place of the $B_2H_6(50)/H_2$ bomb 1413, thereby to form an intermediate layer and a photoconductive layer on a molybdenum substrate. Then, taking out from the deposition chamber 1401, the image forming member prepared was subjected to the test for image formation by placing in the same experimental device for charging and exposure to light in a similar way to described in Example 20. As a result, in case of the combination of ⊖5.5 KV corona discharge with ⊕ charged developer as well as the combination of ⊕6.0 KV corona discharge with ⊖ charged developer, a toner image of very high quality with high contrast was obtained on a copying paper.

EXAMPLE 29

Figure 17:
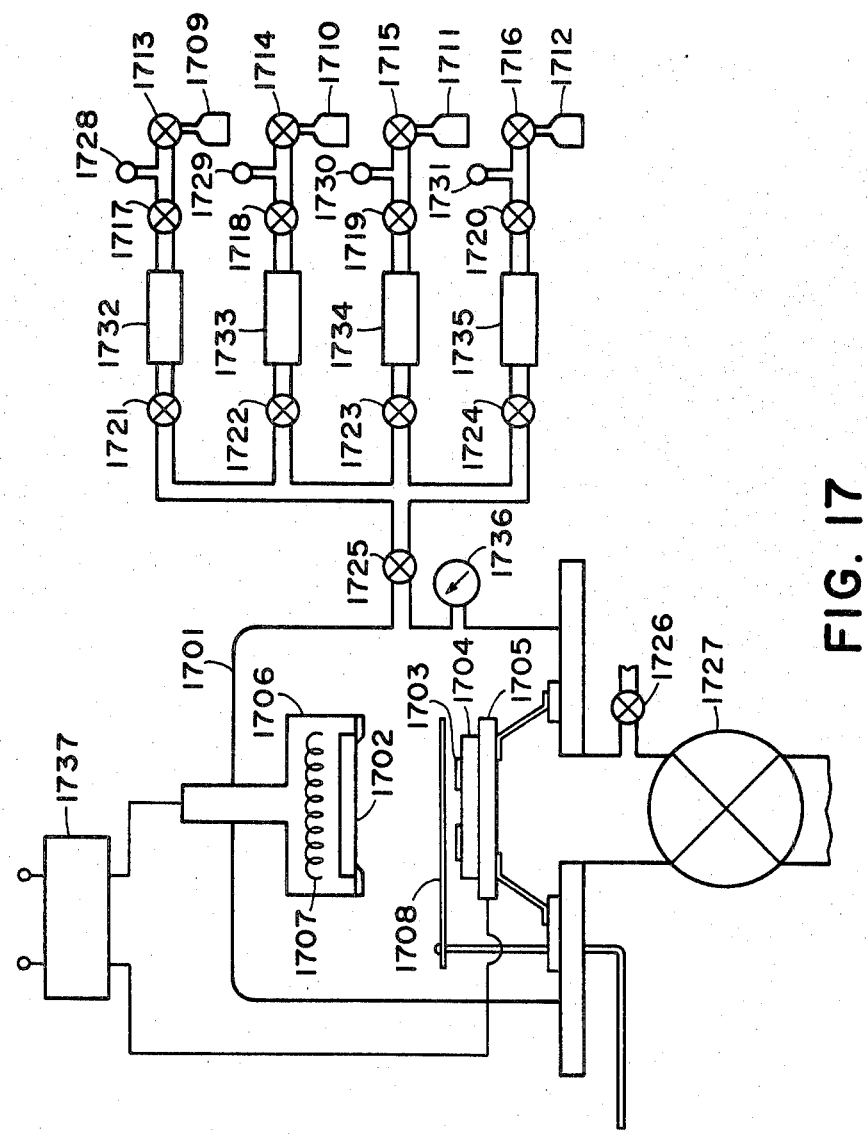

Using a device shown in FIG. 17, an intermediate layer was formed on a molybdenum substrate according to the procedures described below.

A substrate 1702 of molybdenum of 10 cm square having a thickness of 0.5 mm, whose surface had been cleaned, was fixed firmly on a fixing member 1706 disposed at a predetermined position in deposition chamber 1701. The substrate 1702 was heated by a heater 1707 within the supporting member 1706 with a precision of ±0.5° C. The temperature was measured directly at the backside of the substrate by an alumel-chromel thermocouple. Then, after confirming that all the valves in the system were closed, the main valve 1727 was opened, and evacuation of the chamber 1701 was effected to about $5 \times 10^{-6}$ torr. Thereafter, the input voltage for the heater 1707 was elevated by varying the input voltage while detecting the substrate temperature until the temperature was stabilized constantly at 200° C.

Then, the auxiliary valve 1725, subsequently the outflow valves 1721, 1724 and the inflow valves 1717, 1720 were opened fully to effect degassing sufficiently also in the flowmeters 1732, 1735 to vacuo. After closing the auxiliary valve 1725 and the valves 1717, 1720, 1721, 1724, the valve 1716 of the bomb 1712 containing $SiF_4$ gas (purity: 99.999%) and the valve 1713 of the bomb 1709 containing Ar gas were respectively opened to adjust the pressures at the outlet pressure gauges 1728 and 1731, respectively, at 1 $kg/cm^2$, whereupon the inflow valves 1717 and 1720 were gradually opened to introduce $SiF_4$ gas and Ar gas into the flowmeters 1732 and 1735, respectively. Subsequently, the outflow valves 1721 and 1724 were gradually opened, followed by opening of the auxiliary valve 1725. The inflow valves 1717 and 1720 were adjusted thereby so that the gas feed ratio of $SiF_4$ to Ar was 1:20. Then, while carefully reading the Pirani gauge 1736, the opening of the auxiliary valve 1725 was adjusted and the auxiliary valve 1725 was opened to the extent until the inner pressure in the chamber 1701 became $1 \times 10^{-2}$ torr. After the inner pressure in the chamber 1701 was stabilized, the main valve 1727 was gradually closed to narrow its opening until the indication on the Pirani gauge 1736 became 0.5 torr.

With the shutter 1708 being opened, and after confirming that the flowmeters 1732 and 1735 were stabilized, the high frequency power source 1737 was turned on to input an alternate current of 13.56 MHz, 100 W between the high purity silicon target 1703 (single crystalline or polycrystalline)/the high purity graphite 1704 with area ratio (SiC) of 1:9 and the fixing member 1706. Under these conditions, the layer was formed while taking matching so as to continue a stable discharge. By continuing thus discharging for 2 minutes, there was formed an intermediate layer constituted of $a\text{-}Si_xC_{1-x}$: F having a thickness of 100 Å. Then the high frequency power source 1737 was turned off for intermission of discharging. Subsequently, the outflow valves 1721 and 1724 were closed, with full opening of the main valve 1727 to withdraw the gas in the chamber 1701 to vacuum of $5 \times 10^{-7}$ torr. Then, the valve 1714 of the bomb 1710 containing $SiH_4$ gas (purity: 99.999%) diluted with $H_2$ to 10 vol.% [hereinafter referred to as $SiH_4(10)/H_2$] and the valve 1715 of the bomb 1711 containing $B_2H_6$ gas diluted with $H_2$ to 50 vol.ppm [hereinafter referred to as $B_2H_6(50)/H_2$] were respectively opened to adjust the pressures at the outlet pressure gauges 1728 and 1730, respectively, at 1 $kg/cm^2$, whereupon the inflow valves 1717 and 1719 were gradually opened to introduce $SiH_4(10)/H_2$ gas and $B_2H_6(50)/H_2$ gas into the flowmeters 1732 and 1734, respectively. Subsequently, the outflow valves 1721 and 1723 were gradually opened, followed by opening of the auxiliary valve 1725. The inflow valves 1717 and 1719 were adjusted thereby so that the gas feed ratio of $SiH_4(10)/H_2$ to $B_2H_6(50)/H_2$ was 50:1. Then, while carefully reading the Pirani gauge 1736, the opening of the auxiliary valve 1725 was adjusted and the auxiliary valve 1725 was opened to the extent until the inner pressure in the chamber 1701 became $1 \times 10^{-2}$ torr. After the inner pressure in the chamber 1701 was stabilized, the main valve 1725 was gradually closed to narrow its opening until the indication on the Pirani gauge 1736 became 0.5 torr. After confirming that the gas feeding and the inner pressure were stable, the shutter 1708 was closed, followed by turning on of the high frequency power source 1737, to input a high frequency power of 13.56 MHz between the electrodes 1707 and 1708, thereby generating glow discharge in the chamber 1701 to provide an input power of 10 W. After glow discharge was continued for 3 hours to form a photoconductive layer, the heater 1707 was turned off with the high frequency power source 1737 being also turned off, the substrate is left to cool to 100° C., whereupon the outflow valves 1722, 1723 and the feed valves 1718, 1719 were closed, with the main valve 1727 fully opened, thereby to make the inner pressure in the chamber 1701 to $10^{-5}$ torr or less. Then, the main valve 1727 was closed and the inner pressure in the chamber was made atmospheric through the leak valve 1726, and the substrate having formed each layer thereon was taken out. In this case, the total thickness of the layers was about 9μ. The thus prepared image forming member for electrophotography was placed in a charge/light-exposure experimental device, and corona charge was effected at ⊕6.0 KV for 0.2 sec., followed immediately by projection of a light image. The light image was projected through a transmission type test chart using a tungsten lamp as light source at a dosage of 0.8 lux.sec.

Immediately thereafter, a negatively charged developer (containing toner and carrier) was cascaded on the surface of the member to obtain a good toner image on the image forming member for electrophotography. When the toner image on the image forming member for electrography was copied on a copying paper by corona charging at $\ominus$5.0 KV, there was obtained a clear image of high density which was excellent in resolving power as well as in gradation reproducibility.

Next, the above image forming member was subjected to corona charge by means of a charging light-exposure experimental device at $\ominus$5.5 KV for 0.2 sec., followed immediately image exposure to light at a dosage of 0.8 lux.sec., and thereafter immediately a positively charged developer was cascaded on the surface of the member. Then, by copying on a copying paper and fixing, there was obtained a very clear and sharp image.

As apparently seen from the above result, in combination with the previous result, the image forming member for electrophotography has the characteristics of a both-polarity image forming member having no dependency on the charge polarity.

EXAMPLE 30

Figure 18:
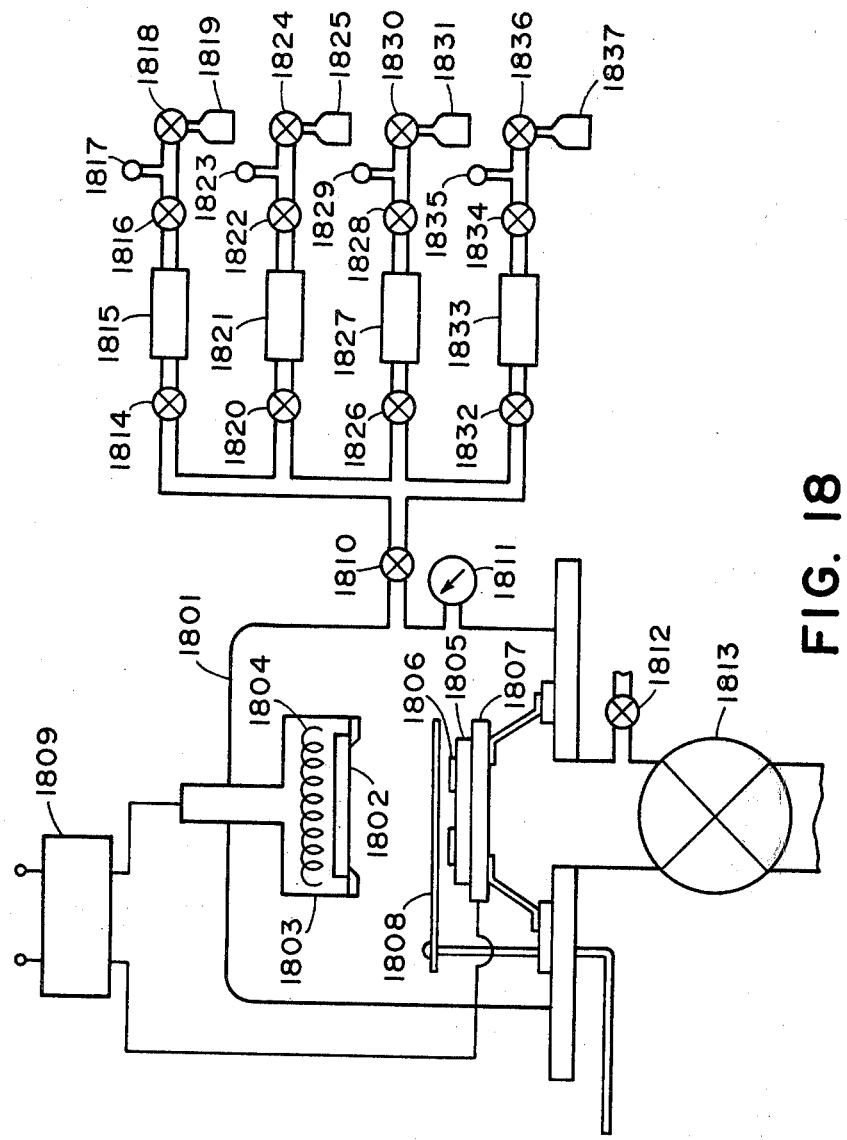

Using a device shown in FIG. 18 placed in a clean room which had been completely shielded, an image forming member for electrography was prepared according to the following procedures. In carrying out these procedures, each bomb had been previously filled with necessary gases.

A substrate 1802 of molybdenum of 10 cm square having a thickness of 0.5 mm, whose surface had been cleaned, was fixed firmly on a fixing member 1803 disposed at a predetermined position in an deposition chamber 1801. The target for sputtering was formed by mounting a high purity graphite (99.999%) target 1806 on a polycrystalline high purity silicon (99.999%) target 1805. The substrate 1802 was heated by a heater 1804 within the fixing member 1803 with a precision of ±0.5° C. The temperature was measured directly at the backside of the substrate by an alumel-chromel thermocouple. Then, after confirming that all the valves in the system are closed, the main valve 1813 was opened, and evacuation was effected once to about $5\times10^{-7}$ torr (during the evacuation, all the other valves in the system are closed). This step was followed by opening the auxiliary valve 1810 and the outflow valves 1814 and 1820, 1826, 1832 to remove sufficiently the gases in the flow-meters 1815, 1821, 1827 and 1833, and thereafter the outflow valve 1814, 1820, 1826, 1832 and the auxiliary valve 1810 were closed. The valve 1836 of the bomb 1837 containing argon gas (purity: 99.999%) was opened until the reading on the outlet pressure gauge 1835 was adjusted to 1 kg/cm², and then the inflow valve 1834 was opened, followed by gradual opening of the outflow valve 1832, thereby to introduce argon gas into the deposition chamber 1801. The outflow valve 1832 was opened until the indication on the Pirani gauge 1811 became $5\times10^{-4}$ torr, which state was maintained until the flow amount was steady. Thereafter, the main valve 1813 was gradually closed to narrow the opening to adjust the inner pressure in the chamber at $1\times10^{-2}$ torr. With the shutter 1808 opened, the flowmeter 1833 was confirmed to be stabilized, whereupon the high frequency power source 1809 was turned on to input an alternate current of 13.56 MHz, 100 W between the target 1805, 1806 and the fixing member 1803. Under these conditions, a layer was formed while taking matching so that stable discharge may be continued. In this manner, discharge was continued for one minute to form an intermediate layer of a thickness of 100 Å. Then, the high frequency power source 1809 was turned off for intermission of the discharge. Subsequently, the outflow valve 1832 was closed and the main valve 1813 fully opened to outgas the gas in the chamber 1801 until it was evacuated to $5\times10^{-7}$. Thereafter, the input voltage for the heater 1804 was elevated by varying the input voltage while detecting the substrate temperature until the temperature was stabilized constantly at 200° C.

Then, the auxiliary valve 1810, subsequently the outflow valve 1832 and the inflow valve 1834, were opened fully to effect degassing sufficiently of the flowmeter 1833 to vacuo. After closing the auxiliary valve 1810 and the outflow valve 1832, the valve 1818 of the bomb 1819 containing SiF$_4$ gas (purity: 99.999%) with H$_2$ content of 10 vol% [hereinafter referred to as SiF$_4$/H$_2$(10)] and the valve 1824 of the bomb 1825 containing B$_2$H$_6$ gas diluted with H$_2$ to 500 vol. ppm [hereinafter referred to as B$_2$H$_6$(500)/H$_2$] were respectively opened to adjust the pressures at the outlet pressure gauges 1817 and 1823, respectively, at 1 kg/cm², whereupon the inflow valves 1816 and 1822 were gradually opened to introduce SiF$_4$/H$_2$(10) gas and B$_2$H$_6$(500)/H$_2$ gas into the flowmeters 1815 and 1821, respectively. Subsequently, the outflow valves 1814 and 1820 were gradually opened, followed by opening of the auxiliary valve 1810. The inflow valves 1816 and 1822 were adjusted thereby so that the gas feed ratio of SiF$_4$/H$_2$(10) to B$_2$H$_6$(50)/H$_2$ was 70:1. Then, while carefully reading the Pirani gauge 1811, the opening of the auxiliary valve 1810 was adjusted and the auxiliary valve 1801 was opened to the extent until the inner pressure in the chamber 1801 became $1\times10^{-2}$ torr. After the inner pressure in the chamber 1801 was stabilized, the main valve 1813 was gradually closed to narrow its opening until the indication on the Pirani gauge 1811 became 0.5 torr. After confirming that the gas feeding and the inner pressure were stable, the shutter 1808 was closed, followed by turning on of the high frequency power source 1843, to input a high frequency power of 13.56 MHz between the electrodes 1803 and 1808, thereby generating glow discharge in the chamber 1801 to provide an input power of 60 W. After glow discharge was continued for 3 hours to form a photoconductive layer, the heater 1804 was turned off with the high frequency power source 1809 being also turned off, the substrate is left to cool to 100° C., whereupon the outflow valves 1814, 1820 and the inflow valves 1816, 1822 were closed, with the main valve 1813 fully opened, thereby to make the inner pressure in the chamber 1801 to $10^{-5}$ torr or below. Then, the main valve 1813 was closed and the inner pressure in the chamber was made atmospheric through the leak valve 1812, and the substrate having formed each layer thereon was taken out. In this case, the total thickness of the layers was about 9μ. The thus prepared image forming member for electrophotography was placed in a charge light-exposure experimental device, and corona charge was effected at $\oplus$6.0 KV for 0.2 sec., followed immediately by projection of a light image. The light image was projected through a transmission type test chart using a tungsten lamp as light source at a dosage of 0.8 lux.sec.

Immediately thereafter, a negatively charged developer (containing toner and carrier) was cascaded on the surface of the member to obtain a good toner image on the image forming member for electrophotography. When the toner image on the image forming member for electrophotography was copied on a copying paper by corona charging at ⊕5.0 KV, there was obtained a clear image of high density which was excellent in resolving power as well as in gradation reproducibility.

Next, the above image forming member was subjected to corona charging by means of a charge light-exposure experimental device at ⊖5.5 KV for 0.2 sec., followed immediately image exposure to light at a dosage of 0.8 lux. sec., and thereafter immediately a positively charged developer was cascaded on the surface of the member. Then, by copying on a copying paper and fixing, there was obtained a very clear and sharp image.

As apparently seen from the above result, in combination with the previous result, the image forming member for electrophotography obtained in this Example has the characteristics of a both-polarity image forming member having no dependency on the charge polarity.

EXAMPLE 31

The image forming members shown by Sample No. D1 through D8 were prepared under the same conditions and procedures as used in Example 30 except that the sputtering time in forming the intermediate layer on the molybdenum substrate was varied as shown below in Table 10, and image formation was effected by placing in entirely the same device as in Example 30 to obtain the results as shown in Table 10.

TABLE 10

| Sample No. | D1 | D2 | D3 | D4 | D5 | D6 | D7 | D8 |
|---|---|---|---|---|---|---|---|---|
| Time for formation of inter-mediate layer (sec.): | 10 | 30 | 50 | 150 | 300 | 500 | 1000 | 1200 |
| Image quality: Charge polarity +: | Δ | O | ⊚ | ⊚ | ⊚ | O | Δ | X |
| Charge polarity −: | X | Δ | ⊚ | ⊚ | ⊚ | O | Δ | X |

Ranks for evaluation: ⊚ excellent; O good; Δ practically usable; X not good
Deposition speed of intermediate layer: 1 Å/sec.

As apparently seen from the results shown in Table 10, it is necessary to form a intermediate layer having a thickness within the range of from 30 Å to 1000 Å to achieve the object of this invention.

EXAMPLE 32

The image forming members for electrophotography shown by Sample No. D9 through D17 were prepared under the same conditions and procedures as in Example 30 except that the area ratio of Si to C in the target was varied as shown below in Table 11, and image formation was effected by placing in the same device as in Example 30 to obtain the results shown in Table 11. For only Samples No. D11 through D17, intermediate layers were analyzed by electron microbe method to give the results as shown in Table 12.

As apparently seen from the results shown in Tables 11 and 12, it is desirable that the ratio of Si to C in the intermediate layer is 0.4 to 0.1, in order to achieve the objects of the invention.

TABLE 11

| Sample No. | D9 | D10 | D11 | D12 | D13 | D14 | D15 | D16 | D17 |
|---|---|---|---|---|---|---|---|---|---|
| Si/C (area ratio) | 4:6 | 3:7 | 2:8 | 1.7: 8.3 | 1.5: 8.5 | 1:9 | 0.7: 9.3 | 0.5: 9.5 | 0.2: 9.8 |
| Copied image quality Charge polarity + | X | X | X | Δ | ⊚ | ⊚ | O | Δ | X |
| Charge polarity − | X | X | X | Δ | ⊚ | ⊚ | O | Δ | X |

TABLE 12

| $Si_xC_{1-x}$ Sample No. | D11 | D12 | D13 | D14 | D15 | D16 | D17 |
|---|---|---|---|---|---|---|---|
| x | 0.45 | 0.4 | 0.35 | 0.28 | 0.2 | 0.1 | 0.04 |

EXAMPLE 33

An intermediate layer comprising a-$Si_xC_{1-x}$ was formed by previously co-depositing silicon and carbon on a molybdenum substrate by the electron-beam method. The composition ratio of Si to C in said layer was such that x was about 0.3. This base plate was fixed in the chamber 1801 shown in FIG. 17 and an intrinsic (i-type) a-si:F layer was formed as a photoconductive layer thereon in a similar way to that described in Example 30. When toner image was formed in a similar way to described in Example 30, using the thus prepared image forming member for electrophotography, there was obtained an image excellent in resolving power, gradation as well as image density, with respect to both combinations of ⊖6 KV charge/⊕ charged developer and ⊕6 KV charge/⊖ charged developer.

EXAMPLE 34

After conducting formation of an intermediate layer for one minute and then formation of a photoconductive layer for 5 hours on a molybdenum substrate according to the same procedures under the same conditions as in Example 30, the high frequency power source 1809 was turned off for intermission of glow discharge. Under this state, the outflow valves 1814 and 1820 were closed and the outflow valve 1832 was opened again with opening of the shutter 1808, thus creating the same conditions as in formation of the intermediate layer. Subsequently, the high frequency power source was turned on to recommence glow discharge. The input power was 100 W, which was also the same as in formation of the intermediate layer. Thus, glow discharge was continued for 2 minutes to form a upper layer on the photoconductive layer. Then, the high frequency power source 1809 was turned off and the substrate was left to cool. Upon reaching 100° C. or lower of the substrate temperature, the outflow valve 1832 and the inflow valves 1816, 1822, 1834 were closed, with full opening of the main valve 1813 thereby evacuating the chamber to $1 \times 10^{-5}$ torr or below. Then, the main valve 1813 was closed to return the chamber 1801 to atmospheric through the leak valve 1812 so as to be ready to take out the substrate having formed respective layers.

When toner image was formed similarly as in Example 30, using the thus prepared image forming member for electrophotography, there was obtained an image excellent in resolving power, gradation as well as image density, with respect to both combinations of ⊖6 KV charge/⊕ charged developer and ⊕6 KV charge/⊖ charged developer.

EXAMPLE 35

After an intermediate layer comprising a-$Si_xC_{1-x}$ was provided on a molybdenum substrate according to the same procedures as described in Example 30, the input voltage for the heater 1804 was increased by varying the input voltage while detecting the substrate temperature, until it was constant at 200° C.

Thereafter, the auxiliary valve 1810 and then the outflow valve 1832 and the inflow valve 1834 were opened fully to effect evacuation to vacuum also in the flowmeter 1840. After the auxiliary valve 1810 and the valves 1832 and 1834 were closed, the valve 1818 of the bomb 1819 containing $SiF_4/H_2(10)$ was opened and the pressure at the outlet pressure gauge 1817 was adjusted to 1 kg/cm², followed by opening gradually the inflow valve 1816 to let in the $SiF_4/H_2(10)$ gas into the flowmeter 1815. Subsequently, the outflow valve 1814 was opened gradually and then the auxiliary valve 1810 gradually opened. Next, while reading carefully the Pirani gauge 1811, the opening of the auxiliary valve 1810 was adjusted and it was opened until the inner pressure in the chamber 1801 became $1 \times 10^2$ torr. After the inner pressure in the chamber was stabilized, the main valve 1813 was gradually closed to narrow its opening until the indication on the Pirani gauge 1811 became 0.5 torr. Confirming stabilization of gas feeding and of inner pressure, the shutter 1808 was closed, followed by turning on the high frequency power source 1809 to input a high frequency power of 13.56 MHz between the electrodes 1808 and 1809, thereby generating glow discharge in the chamber 1801, to provide an input power of 60 W. Glow discharge was continued for 3 hours to form a photoconductive layer, and thereafter the heater 1804 was turned off, and also the high frequency power source 1809 turned off. Upon cooling of the substrate to a temperature to 100° C., the outflow valve 1814 and the inflow valve 1816 were closed, with full opening of the main valve 1813 to evacuate the chamber 1801 to $10^{-5}$ torr or less. Thereafter, the main valve 1813 was closed, and the inner pressure in the chamber 1801 to atmospheric through the leak valve 1812, and the substrate having formed respective layers was taken out. In this case, the total thickness of the layers was found to be about 9μ. The thus prepared image forming member of electrophotography was subjected to image formation on a copying paper. As a result, the image formed by ⊖ corona discharge was better in quality and very clear, as compared with that formed by ⊕ corona discharge. The results show that the image forming member prepared in this Examples is dependent on the charge polarity.

EXAMPLE 36

After an intermediate layer was formed for one minute on a molybdenum substrate using conditions and procedures similar to those described Example 30, the flowmeter 1833 was evacuated similarly as in Example 30 and the deposition chamber 1801 was, also evacuated to $5 \times 10^{-7}$ torr, whereupon $SiF_4/H_2(10)$ gas was introduced into the deposition chamber according to the same procedures as used in Example 30. Thereafter, under the gas pressure at 1 Kg/cm² (reading on the outlet pressure gauge 1829) through the inflow valve 1828 from bomb 1831 containing $PF_5$ gas diluted with $H_2$ to 250 vol ppm (hereinafter referred to as $PF_5(250)/H_2$, the inflow valve 1828 and the outflow valve 1826 were adjusted to determine the opening of the outflow valve 1831 so that the reading on the flowmeter 1827 may be 1/60 of the flow amount of $SiF_4/H_2(10)$, followed by stabilization.

Subsequently, with the shutter 1808 closed and the high frequency power source 1809 turned on, the glow discharge was recommenced. The input voltage applied thereby was 60 W. Thus, glow discharge was continued for additional 4 hours to form a photoconductive layer on the intermediate layer. The heater 1804 and the high frequency power source 1809 were then turned off, and, upon cooling of the substrate to 100° C., the outflow valves 1814, 1826 and the inflow valves 1816, 1828 were closed, with full opening of the main valve 1813 to evacuate the chamber 1801 to $10^{-5}$ torr or below, followed by leaking of the chamber 1801 to atmospheric through the leak valve 1812 with closing of the main valve 1813. Under such a state, the substrate having formed layers thereon was taken out. In this case, the total thickness of the layers formed was about 11μ.

The thus prepared image forming member for electrophotography was used for forming the image on a copying paper according to the same procedures under the same conditions as described in Example 1, whereby the image formed by ⊖ corona discharge was more excellent and clear, as compared with that formed by ⊕ corona discharge. From the results, the image forming member prepared in this Example was recognized to have a dependency on the charge polarity.

EXAMPLE 37

After an intermediate layer was formed for one minute on a molybdenum substrate according to the same procedures and the same conditions as described in Example 30, the deposition chamber 1801 was evacuated to $5 \times 10^{-7}$ torr and $SiF_4/H_2(10)$ gas was introduced into the chamber 1801 according to the same procedures as used in Example 30. Then, under the pressure of $B_2H_6(500)/H_2$ gas from the bomb 1825 through the inflow valve 1822 at 1 Kg/cm² (reading on the outlet pressure gage 1823), the inflow valve 1822 and the outflow valve 1820 were adjusted to determine the opening of the outflow valve 1820 so that the reading on the flowmeter 1821 was 1/15 of the flow amount of $SiF_4/H_2(10)$ gas, followed by stabilization.

Subsequently, with the shutter 1808 closed, the high frequency power source 1809 was turned on again to recommence glow discharge. The input voltage applied was 60 W. Thus, glow discharge was continued for additional 4 hours to form a photoconductive layer on the intermediate layer. The heater 1804 and the high frequency power source 1809 were turned off and, upon cooling of the substrate to 100° C., the outflow valves 1814, 1820 and the inflow valves 1816, 1822 were closed, with full opening of the main valve 1813 to evacuate the chamber 1801 to $10^{-5}$ torr or below. Then, the chamber 1801 was brought to atmospheric through the leak valve 1812 with closing of the main valve 1813, and the substrage having formed respective layers was taken out. In this case, the total thickness of the layers formed was about 10μ.

The thus prepared image forming member for electrophotography was used for forming an image on a copying paper according to the same procedures and under the same conditions as described in Example 1. As a result, the image formed by ⊕ corona discharge was more excellent in image quality and extremely clear, as compared with that formed by ⊖ corona discharge. The results show that the image forming member obtained in this Example has a dependency on charge polarity, which dependency, however, was opposite to those in the image forming members obtained in Examples 35 and 36.

EXAMPLE 38

Previously, the bomb 1819 of SiF$_4$/H$_2$(10) was replaced with a bomb containing SiF$_4$ diluted to 5 vol.% with Ar [hereinafter referred to as SiF$_4$(5)/Ar].

Then, after providing an intermediate layer on a molybdenum substrate in a similar way to describe in Example 30 and degassing the deposition chamber 1801, the main valve 1813 was closed with opening of the leak valve 1812 the deposition chamber 1801 was leaked to atmospheric and the graphite target 1806 was removed to leave the Si target alone. Then, with the leak valve 1812 closed, the chamber was evacuated to about $5 \times 10^{-7}$ torr, and the auxiliary valve 1810 and the outflow valve 1832 were opened to degas sufficiently the flowmeter 1833, followed by closing of the outflow valve 1832 and the auxiliary valve 1810.

The substrate 1802 was maintained at 200° C. by inputting power source for the heater. And, by opening the valve 1818 of the bomb 1819 of SiF$_4$(5)/Ar gas, the outlet pressure was adjusted to 1 Kg/cm$^2$ by the outlet pressure gauge 1817. Subsequently, the inflow valve 1816 was gradually opened to introduce hydrogen gas into the flowmeter 1815, followed successively by opening gradually of the outflow valve 1814 and further by opening the auxiliary valve 1810.

While detecting the inner pressure in the chamber 1801 by the Pirani gage 1811, the outflow valve 1814 was adjusted to introduce hydrogen gas to $5 \times 10^{-5}$ torr. After the flow amount was stabilized under this state, the main valve 1813 was gradually closed to narrow its opening until the inner pressure in the chamber became $1 \times 10^{-2}$ torr. After confirming stabilization of the flowmeter 1815 the high frequency power source 1809 was turned on and an alternate current of 13.56 MHz, 100 W was inputted between the Si target 1805 and the fixing member 1803. Matching was taken so that stable discharge could be continued under these conditions to form a layer. After continuing discharge for 3 hours in such a manner, the high frequency power source 1809 was turned off and the source for the heater 1804 also turned off. After the substrate temperature was lowered to 100° C. or lower, the outflow valve 1814 was closed with also closing of the auxiliary valve 1810, followed by full opening of the main valve 1813, to draw out the gas in the chamber. The main valve 1813 was then closed, with opening of the leak valve 1812, to leak the deposition chamber 1801 to atmospheric, whereupon the substrate having formed respective layers was taken out.

The thus prepared image forming member for electrophotography was subjected to image formation on a copying paper. As a result, the image formed by ⊖ corona discharge was better in quality and very clear, as compared with that formed by ⊕ corona discharge. The results show that the image forming member prepared in this Examples is dependent on the charge polarity.

EXAMPLE 39

After conducting formation of an intermediate layer for one minute and then formation of a photoconductive layer for 5 hours on a molybdenum substrate according to the same procedures under the same conditions as described in Example 30, various upper layers were provided as shown in Table 13.

Then, charging, exposure to light and copying were conducted similarly as in Example 30 with respect to both polarities ⊕ and ⊖, whereby no dependency on charging polarity was observed and very clear toner images were obtained.

TABLE 13

| Sample No. | Starting gas or Target | Upper layer Feed gas ratio | Preparation method | Power (W) | Layer thickness (Å) |
|---|---|---|---|---|---|
| 39-D1 | SiH$_4$ (dil., 10 vol. % with H$_2$) C$_2$H$_4$ (dil., 10 vol. % with H$_2$) | SiH$_4$ (+H$_2$): C$_2$H$_4$ (+H$_2$) = 1:9 | Glow | 3 | 120 |
| 39-D2 | Si(CH$_3$)$_4$ (dil., 10 Vol. % with H$_2$) | — | Glow | 3 | 120 |
| 39-D3 | SiF$_4$ (H$_2$ content: 10 vol. %) C$_2$H$_4$ (dil., 10 vol. % with H$_2$) | SiF$_4$ (+H$_2$): C$_2$H$_4$ (+H$_2$) = 1:9 | Glow | 60 | 120 |
| 39-D4 | Polycrystalline Si target N$_2$ (dil., 50 vol. % with Ar) | — | Sputtering | 100 | 200 |
| 39-D5 | Si$_3$N$_4$ target, N$_2$ (dil., 50 vol. % with Ar) | — | Sputtering | 100 | 200 |
| 39-D6 | SiH$_4$ (dil., 10 vol. % with H$_2$) N$_2$ | SiH$_4$ (+H$_2$):N$_2$ = 1:10 | Glow | 3 | 120 |
| 39-D7 | SiH$_4$ (dil., 10 vol. % with H$_2$) NH$_3$ (dil., 10 vol. % with H$_2$) | SiH$_4$ (+H$_2$): NH$_3$ (+H$_2$) = 1:2 | Glow | 100 | 120 |
| 39-D8 | SiF$_4$ (H$_2$ content: 10 vol. %) N$_2$ | SiF$_4$ (+H$_2$):N$_2$ = 1:50 | Glow | 60 | 120 |
| 39-D9 | SiF$_4$ (H$_2$ content: 10 vol. %) NH$_3$ (dil., 10 vol. % with H$_2$) | SiF$_4$ (+H$_2$): NH$_3$ (+H$_2$) = 1:20 | Glow | 60 | 120 |

(Remarks)
In Table 13, the following materials were employed:
Support: Molybdenum substrate, 0.5 mm × 10 cm × 10 cm
Intermediate layer: Using C wafer provided on Si wafer as target, sputtering was conducted in Ar atmosphere. Si:C (area ratio) = 1:9
Photoconductive layer: SiF$_4$ gas (containing 10% H$_2$)
B$_2$H$_6$ gas (diluted to 500 vol. ppm with H$_2$)
SiF$_4$/H$_2$ (10):B$_2$H$_6$ ratio (500)/H$_2$ (feed ratio) = 70:1

EXAMPLE 40

Figure 15:
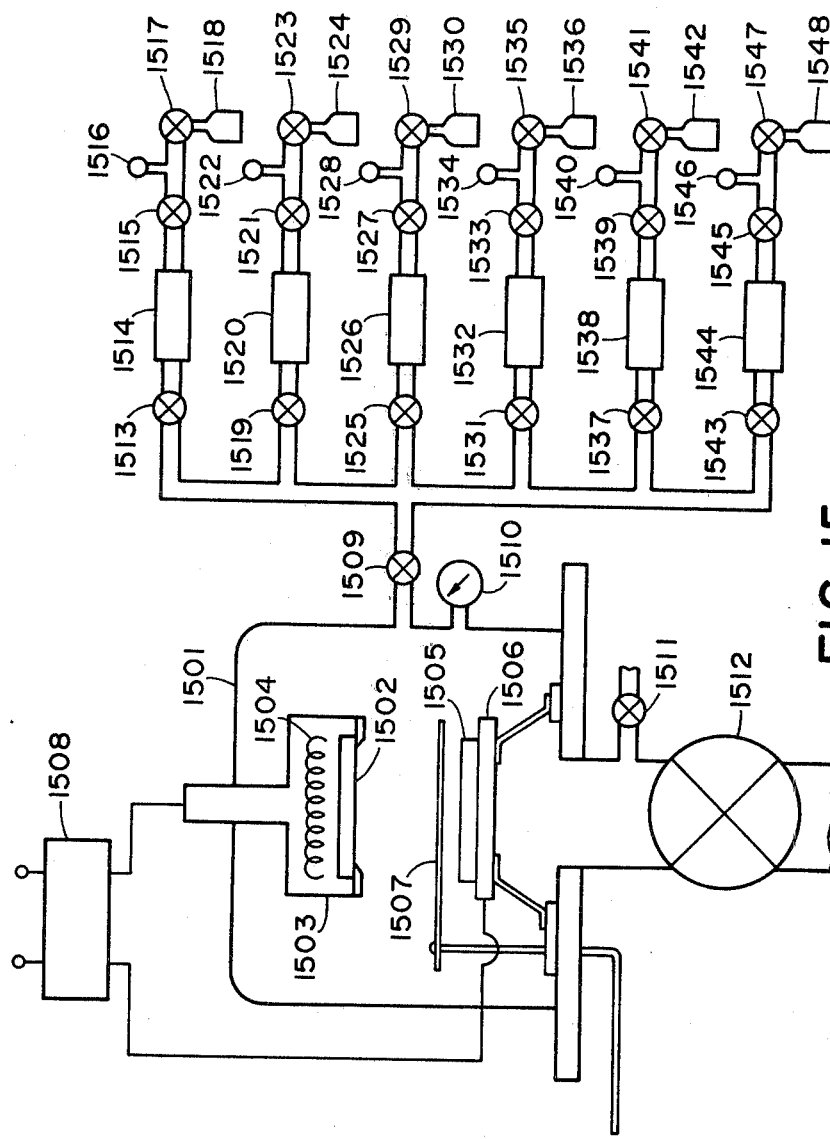

Using a device as shown in FIG. 15 placed in a clean room which had been completely shielded, an image forming member for electrography was prepared according to the following procedures.

A substrate 1502 of molybdenum of 10 cm square having a thickness of 0.5 mm, whose surface had been cleaned, was fixed firmly on a fixing member 1503 disposed at a predetermined position in glow discharge deposition chamber 1501. The substrate 1502 was heated by a heater 1504 within the fixing member 1503 with a precision of ±0.5° C. The temperature was measured directly at the backside of the substrate by an alumelchromel thermocouple. Then, after confirming that all the valves in the system are closed, the main valve 1512 was opened to discharge the gas in the chamber 1501 until it was evacuated to about $5 \times 10^{-6}$ torr. Thereafter, the input voltage for the heater 1504 was elevated by varying the input voltage while detecting the substrate temperature until the temperature was stabilized constantly at 200° C.

Then, the auxiliary valve 1509, subsequently the outflow valves 1513, 1519, 1531, 1537 and the inflow valves 1515, 1521, 1533, 1539, were opened fully to effect degassing sufficiently in the flowmeters 1514, 1520, 1532, 1538 to vacuo. After closing the auxiliary valve 1509 and the values 1513, 1519, 1531, 1537, 1515, 1521, 1533, 1539, the valve 1535 of the bomb 1536 containing $SiH_4$ gas(purity: 99.999%) diluted with $H_2$ to 10 vol% [hereinafter referred to as $SiH_4(10)/H_2$] and the valve 1541 of the bomb 1542 containing $C_2H_4$ gas diluted with $H_2$ to 10 vol% [hereinafter referred to as $C_2H_4(10)/H_2$] were respectively opened to adjust the pressures at the output pressure gauges 1534 and 1540, respectively, at 1 kg/cm², whereupon the inflow valves 1533 and 1539 were gradually opened to introduce $SiH_4(10)/H_2$ gas and $C_2H_4(10)/H_2$ gas into the flowmeters 1532 and 1538, respectively. Subsequently, the outflow valves 1531 and 1537 were gradually opened, followed by opening of the auxiliary valve 1509. The inflow valves 1533 and 1539 were adjusted thereby so that the gas feed ratio of $SiH_4(10)/H_2$ to $C_2H_4(10)/H_2$ was 1:9. Then, while carefully reading the Pirani gauge 1510, the opening of the auxiliary valve 1509 was adjusted and the auxiliary valve 1509 was opened to the extent until the inner pressure in the chamber 1501 became $1 \times 10^{-2}$ torr. After the inner pressure in the chamber 1501 was stabilized, the main valve 1512 was gradually closed to narrow its opening until the indication on the Pirani gauge 1510 became 0.5 torr. After confirming that the gas feeding and the inner pressure were stable, the shutter was closed, followed by turning on of the high frequency power source 1508, to input a high frequency power of 13.56 MHz between the electrodes 1503 and 1507, thereby generating glow discharge in the chamber 1501 to provide an input power of 3 W. In order to form a-$(Si_xC_{1-x})_y$:$H_{1-y}$ under the above conditions, the same condition were maintained for one minute to form an intermediate layer. Then, the high frequency power 1508 was turned off for intermission of discharging. Subsequently, the outflow valves 1531, 1537 were closed, followed by closing of the auxiliary valve 1509, and the main valve 1512 fully opened to discharge the gas in the chamber 1501 until it was evacuated to $5 \times 10^{-7}$.

Next, the valve 1517 of the bomb 1518 containing $SiF_4$ gas(purity: 99.999%) with $H_2$ content of 10 vol% [hereinafter referred to as $SiF_4/H_2(10)$] and the valve 1523 of the bomb 1524 containing $B_2H_6$ gas diluted with $H_2$ to 500 vol.ppm [hereinafter referred to as $B_2H_6(500)/H_2$] were respectively opened to adjust the pressures at the output pressure gauges 1516 and 1522, respectively at 1 kg/cm², whereupon the inflow valves 1515 and 1521 were gradually opened to introduce $SiF_4/H_2$ gas and $B_2H_6(500)/H_2$ gas into the flowmeters 1514 and 1520, respectively. Subsequently, the outflow valves 1513 and 1519 were gradually opened, followed by opening of the auxiliary valve 1509. The inflow valves 1515 and 1521 were adjusted thereby so that the gas feed ratio of $SiF_4/H_2(10)$ to $B_2H_6(500)/H_2$ was 70:1. Then, while carefully reading the Pirani gauge 1510, the opening of the auxiliary valve 1509 was adjusted and the auxiliary valve 1509 was opened to the extent until the inner pressure in the chamber 1501 became $1 \times 10^{-2}$ torr. After the inner pressure in the chamber 1501 was stabilized, the main valve 1512 was gradually closed to narrow its opening until the indication on the Pirani gauge 1510 became 0.5 torr. After confirming that the gas feeding and the inner pressure were stable, the shutter 1507 was closed, followed by turning on of the high frequency power source 1508, to input a high frequency power of 13.56 MHz between the electrodes 1503 and 1507, thereby generating glow discharge in the chamber 1501 to provide an input power of 60 W. After glow discharge was continued for 3 hours to form a photoconductive layer, the heater 1504 was turned off with the high frequency power source 1508 being also turned off, the substrate was left to cool to 100° C., whereupon the outflow valves 1513, 1519 and the inflow valves 1515, 1521, 1533, 1539 were closed, with the main valve 1512 fully opened, thereby to make the inner pressure in the chamber 1501 to $10^{-5}$ torr or less. Then, the main valve 1512 was closed and the inner pressure in the chamber 1501 was made atmospheric through the leak valve 1511, and the substrate having formed each layer thereon was taken out. In this case, the total thickness of the layers was about 9μ. The thus prepared image forming member for electrophotography was placed in a chage and light-exposure experimental device, and corona charge was effected at +6.0 KV for 0.2 sec., followed immediately by projection of a light image. The light image was projected through a transmission type test chart using a tungsten lamp as light source at a dosage of 0.8 lux.sec.

Immediately thereafter, a negatively charged developer (containing toner and carrier) was cascaded on the surface of the member to obtain a good toner image on the image forming member for electrophotography. When the toner image on the image forming member for electrography was copied on a copying paper by corona charge of +5.0 KV, there was obtained a clear image of high density which was excellent in resolution as well as in gradation reproducibility.

Next, the above image forming member was subjected to corona charge by means of a charging light-exposure experimental device at −5.5 KV for 0.2 sec., followed immediately image exposure to light at a dosage of 0.8 lux.sec., and thereafter immediately positively charged developer was cascaded on the surface of the member. Then, by copying on a copying paper and fixing, there was obtained a very clear and sharp image.

As apparently seen from the above result, in combination with the previous result, the image forming member for electrophotography obtained in the present Example has the characteristics of a both-polarity image forming member having no dependency on the charge polarity.

EXAMPLE 41

The image forming members shown by Sample No. E1 through E8 were prepared under the same conditions and procedures as described in Example 40 except that the sputtering time in forming the intermediate layer on the molybdenum substrate was varied as shown below in Table 14, and image formation was effected by placing in entirely the same device as described in Example 40 to obtain the results as shown in Table 14.

TABLE 14

| Sample No. | E1 | E2 | E3 | E4 | E5 | E6 | E7 | E8 |
|---|---|---|---|---|---|---|---|---|
| Time for formation of intermediate layer (sec.) | 10 | 30 | 50 | 180 | 420 | 600 | 1000 | 1200 |
| Image quality: Charge polarity ⊕ | Δ | O | ⊙ | ⊙ | ⊙ | O | Δ | X |
| Charge polarity ⊖ | X | Δ | ⊙ | ⊙ | ⊙ | O | Δ | X |

Ranks for evaluation: ⊙ excellent; O good; Δ practically useable; X not good
Film deposition speed of intermediate layer: 1 Å/sec.

As apparently seen from the results shown in Table 14, it is necessary to form a intermediate layer having a thickness within the range of from 30 Å to 1000 Å.

EXAMPLE 42

The image forming members for electrophotography as shown by Sample No. E9 through E15 were prepared under the same conditions and procedures as described in Example 40 except that the gas feed ratio of $SiH_4(10)/H_2$ to $C_2H_4(10)/H_2$ was varied as shown below in Table 15, and image formation was effected by placing in the same device as in Example 40 to obtain the results shown in Table 15. For only Samples No. E11 through E15, intermediate layers were analyzed by electron microbe method to give the results as shown in Table 16.

As apparently seen from the results in Tables 15 and 16, it is desirable to form an intermediate layer in which the ratio of Si to C, x, is within the range of from 0.50 to 0.1.

TABLE 15

| Sample No. | E9 | E10 | E11 | E12 | E13 | E14 | E15 |
|---|---|---|---|---|---|---|---|
| $SiH_4(10)/H_2/$ $C_2H_4(10)/H_2$ feed ratio | 7:3 | 6:4 | 4.5: 5.5 | 3.5: 6.5 | 1.5: 8.5 | 0.5: 9.5 | 0.25: 9.75 |
| Copied image quality Charge polarity ⊕ | X | X | X | Δ | ⊙ | ⊙ | O |
| Charge polarity ⊖ | X | X | X | Δ | ⊙ | ⊙ | O |

TABLE 16

| $Si_xC_{1-x}$ Sample No. | E11 | E12 | E13 | E14 | E15 |
|---|---|---|---|---|---|
| x | 0.55 | 0.51 | 0.34 | 0.19 | 0.11 |

EXAMPLE 43

After an intermediate layer was formed following the conditions and procedures as described in Example 40, the valve 1535 of the bomb 1536 and the valve 1541 of the bomb 1542 were closed, and the chamber 1501 was evacuated to $5 \times 10^{-7}$ torr. Thereafter, the auxiliary valve 1509 and then the outflow valves 1531, 1537 and the inflow valves 1533, 1539 were closed. Then, the valve 1517 of the bomb 1518 containing $SiF_4/H_2(10)$ was opened and the pressure at the outlet pressure gauge 1516 was adjusted to 1 $Kg/cm^2$, followed by opening gradually the inflow valve 1515 to introduce the $SiF_4/H_2(10)$ gas into the flowmeter 1514. Subsequently, the outflow valve 1513 gradually opened. Next, while reading carefully the Pirani gauge 1510, the opening of the auxiliary valve 1509 was adjusted and it was opened until the inner pressure in the chamber 1501 became $1 \times 10^{-2}$ torr. After the inner pressure in the chamber was stabilized, the main valve 1512 was gradually closed to narrow its opening until the indication on the Pirani gauge 1510 became 0.5 torr. Confirming stabilization of gas feeding and of inner pressure, the shutter 1507 was closed, followed by turning on the high frequency power source 1508 to input a high frequency power of 13.56 MHz between the electrodes 1507 and 1503, thereby generating glow discharge in the chamber 1501, to provide an input power of 60 W. Glow discharge was continued for 3 hours to form a photoconductive layer, and thereafter the heater 1504 was turned off, and also the high frequency power source 1508 turned off. Upon cooling of the substrate to a temperature to 100° C., the outflow valve 1513 and the inflow valve 1515 were closed, with full opening of the main valve 1512 to evacuate the chamber 1501 to $10^{-5}$ torr or less. Thereafter, the main valve 1512 was closed, and the inner pressure in the chamber 1501 to atmospheric through the leak valve 1511, and the substrate having formed respective layers was taken out. In this case, the total thickness of the layers was found to be about 9μ. The thus prepared image forming member for electrophotography was subjected to image formation on a copying paper. As a result, the image formed by ⊖ corona discharge was better in quality and very clear as compared with that formed by ⊕ corona discharge. The results show that the image forming member prepared in this Examples is dependent on the charge polarity.

EXAMPLE 44

After conducting formation of an intermediate layer for one minute and then formation of a photoconductive layer for 5 hours on a molybdenum substrate according to the same procedures under the same conditions as described in Example 40, the high frequency power source 1508 was turned off for intermission of glow discharge. Under this state, the outflow valves 1513, 1519 were closed and the outflow valves 1531, 1537 were opened again, thus creating the same conditions as described in formation of the intermediate layer. Subsequently, the high frequency power source was turned on to recommence glow discharge. The input power was 3 W, which was also the same as in formation of the intermediate layer. Thus, glow discharge was continued for 2 minutes to form an upper layer on the photoconductive layer. Then, the heater 1504 and the high frequency power source 1508 were turned off and the substrate was left to cool. Upon reaching 100° C. of the substrate temperature, the outflow valves 1531, 1537 and the inflow valves 1533, 1539 were closed, with full opening of the main valve 1512, thereby evacuating the chamber to $1\times10^{-5}$ torr or less. Then, the main valve 1512 was closed to return the chamber 1501 to atmospheric through the leak valve 1511 so as to be ready to take out the substrate having formed respective layers.

The thus prepared image forming member for electrophotography was placed in the same charging-light exposure experimental device as used in Example 1, wherein corona charge was effected at ⊕6 KV for 0.2 sec., followed immediately by projection of a light image. Projection of the light image was effected through a transmission type test chart, using a tungsten lamp as light source, at a dosage of 1.0 lux. sec.

Immediately thereafter, a negatively charged developer (containing toner and carrier) was cascaded on the surface of the member, whereby there was obtained a good image on the surface of the member. When the toner image on the member was copied on a copying paper by corona discharge at ⊕5.0 KV. As a result, a clear image of high density was obtained with excellent resolving power and good gradation reproducibility.

EXAMPLE 45

After an intermediate layer was formed for one minute on a molybdenum substrate using conditions and procedures similar to Example 40, the deposition chamber was evacuated to $5\times10^{-7}$ torr, whereupon $SiF_4/H_2(10)$ gas was introduced into the deposition chamber according to the same procedures as in Example 40. Thereafter, under the gas pressure at 1 Kg/cm² (reading on the outlet pressure gauge 1522) through the inflow valve 1521 from $B_2H_6(500)/H_2$ bomb 1524, the inflow valve 1521 and the outflow valve 1519 were adjusted to determine the opening of the outflow valve 1519 so that the reading on the flowmeter 1520 may be 1/15 of the flow amount of $SiF_4/H_2(10)$, followed by stabilization. Subsequently, with the shutter 1507 closed and the high frequency power source 1508 turned on, the glow discharge was recommenced. The input voltage applied thereby was 60 W. Thus, glow discharge was continued for additional 4 hours to form a photoconductive layer on the intermediate layer. The heater 1504 and the high frequency power source 1508 were then turned off, and, upon cooling of the substrate to 100° C., the outflow valves 1513, 1519 and the inflow valves 1515, 1521 were closed, with full opening of the main valve 1512 to evacuate the chamber to 1501 to $10^{-5}$ torr or below, followed by leaking of the chamber 1501 to atmospheric through the leak valve 1511 with closing of the main valve 1512. Under such a state, the substrate having formed layers thereon was taken out. In this case, the total thickness of the layers formed was about 10μ.

The thus prepared image forming member for electrophotography was used for forming the image on a copying paper according to the same procedures under the same conditions as in Example 40, whereby the image formed by ⊕ corona discharge was more excellent and clear, as compared with that formed by ⊖ corona discharge. From the results, the image forming member prepared in this Example was recognized to have a dependency on the charge polarity.

EXAMPLE 46

After an intermediate layer was formed for one minute on a molybdenum substrate according to the same procedures and the same conditions as described in Example 40, the deposition chamber was evacuated to $5\times10^{-7}$ torr and $SiF_4/H_2(10)$ gas was introduced into the chamber 1501 according to the same procedures as in Example 40. Then, $PF_5$ gas diluted to 250 vol.ppm with $H_2[PF_5(250)/H_2]$ was from the bomb 1530 to the flow meter 1526 through the feed valve 1527 at 1 Kg/cm² (reading on the outlet pressure gauge 1528), the inflow valve 1527 and the outflow valve 1525 were adjusted to determine the opening of the outflow valve 1525 so that the reading on the flowmeter 1526 was 1/60 of the flow amount of $SiF_4/H_2(10)$ gas, followed by stabilization.

Subsequently, with the shutter 1507 closed, the high frequency power source 1508 was turned on again to recommence glow discharge. The input voltage applied was 60 W. Thus, glow discharge was continued for additional 4 hours to form a photoconductive layer on the intermediate layer. The heater 1504 and the high frequency power source 1508 were turned off and, upon cooling of the substrate to 100° C., the outflow valves 1513, 1525 and the inflow valves 1515, 1527 were closed, with full opening of the main valve 1512 to evacuate the chamber to $10^{-5}$ torr or less. Then, the chamber 1501 was brought to atmospheric through the leak valve 1511 with closing of the main valve 1512, and the substrate having formed respective layers was taken out. In this case, the total thickness of the layers formed was about 11μ.

The thus prepared image forming member for electrophotography was used for forming an image on a copying paper according to the same procedures and under the same conditions as described in Example 40. As a result, the image formed by ⊖ corona discharge was more excellent in image quality and extremely clear, as compared with that formed by ⊕ corona discharge. The results show that the image forming member obtained in this Example has a dependency on charge polarity.

EXAMPLE 47

Corning 7059 glass (1 mm thick, 4×4 cm, polished on both surfaces) with cleaned surfaces, having on one surface ITO in thickness of 1000 A deposited by the electron beam vapor deposition method, was placed on the support 1503 in the same device as used in Example 40 (FIG. 15) with the ITO-deposited surface as upper surface. Subsequently, according to the same procedures as described in Example 40, the glow discharge deposition chamber 1501 was evacuated to $5\times10^{-6}$ torr, and the substrate temperature was maintained at 150° C. Then, the auxiliary valve 1509, subsequently the outflow valve 1543 and the inflow valve 1545, were opened fully to effect degassing sufficiently of the flowmeter 1544 to vacuo. After closing the auxiliary valve 1509 and the valve 1543, 1545, the valve 1547 of the bomb 1548 containing $Si(CH_3)_4$ gas (purity: 99.999%) diluted with $H_2$ to 10 vol% [hereinafter referred to as $Si(CH_3)_4(10)/H_2$] was opened to adjust the pressure at the output pressure gauge to 1 kg/cm², whereupon the inflow valve 1545 was gradually opened to introduce $Si(CH_3)_4(10)/H_2$ gas into the flowmeter 1544. Subsequently, the outflow valve 1543 was gradually opened. Then, while carefully reading the Pirani gauge 1510, the opening of the auxiliary valve 1509 was adjusted and the auxiliary valve 1509 was opened to the extent until the inner pressure in the chamber 1501 became $1\times10^{-2}$ torr. After the inner pressure in the chamber 1501 was stabilized, the main valve 1512 was gradually closed to narrow its opening until the indication on the Pirani gauge 1510 became 0.5 torr. After confirming that the gas feeding and the inner pressure were stable, the high frequency power source 1508 was turned on to input a high frequency power of 13.56 MHz between the electrodes 1503 and 1507, thereby generating glow discharge in the chamber 1501 to provide an input power of 3 W.

The above conditions were maintained for one minute to deposit an intermediate layer on the substrate. Then, with the high frequency power source 1508 turned off for intermission of the glow discharge, the outflow valve 1543 and the inflow valve 1545 were closed, and next the valve 1517 of the bomb 1518 containing $SiF_4/H_2(10)$ gas and the valve 1523 of the bomb 1524 containing $B_2H_6(500)/H_2$ gas were respectively opened to adjust the pressures at the outlet pressure gauges 1522 and 1516, respectively, at 1 kg/cm$^2$, whereupon the inflow valves 1515 and 1521 were gradually opened to introduce $SiF_4/H_2(10)$ gas and $B_2H_6(500)/H_2$ gas into the flowmeters 1514 and 1520, respectively. Subsequently, the outflow valves 1513 and 1519 were gradually opened. The outflow valves 1513 and 1519 were adjusted thereby so that the gas feed ratio of $SiF_4/H_2(10)$ to $B_2H_6(500)$ was 70:1. Then, as in formation of the intermediate layer, valve operations were conducted so that the inner pressure in 1501 may be 0.5 torr.

Subsequently, the high frequency power source 1508 was turned on to recommence glow discharge. The input power was 60 W, as was increased higher than before. After glow discharge was additionally continued for 3 hours to form a photoconductive layer, the heater 1504 was turned off with the high frequency power source 1508 being also turned off, the substrate is left to cool to 100° C., whereupon the outflow valves 1513, 1519 and the inflow valves 1515, 1521 were closed, with the main valve 1512 fully opened, thereby to make the inner pressure in the chamber 1501 to $10^{-5}$ torr or less. Then, the main valve 1512 was closed and the inner pressure in the chamber was made atmospheric through the leak valve 1511, and the substrate having formed each layer thereon was taken out. In this case, the total thickness of the layers was about 9μ. The thus prepared image forming member for electrophotography was placed in an experimental device for charging and exposure to light, and corona charge was effected at ⊕6.0 KV for 0.2 sec., followed immediately by projection of a light image. The light image was irradiated through a transmission type test chart using a tungsten lamp as light source at a dosage of 1.0 lux.sec.

Immediately thereafter, a negatively charged developer (containing toner and carrier) was cascaded on the surface of the member to obtain a good toner image on the image forming member for electrophotography. When the toner image on the image forming member for electrophotography was copied on a copying paper by corona charge of ⊕5.0 KV, there was obtained a clear image of high density which was excellent in resolving power as well as in gradation reproducibility.

Similar clear and sharp images were also obtained when the corona charge polarity was changed to ⊖ and the polarity of the developer to ⊕.

EXAMPLE 48

After the $SiF_4/H_2(10)$ gas bomb 1518 had been replaced with a bomb containing $SiF_4$(purity: 99.999%) diluted to 5 vol.% with Ar [hereinafter referred to as $SiF_4(5)/Ar$], an intermediate layer was provided on a molybdenum substrate in a similar way to described in Example 40, followed by degassing the gas from the chamber 1501. Then, the valve 1517 of the $SiF_4(5)/Ar$ bomb 1518 was opened to adjust the outlet pressure to 1 Kg/cm$^2$ by the outlet pressure gauge 1516. Subsequently, the inflow valve 1515 was gradually opened to let in the $SiF_4(5)/Ar$ gas into the flowmeter 1514, followed by gradual opening of the outflow valve 1513 and then the auxiliary valve 1509.

The outflow valve 1513 was adjusted by detecting the inner pressure in the chamber 1501 by the Pirani gauge 1510 to $5 \times 10^{-4}$ torr. After the flow amount was stabilized under this state, the main valve 1512 was gradually closed to narrow the opening until the inner pressure in the chamber became $1 \times 10^{-2}$ torr.

With the shutter 1507 opened, confirming that the flowmeter 1514 had been stabilized, the high frequency power source 1508 was turned on to input an alternate current of 13.56 MHz, 100 W, between the target 1505 and the fixing member 1503. Matching was taken so that stable glow discharge was continued under these conditions to form a layer. After glow discharge was continued for 3 hours, the heater 1504 was turned off with the high frequency power source 1508 being also turned off, the substrate was left to cool to 100° C., whereupon the outflow valve 1513 and the auxiliary valve 1509 were closed, with the main valve 1512 fully opened, thereby to draw out gas in the chamber. Then, the main valve 1512 was closed and the inner pressure in the chamber was made atmosphere through the leak valve 1511, and the substrate having formed each layer thereon was taken out.

The thus prepared image forming member for electrophotography was used for forming the image on a copying paper according to the same procedures under the same conditions as described in Example 40, whereby the image formed by ⊖ corona discharge was more excellent and clear, as compared with that formed by ⊕ corona discharge. From the results, the image forming member prepared in this Example was recognized to have a dependency on the charge polarity.

EXAMPLE 49

The intermediate layers and the upper layers were varied as shown in the following Table 17 and, on the other hand, the photoconductive layers were formed according to the same procedures and conditions as described in Example 40 to prepare 40 samples, Snm (n indicating the number of the intermediate layer, and m that of the upper layer). Each sample was subjected to charging, exposure to light and copying with respect to both polarity ⊕ and ⊖ under similar conditions to that described in Example 40, whereby no dependency on charge polarity was observed and the toner image obtained were all very clear and sharp.

TABLE 17

| | |
|---|---|
| Support: | Molybdenum plate, 0.5 mm × 10 cm × 10 cm |
| Photoconductive layer: | $SiF_4$ gas (containing 10% $H_2$) |
| | $B_2H_6$ gas (diluted to 500 vol. % with $H_2$) |
| $SiF_4 (+H_2):B_2H_6 (+H_2) = 70:1$ | |

TABLE 17-continued

Intermediate layer

| No. | Starting gas | Method | Power (W) | Layer thickness (A) |
|---|---|---|---|---|
| 1 | $SiH(CH_2)_3$ (dil. 10 vol % with $H_2$) | Glow | 3 | 120 |
| 2 | $SiH_2(CH_3)_2$ (dil., 10 vol % with $H_2$) | Glow | 3 | 120 |
| 3 | $SiH_3(CH_3)$ (dil., 10 vol % with $H_2$) | Glow | 3 | 120 |
| 4 | $SiH_2(C_2H_5)_2$ (dil., 10 vol % with $H_2$) | Glow | 3 | 120 |
| 5 | Polycrystalline Si $C_2H_4$ (dil., 50% with Ar) | Sputtering | 100 | 200 |

Upper layer

| Sample No. | Starting gas or Target | Feed gas ratio | Preparation method | Power (W) | Layer thickness (A) |
|---|---|---|---|---|---|
| 1 | Polycrystalline Si target Graphite target | Si:C (area ratio) = 1:9 | Sputtering | 100 | 120 |
| 2 | $SiF_4$ ($H_2$ content: 10 vol. %) $C_2H_4$ (dil. 10 vol. % with $H_2$) | $SiF_4$ (+$H_2$): $C_2H_4$ (+$H_2$) = 1:9 | Glow | 60 | 120 |
| 3 | Polycrystalline Si target $N_2$ (dil. 50 vol. % with Ar) | — | Sputtering | 100 | 200 |
| 4 | $Si_3N_4$ target $N_2$ (dil. 50% with Ar) | — | Sputtering | 100 | 200 |
| 5 | $SiH_4$ (dil. 10 vol. % with $H_2$) $N_2$ | $SiH_4$ (+$H_2$):$N_2$ = 1:10 | Glow | 3 | 120 |
| 6 | $SiH_4$ (dil. 10 vol. % with $H_2$) $NH_3$ (dil. 10 vol. % with $H_2$) | $SiH_4$ (+$H_2$): $NH_3$ (+$H_2$) = 1:2 | Glow | 100 | 120 |
| 7 | $SiF_4$ ($H_2$ content: 10 vol. %) $N_2$ | $SiF_4$ (+$H_2$):$N_2$ = 1:50 | Glow | 60 | 120 |
| 8 | $SiF_4$ ($H_2$ content: 10 vol. %) $NH_3$ | $SiF_4$ (+$H_2$):$NH_3$ (+$H_2$) = 1:20 | Glow | 60 | 120 |

EXAMPLE 50

Using a device as shown in FIG. 14 placed in a clean room which had been completely shielded, an image forming member for electrophotography was prepared according to the following procedures. In carrying out these procedures, each bomb had been previously filled with necessary gases.

A substrate 1409 of molybdenum of 10 cm spuare having a thickness of 0.5 mm, whose surface had been cleaned, was fixed firmly on a supporting member 1402 disposed at a predetermined position in a deposition chamber 1401. The substrate 1409 was heated by a heater 1408 within the fixing member 1403 with a precision of ±0.5° C. The temperature was measured directly at the backside of the substrate by an alumel-chromel thermocouple. Then, after confirming that all the valves in the system are closed, the main valve 1410 was fully opened to discharge the gas in the chamber 1401 until it was evacuated to about $5 \times 10^{-6}$ torr. Thereafter, the input voltage for the heater 1408 was elevated by varying the input voltage while detecting the substrate temperature until the temperature was stabilized constantly at 200° C.

Then, the auxiliary valve 1440, subsequently the outflow valves 1425, 1426, 1427 and the inflow valves 1420-2, 1421, 1422, were opened fully to effect degassing sufficiently in the flowmeters 1416, 1417, 1418 to vacuo. After closing the auxiliary valve 1440 and the valves 1425, 1426, 1427, 1420-2, 1421, 1422, the valve 1430 of the bomb 1411 containing $SiF_4$ gas (purity:99.999%) with $H_2$ content of 10 vol.% [hereinafter referred to as $SiF_4/H_2(10)$] and the valve 1431 of the bomb 1412 containing $C_2H_4$ gas diluted with $H_2$ to 10 vol.% [hereinafter referred to as $C_2H_4(10)/H_2$] were respectively opened to adjust the pressures at the outlet pressure gauges 1435 and 1436, respectively, at 1 kg/cm², whereupon the inflow valves 1420-2 and 1421 were gradually opened to permit $SiF_4/H_2(10)$ gas and $C_2H_4(10)/H_2$ gas to flow into the flowmeters 1416 and 1417, respectively. Subsequently, the outflow valves 1425 and 1426 were gradually opened, followed by opening of the auxiliary valve 1440. The inflow valves 1420-2 and 1421 were adjusted thereby so that the gas feed ratio of $SiF_4/H_2(10)$ to $C_2H_4(10)/H_2$ was 1:80. Then, while carefully reading the Pirani gauge 1441, the opening of the auxiliary valve 1440 was adjusted and the auxiliary valve 1440 was opened to the extent until the inner pressure in the chamber 1401 became $1 \times 10^{-2}$ torr. After the inner pressure in the chamber 1401 was stabilized, the main valve 1410 was gradually closed to narrow its opening until the indication on the Pirani gauge 1441 became 0.5 torr. After confirming that the gas feeding and the inner pressure were stable, followed by turning on of the high frequency power source 1442, to input a high frequency power of 13.56 MHz into the induction coil 1443, thereby generating glow discharge in the chamber 1401 at the coil portion (upper part of chamber) to provide an input power of 60 W. The above conditions were maintained for one minute to deposit an intermediate layer on the substrate. Then, with the high frequency power source 1442 turned off for intermission of the glow discharge, the outflow value 1426 was closed, and next the valve 1432 of the bomb 1413 containing $B_2H_6$ gas diluted with $H_2$ to 500 vol.ppm [hereinafter referred to as $B_2H_6(500)/H_2$] was opened to adjust the pressure at the outlet pressure gauge 1437 at 1 kg/cm², whereupon the inflow valve 1422 was gradually opened to introduce $B_2H_6(500)/H_2$ gas into the flowmeters 1418. Subsequently, the outflow valve 1427 was gradually opened. The inflow valves 1420 and 1422 were adjusted thereby so that the gas feed ratio $B_2H_6(500)/H_2$ to $SiF_4/H_2(10)$ was 1:70. Then, similarly as information of the intermediate layer, openings of the auxiliary valve 1440 and the main valve 1410 were adjusted so that the indication on the Pirani gauge was 0.5 torr, followed by stabilization.

Subsequently, the high frequency power source was turned on to recommence flow discharge. The input power was 60 W, which was the same as before. After glow discharge was additionally continued for 3 hours to form a photoconductive layer, the heater 1408 was turned off with the high frequency power source 1442 being also turned off, the substrate is left to cool to 100° C. whereupon the outflow valves 1425, 1427 and the inflow valves 1420-2, 1421, 1422 were closed, with the main valve 1410 fully opened, thereby to make the inner pressure in the chamber 1401 to $10^{-3}$ torr or below. Then, the main valve 1410 was closed and the inner pressure in the chamber was made atmospheric through the leak valve 1443, and the substrate having formed each layer thereon was taken out. In this case, the entire thickness of the layers was about $9\mu$. The thus prepared image forming member for electrophotography was placed in an experimental device for charge and exposure to light, and corona charge was effected at $\oplus 6.0$ KV for 0.2 sec., followed immediately by projection of a light image. The light image was projected through a transmission type test chart using a tungstent lamp as light source at a dosage of 0.8 lux.sec.

Immediately thereafter, a negatively charged developer (containing toner and carrier) was cascaded on the surface of the member to obtain a good toner image on the image forming member for electrophography. When the toner image on the image forming member for electrophotography was copied on a copying paper by corona charging at $\oplus 5.0$ KV, there was obtained a clear image of high density which was excellent in resolving power as well as in gradation reproducibility.

Next, the above image forming member was subjected to corona charge by means of a charging light-exposure experimental device at $\ominus 5.5$ KV for 0.2 sec., followed immediately image exposure to light at a dosage of 0.8 lux.sec., and thereafter immediately a positively charged developer was cascaded on the surface of the member. Then, by copying on a copying paper and fixing, there was obtained a very clear and sharp image.

As apparently seen from the above result, in combination with the previous result, the image forming member for electrophotography has the characteristics of a both-polarity image forming member having no dependency on the charge polarity.

EXAMPLE 51

The image forming members as shown by Sample No. F1 through F8 were prepared under the same conditions and procedures as described in Example 50 except that the glow discharge maintenance time in forming the intermediate layer on the molybdenum substrate was varied as shown below in Table 18, and image formation was effected by placing in entirely the same device as in Example 50 to obtain the results as shown in Table 18.

TABLE 18

| Sample No. | F1 | F2 | F3 | F4 | F5 | F6 | F7 | F8 |
|---|---|---|---|---|---|---|---|---|
| Time for formation of intermediate layer (sec.) | 10 | 30 | 50 | 180 | 420 | 600 | 1000 | 1200 |
| Image quality: Charge polarity ⊕ | Δ | O | ⊙ | ⊙ | ⊙ | O | Δ | X |

TABLE 18-continued

| Sample No. | F1 | F2 | F3 | F4 | F5 | F6 | F7 | F8 |
|---|---|---|---|---|---|---|---|---|
| Charge polarity ⊖ | X | Δ | ⊙ | ⊙ | ⊙ | O | Δ | X |

Ranks for evaluation ⊙ excellent; O good; Δ practically useable; X not good
Film deposition speed of intermediate layer: 1 Å/sec.

As apparently from the results shown in Table 18, it is necessary to form a intermediate layer having a thickness within the range of from 30 Å to 1000 Å.

EXAMPLE 52

The image forming members for electrophotography as shown by Sample No. F9 through F15 were prepared under the same conditions and procedures as described in Example 50 except that the feed gas ratio of $SiF_4/H_2(10)$ to $C_2H_4(10)/H_2$ was varied as shown below in Table 19, and image formation was effected by placing in the same device as in Example 50 to obtain the results shown in Table 19. For only Samples No. F11 through F15, intermediate layers were analyzed by electron microbe method to give the results as shown in Table 20.

As apparently seen from the results in Tables 19 and 20, it is desirable to form an intermediate layer in which the ratio of Si to C, x, in within the range of from 0.1 to 0.47.

TABLE 19

| Sample No. | F9 | F10 | F11 | F12 | F13 | F14 | F15 |
|---|---|---|---|---|---|---|---|
| $SiF_4/H_2(10)$: $C_2H_4(10)/H_2$ (feed ratio) | 7:3 | 6:4 | 4:6 | 3:7 | 1.5: 8.5 | 0.5: 9.5 | 0.2: 9.8 |
| Copied image quality: | | | | | | | |
| Charge polarity ⊕ | X | X | X | Δ | ⊙ | ⊙ | O |
| Charge polarity ⊖ | X | X | X | Δ | ⊙ | ⊙ | O |

TABLE 20

| Sample No. | F11 | F12 | F13 | F14 | F15 |
|---|---|---|---|---|---|
| X | 0.55 | 0.47 | 0.33 | 0.21 | 0.11 |

EXAMPLE 53

The molybdenum substrate was placed similarly as in Example 50, and the glow discharge deposition chamber 1401 as shown in FIG. 14 was evacuated to $5 \times 10^{-6}$ torr. After the substrate temperature had been maintained at 200° C., the gas feeding systems for $SiF_4/H_2(10)$ and $C_2H_4(10)/H_2$ were brought to vacuo of $5 \times 10^{-6}$ torr according to the same procedures as in Example 50. Then, the auxiliary valve 1440 and the outflow valves 1425, 1426, and the feed valves 1420-2, 1421 were closed and then the valve 1430 of the bomb 1411 of $SiF_4/H_2(10)$ gas and the valve 1431 of the bomb 1412 of $C_2H_4(10)/H_2$ gas were respectively opened to adjust the pressures at the outlet pressure gauges 1435 and 1436, respectively, at 1 kg/cm², whereupon the feed valves 1420-2 and 1421 were gradually opened to introduce $SiF_4/H_2(10)$ gas and $C_2H_4(10)/H_2$ gas into the flowmeters 1416 and 1417, respectively. Subsequently, the outflow valves 1425 and 1426 were gradually opened, followed by opening of the auxiliary valve 1440. The inflow valves 1420-2 and 1421 were adjusted thereby so that the gas feed ratio of $SiF_4/H_2(10)$ to $C_2H_4(10)/H_2$ was 1:80. Then, while carefully reading the Pirani gauge 1441, the opening of the auxiliary valve 1440 was adjusted and the auxiliary valve 1440 was opened to the extent until the inner pressure in the chamber 1401 became $1\times10^{-2}$ torr. After the inner pressure in the chamber 1401 was stabilized, the main valve 1410 was gradually closed to narrow its opening until the indication on the Pirani gauge 1441 became 0.5 torr. After the gas feeding was stabilized to give a constant inner pressure in the chamber and the substrate temperature stabilized to 200° C., in a similar way to that described in Example 50, the high frequency power source 1442 was turned on to commence glow discharging at an inport power of 60 W, which condition was maintained for 1 minute to form an intermediate layer on the substrate. Then, the high frequency power source 1442 was turned off for intermission of glow discharging. Under this state, the outflow valve, 1426 was closed. The openings of the auxiliary valve 1440 and the main valve 1410 were adjusted and stabilized until the indication on the Pirani gauge was 0.5 torr, similarly as in formation of the intermediate layer.

Subsequently, by turning on of the high frequency power source 1442 to recommence glow discharge. The input power was 60 W, similarly as before. After glow discharge was additionally continued for 5 hours to form a photoconductive layer, the heater 1408 was turned off with the high frequency power source 1442 being also turned off, the substrate is left to cool to 100° C., whereupon the outflow valve 1425 and the inflow valves 1420-2, 1421 were closed, with the main valve 1410 fully opened, thereby to make the inner pressure in the chamber 1401 to $10^{-5}$ torr or less. Then, the main valve 1410 was closed and the inner pressure in the chamber was made atmospheric through the leak valve 1444, and the substrate having formed each layer thereon was taken out. In this case, the total thickness of the layers was about 15μ.

The thus prepared image forming member for electrophotography was used for forming the image on a copying paper according to the same procedures under the same conditions as described in Example 50, whereby the image formed by ⊖ corona discharge was more excellent and clear, as compared with that formed by ⊕ corona discharge. From the results, the image forming member prepared in this Example was recognized to have a dependency on the charge polarity.

EXAMPLE 54

After conducting formation of an intermediate layer for one minute on a molybdenum substrate according to the same procedures under the same conditions as described in Example 50, the high frequency power source 1442 was turned off for intermission of glow discharge. Under this state, the outflow valve 1426 was closed, and the valve 1433 of the bomb 1414 containing $PH_3$ gas diluted to 250 vol.ppm with $H_2$ [hereinafter referred to as $PH_3(250)/H_2$] was opened and the pressure at the outlet pressure gauge 1438 was adjusted to 1 kg/cm², followed by opening gradually of the feed valve 1423 to introduce the $PH_3(250)/H_2$ gas into the flowmeter 1419. Subsequently, the outflow valve 1428 was opened gradually. The inflow valves 1420 and 1423 were thereby adjusted so that the feed gas ratio of $PH_3(250)/H_2$ to $SiF_4/H_2(10)$ was 1:60.

Next, the openings of the auxiliary valve 1440 and the main valve 1410 were adjusted and stabilized, similarly as in formation of the intermediate layer, until the indication on the Pirani gauge was 0.5 torr.

Subsequently, the high frequency power source 1442 was turned on again to recommence glow discharge again with an input power of 60 W. After glow discharge was continued for additional 4 hours to form a photoconductive layer, the heater 1408 was turned off with the high frequency power source 1442 being also turned off, the substrate is left to cool to 100° C., whereupon the outflow valves 1428, and the inflow valves 1420-2, 1421, 1423 were closed, with the main valve 1410 fully opened, thereby to make the inner pressure in the chamber 1401 to $10^{-5}$ torr or less. Then, the main valve 1410 was closed and the inner pressure in the chamber 1401 was made atmospheric through the leak valve 1444, and the substrate having formed each layer thereon was taken out. In this case, the total thickness of the layers was about 11μ.

The thus prepared image forming member for electrophotography was subjected to image formation on a copying paper. As a result, the image formed by ⊖ corona discharge was better in quality and very clear, as compared with that formed by ⊕ corona discharge. The results show that the image forming member prepared in this Examples is dependent on the charge polarity.

EXAMPLE 55

The intermediate layer and the photoconductive layer were formed on the molybdenum substrate under the same condition according to the same procedures as described in Example 20, except that, after formation of the intermediate layer on the molybdenum substrate, the feed gas ratio of $B_2H_6(500)/H_2$ gas to $SiF_4/H_2(10)$ gas was changed to 1:15 in forming the photoconductive layer.

The thus prepared image forming member for electrophotography was subjected to image formation on a copying paper. As a result, the image formed by ⊕ corona discharge was better in quality and very clear, as compared with that formed by ⊖ corona discharge. This result shows that the image forming member prepared in this Example is dependent on the charge polarity. But the charge polarity dependency was opposite to those of the image forming members obtained in Examples 53 and 54.

EXAMPLE 56

After conducting formation of an intermediate layer for one minute and then formation of a photoconductive layer for 5 hours on a molybdenum substrate according to the same procedures under the same conditions as in Example 50, the high frequency power source 1442 was turned off for intermission of glow discharge. Under this state, the outflow valve 1427 was closed and the outflow valve 1426 was opened again, thus creating the same conditions as in formation of the intermediate layer. Subsequently, the high frequency power source was turned on to recommence glow discharge. The input power was 60 W, which was also the same as in formation of the intermediate layer. Thus, glow discharge was continued for 2 minutes to form a upper layer on the photoconductive layer. Then, the heater 1408 and the high frequency power source 1442 were turned off and the substrate was left to cool. Upon reaching 100° C. of the substrate temperature, the outflow valves 1425, 1426 and the inflow valves 1420-2, 1421, 1422 were closed, with full opening of the main valve, thereby evacuating the chamber to $1\times10^{-5}$ torr or below. Then, the main valve 1410 was closed to return the chamber 1401 to atmospheric through the leak valve 1444 so as to be ready to take out the substrate having formed respective layers.

The thus prepared image forming member for electrophotography was placed in the same charge light-exposure experimental device as used in Example 50, wherein corona charge was effected at ⊕6 KV for 0.2 sec., followed immediately by projection of a light image. Projection of the light image was effected through a transmission type test chart, using a tungsten lamp as light source, at a dosage of 1.0 lux.sec.

Immediately thereafter, a negatively charged developer (containing toner and carrier) was cascaded on the surface to the member, whereby there was obtained a good image on the surface of the member. When the toner image on the member was copied on a copying paper by corona discharge at ⊕5.0 KV. A clear image of a high density was obtained with excellent resolving power and good gradation reproducibility.

EXAMPLE 57

Corning 7059 glass (1 mm thick, 4×4 cm, polished on both surfaces) with cleaned surfaces, having on one surface ITO in thickness of 1000 A deposited by the electron beam vapor deposition method, was placed on the fixing member 1403 in the same device as used in Example 50 (FIG. 14) with the ITO-deposited surface as upper surface. Subsequently, according to the same procedures as described in Example 50, the glow discharge deposition chamber 1401 was evacuated to $5 \times 10^{-6}$ torr, and the substrate temperature was maintained at 150° C. Then, the auxiliary valve 1440, subsequently the outflow valves 1425, 1427, 1429 and the inflow valves 1420-2, 1422, 1424, were opened fully to effect degassing sufficiently also in the flowmeters 1416, 1418, 1420-1 to vacuo. After closing the auxiliary valve 1440 and the valves 1425, 1427, 1429, 1424, 1422, 1420-2, the valve 1434 of the bomb 1415 containing $SiCl(CH_3)_3$ gas (purity: 99.999%) diluted with $H_2$ to 10 vol % [hereinafter referred to as $SiCl(CH_3)_3(10)/H_2$] was opened to adjust the pressure at the outlet pressure gauge at 1 kg/cm², whereupon the inflow valve 1424 was gradually opened to introduce $SiCl(CH_3)_3(10)/H_2$ gas into the flowmeter 1420-1. Subsequently, the outflow valve 1429 was gradually opened. Then, while carefully reading the Pirani gauge 1441, the opening of the auxiliary valve 1440 was adjusted and the auxiliary valve 1440 was opened to the extent until the inner pressure in the chamber 1401 became $1 \times 10^{-2}$ torr. After the inner pressure in the chamber 1401 was stabilized, the main valve 1410 was gradually closed to narrow its opening until the indication on the Pirani gauge 1441 became 0.5 torr. After confirming that the gas feeding and the inner pressure were stable, the high frequency power source 1442 was turned on to input a high frequency power of 13.56 MHz into the induction coil 1443, thereby generating glow discharge in the chamber 1401 at the coil portion (upper part of chamber) to provide an input power of 20 W. The above conditions were maintained for one minute to deposit an intermediate layer on the substrate. Then, with the high frequency power source 1442 turned off for intermission of the glow discharge, the outflow valve 1429 and the inflow valve 1424 were closed, and the substrate temperature was raised to 200° C. Next, the valve 1430 of $SiF_4/H_2(10)$ gas bomb 1411 and the valve 1432 of the bomb 1413 containing $B_2H_6(500)/H_2$ were opened to adjust the pressures at the outlet pressure gauges 1435, 1437 at 1 kg/cm², whereupon the inflow valves 1420-2, 1422 were gradually opened to introduce $SiF_4/H_2(10)$ gas and $B_2H_6(500)/H_2$ gas into the flowmeters 1416, 1418, respectively. Subsequently, the outflow valves 1425, 1427 were gradually opened. The inflow valves 1420-2 and 1422 were adjusted thereby so that the gas feed ratio $B_2H_6(500)/H_2$ to $SiF_4/H_2(10)$ was 1:70. Then, similarly as in formation of the intermediate layer, openings of the auxiliary valve 1440 and the main valve 1410 were adjusted so that the indication on the Pirani gauge was 0.5 torr, followed by stabilization.

Subsequently, the high frequency power source was turned on to recommence glow discharge. The input power was 60 W, which was more than before. Glow discharge was thus continued for 3 hours to form a photoconductive layer, and thereafter the heater 1408 was turned off, and also the high frequency power source 1442 turned off. Upon cooling of the substrate to a temperature to 100° C., the outflow valves 1425 and 1427 and the inflow valves 1420-2, 1422, were closed, with full opening of the main valve 1410 to evacuate the chamber 1401 to $10^{-5}$ torr or less. Thereafter, the main valve 1410 was closed, and the inner pressure in the chamber 1401 to atmospheric through the leak valve 1444, and the substrate having formed respective layers was taken out. In this case, the total thickness of the layers was found to be about 9μ. The thus prepared image forming member for electrophotography was placed in a charge and light-exposure experimental device, and corona charge was effected at ⊕6.0 KV for 0.2 sec., followed immediately by projection of a light image. The light image was porjected through a transmission type test chart using a tungsten lamp as light source at a dosage of 1.0 lux.sec.

Immediately thereafter, a negatively charged developer (containing toner and carrier) was cascaded on the surface of the member to obtain a good toner image on the image forming member for electrophotography. When the toner image on the image forming member for electrophotography was copied on a copying paper by corona charging at ⊕5.0 KV, there was obtained a clear image of high density which was excellent in resolving power as well as in gradation reproducibility.

When the corona charge polarity was changed to ⊖ and the polarity of the developer to ⊕, there was also obtained a clear and good image as in Example 50.

EXAMPLE 58

Figure 16:
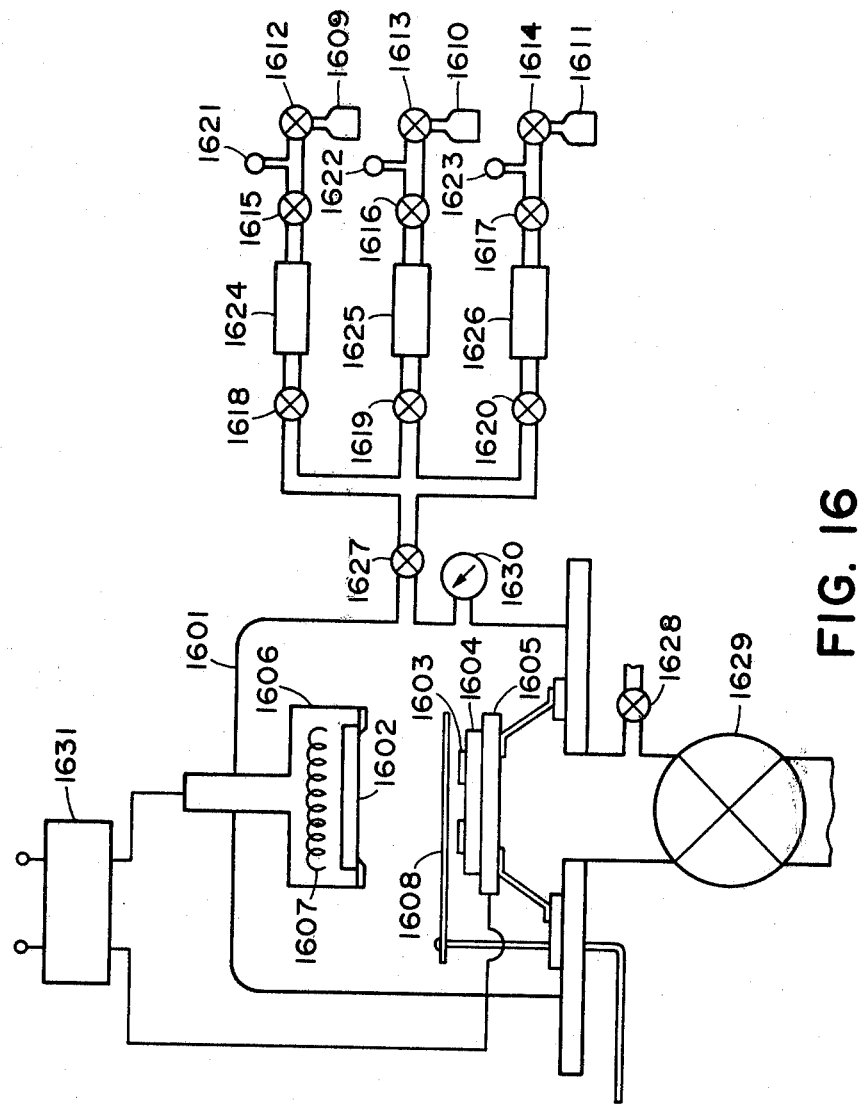

Using a device as shown in FIG. 16, an intermediate layer was formed on a molybdenum substrate according to the following procedures.

A substrate 1602 of molybdenum of 10 cm square having a thickness of 0.5 mm, whose surface had been cleaned, was fixed firmly on a fixing member 1606 disposed as a predetermined position in a deposition chamber 1601. The substrate 1602 was heated by a heater 1607 within the fixing member 1606 with a precision of ±0.5° C. The temperature was measured directly at the backside of the substrate by an alumel-chromel thermocouple. Then, after confirming that all the valves in the system are closed, the main valve 1629 was opened, and evacuation was effecgted once to about $5 \times 10^{-6}$ torr. Thereafter, the input voltage for the heater 1607 was elevated by varying the input voltage while detecting the molybdenum substrate temperature until the temperature was stabilized constantly at 200° C.

Then, the auxiliary valve 1627, subsequently the outflow valves 1618, 1619, 1620 and the inflow valves 1615, 1616, 1617, were opened fully to effect degassing sufficiently of the flowmeters 1624, 1625, 1626 to vacuo. After closing the auxiliary valve 1627 and the valves 1618, 1619, 1620, 1615, 1616, 1617, the valve 1613 of the bomb 1610 containing SiF$_4$ gas (purity: 99.999%) and the valve 1612 of the Ar gas bomb 1609 were respectively opened to adjust the pressures at the outlet pressure gauges 1622 and 1621, respectively, at 1 kg/cm$^2$, whereupon the inflow valves 1616 and 1615 were gradually opened to introduce SiF$_4$ gas and Ar gas into the flowmeters 1625 and 1624, respectively. Subsequently, the outflow valves 1619, 1618 were gradually opened, followed by opening of the auxiliary valve 1627. The inflow valves 1616 and 1615 were adjusted thereby so that the gas feed ratio of SiF$_4$ to Ar was 1:20. Then, while carefully reading the Pirani gauge 1630, the opening of the auxiliary valve 1627 was adjusted and the auxiliary valve 1627 was opened to the extent until the inner pressure in the chamber 1601 became $1 \times 10^{-4}$ torr. After the inner pressure in the chamber 1601 was stabilized, the main valve 1629 was gradually closed to narrow its opening until the indication on the Pirani gauge 1630 became $1 \times 10^{-2}$ torr.

With the shutter 1608 opened, and confirming that the flowmeters 1625 and 1624 were stabilized, the high frequency power 1631 was turned on to apply an alternate current power of 13.56 MHz and 100 W between the target 1604 of high purity polycrystalline silicon/the target 1603 of high purity graphite (area ratio=1:9) and the fixing member 1606. Under these conditions, an intermediate layer was formed while taking matching so as to continue stable discharging. In this manner, discharge was continued for 2 minutes to form an intermediate layer constituted of a-Si$_x$C$_{1-x}$:F. Then, the high frequency power source 1631 was turned off for intermission of discharge. The valves 1612, 1613 of the bombs 1609, 1610 were respectively closed, with full opening of the main valve 1629, to evacuate the chamber 1601 and the flowmeters 1624, 1625 to $10^{-5}$ torr, followed by closing of the main valve 1629 the auxiliary valve 1627, the outflow valves 1618, 1619 and the inflow valves 1615, 1616. Next, the SiF$_4$ gas bomb 1610 was replaced with the bomb of SiF$_4$ gas (99.999%) containing 10 vol % of H$_2$ [hereinafter referred to as SiF$_4$/H$_2$(10)]. After the main valve 1629 was opened to evacuate the chamber 1601 to $5 \times 10^{-7}$ torr, the valve 1613 of the bomb 1610 was opened to adjust the outlet pressure gauge 1622 at 1 kg/cm$^2$, followed by gradual opening of the outflow valve 1616 to let in the SiF$_4$/H$_2$(10) gas into the flowmeter 1625. Subsequently, the outflow valve 1619 was gradually opened. Subsequently, the valve 1614 of the bomb 1611 containing B$_2$H$_6$ gas diluted to 500 vol. ppm with H$_2$ [hereinafter referred to as B$_2$H$_6$(500)/H$_2$] was opened and, with adjustment of the outlet pressure gauge 1623 at 1 kg/cm$^2$, the inflow valve 1617 was gradually opened to introduce the B$_2$H$_6$(500)/H$_2$ gas to flow into the flowmeter 1626. Then, the outflow valve 1620 was gradually opened, followed by opening gradually of the auxiliary valve 1627. The feed valves 1616, 1617 were thereby adjusted so that the feed gas ratio of SiF$_4$/H$_2$(10) to B$_2$H$_6$(500)/H$_2$ could be 70:1. Then, while carefully reading the Pirani gauge 1630, the openings of the auxiliary valve 1627 and the main valve 1629 were adjusted and opened to the extent until the inner pressure in the chamber 1601 became 0.5 torr. After confirming that the gas feeding and the inner pressure were stable, the shutter 1608 was closed, followed by turning on of the high frequency power source 1637, to input a high frequency power of 13.56 MHz between the electrodes 1606 and 1608, thereby generating glow discharge in the chamber 1601 to provide an input power of 60 W. After glow discharge was continued for 3 hours to form a photoconductive layer, the heater 1607 was turned off and the substrate is left to cool to 100° C., whereupon the outflow valves 1619, 1620 and the inflow valves 1616, 1617 were closed, with the main valve 1629 fully opened, thereby to make the inner pressure in the chamber 1601 to $10^{-5}$ torr or less. Then, the main valve 1629 was closed and the inner pressure in the chamber 1601 was made atmospheric through the leak valve 1628, and the substrate having formed each layer thereon was taken out. In this case, the total thickness of the layers was about 9μ. The thus prepared image forming member for electrophotography was placed in a charge and light-exposure experimental device, and corona charge was effected at ⊕6.0 KV for 0.2 sec., followed immediately by projection of a light image. The light image was projected through a transmission type test chart using a tungsten lamp as light source at a dosage of 0.8 lux.sec.

Immediately thereafter, a negatively charged developer (containing toner and carrier) was cascaded on the surface of the member to obtain a good toner image on the image forming member for electrophotography. When the toner image on the image forming member for electrophotography was copied on a copying paper by corona charging at ⊕5.0 KV, there was obtained a clear and sharp image of high density which was excellent in resolution as well as in gradation reproducibility.

Next, the above image forming member was subjected to corona charging by means of a charge light-exposure experimental device at ⊖5.5 KV for 0.2 sec., followed immediately image exposure to light at a dosage of 0.8 lux.sec., and thereafter immediately positively charged developer was cascaded on the surface of the member. Then, by copying on a copying paper and fixing, there was obtained a very clear and sharp image.

As apparently seen from the above result, in combination with the previous result, the image forming member for electrophotography has the characteristics of a both-polarity image forming member having no dependency on the charge polarity.

EXAMPLE 59

After formation of an intermediate layer according to the same procedures and conditions as in Example 58 for 2 minutes, the high frequency power source 1631 and the heater 1607 were turned off, and the outflow valves 1618, 1619 and the inflow valves 1615, 1616 were closed. Upon reaching 100° C. of the substrate temperature, the auxiliary valve 1627 and the main valve 1629 were closed. Subsequently, the leak valve 1628 was opened to leak the deposition chamber 1601 to atmospheric. Under these conditions, the target 1603 of high purity graphite was removed to leave only the high purity silicon target 1604 alone.

Thereafter, with the leak valve 1628 closed, the deposition chamber 1601 was evacuated to $5 \times 10^{-7}$ torr, and then the auxiliary valve 1627, and the outflow valves 1618, 1619 opened to effect thoroughly evacuation of the flowmeters 1624, 1625, followed by closing of the outflow valves 1618, 1619 and the auxiliary valve 1627. The substrate 1602 was again maintained at 200° C. by turning on the heater 1607. And the valve 1613 of the bomb 1610 containing SiF$_4$ gas (purity: 99.999%) and the valve 1612 of the Ar gas bomb 1609 were opened, to adjust the pressures at the outlet gauges 1622, 1621 at 1 kg/cm² respectively. Subsequently, the outflow valves 1619 and 1618 were gradually opened and the inflow valves 1616, 1615 were gradually opened to introduce SiF$_4$ gas and Ar gas into the flowmeters 1625, 1624, respectively, followed by gradual opening of the auxiliary valve 1627. The inflow valves 1616, 1615 were adjusted thereby so that the feed ratio of SiF$_4$ gas to Ar gas was 1:20. Then, while carefully reading the Pirani gauge 1630, the opening of the auxiliary valve 1627 was adjusted and the auxiliary valve 1627 was opened to the extent until the inner pressure in the chamber 1601 became $1 \times 10^{-4}$ torr. After the inner pressure in the chamber 1601 was stabilized, the main valve 1629 was gradually closed to narrow its opening until the indication on the Pirani gauge 1630 became $1 \times 10^{-2}$ torr. After confirming that the flowmeters 1625, 1624 were stable, with the shutter 1608 opened, the high frequency power source 1631 was switched on to input alternate current power of 13.56 MHz, 100 W between the high purity polycrystalline Si target 1604 and the support member 1606. While taking matching so as to continue stable discharge, formation layer was carried out. Discharge was thus continued for 3 hours to form a photoconductive layer. Thereafter, the heater 1607 and the high frequency power source 1631 were turned off. Upon reaching 100° C. of the substrate temperature, the outflow valves 1618, 1619 and inflow valves 1615, 1616, 1617 were closed, with full opening of the main valve 1629 to evacuate the chamber 1601 to $10^{-5}$ torr or less. Then, the main valve 1629 was closed and chamber 1601 was made atmospheric through the leak valve 1628, and the substrate having formed respective layers was taken out. In this case, the total thickness of the layers was about 9μ. The thus prepared image forming member for electrophotography was placed in a charge light-exposure experimental device, and corona charge was effected at ⊖6.0 KV for 0.2 sec., followed immediately by projection of a light image. The light image was projected through a transmission type test chart using a tungsten lamp as light source at a dosage of 0.8 lux.sec.

Immediately thereafter, a positively charged developer (containing toner and carrier) was cascaded on the surface of the member to obtain a good toner image on the image forming member for electrophotography. When the toner image on the image forming member for electrophotograpy was copied on a copying paper by corona charging at ⊖5.0 KV, there was obtained a clear and sharp image of high density which was excellent in resolving power as well as in gradation reproducibility.

EXAMPLE 60

After conducting formation of an intermediate layer for one minute and then formation of a photoconductive layer for 5 hours on a molybdenum substrate according to the same procedures under the same conditions as described in Example 50, various upper layers were provided as shown in Table 21.

Then, charge, exposure to light and copying were conducted in a similar was to that described in Example 50 with respect to both polarities ⊕ and ⊖, whereby no dependency on charge polarity was observed and very clear toner images were obtained.

TABLE 21

| Sample No. | Starting gas or Target | Upper layer: Feed gas ratio | Preparation method | Power (W) | Layer thickness (A) |
|---|---|---|---|---|---|
| 1 | SiH$_4$ (dil., 10 vol. % with H$_2$) C$_2$H$_4$ (dil., 10 vol. % with H$_2$) | SiH$_4$ (+H$_2$):C$_2$H$_4$ (+H$_2$) = 1:9 | Glow | 3 | 120 |
| 2 | Si(CH$_3$)$_4$ (dil., 10% with H$_2$) | — | Glow | 3 | 120 |
| 3 | Polycrystalline Si target Graphite target | Si:C = 1:9 | sputtering | 100 | 120 |
| 4 | Polycrystalline Si target N$_2$ (dil., 50 vol. % with Ar) | — | Sputtering | 100 | 200 |
| 5 | Si$_3$N$_4$ target N$_2$ (dil., 50 vol. % with Ar) | — | sputtering | 100 | 200 |
| 6 | SiH$_4$ (dil., 10 vol. % with H$_2$) N$_2$ | SiH$_4$ (+H$_2$):N$_2$ = 1:10 | Glow | 3 | 120 |
| 7 | SiH$_4$ (dil., 10 Vol. % with H$_2$) NH$_3$ (dil., 10 vol. % with H$_2$) | SiH$_4$ (+H$_2$):NH$_3$ (+H$_2$) = 1:2 | Glow | 100 | 120 |
| 8 | SiF$_4$ (H$_2$ content: 10 vol. %) N$_2$ | SiF$_4$ (+H$_2$):N$_2$ = 1:50 | Glow | 60 | 120 |
| 9 | SiF$_4$ (H$_2$ content: 10 vol. %) NH$_3$ (dil., 10 vol. % with H$_2$) | SiF$_4$ (+H$_2$):NH$_3$ (+H$_2$) = 1:20 | Glow | 60 | 120 |

(Remarks)
In Table 21, the following materials were employed:
Support: Molybdenum substrate, 0.5 mm × 10 cm × 10 cm
Intermediate layer: Using C wafer placed on Si wafer as target, sputtering was conducted in Ar atmosphere. Si:C (area ratio) = 1:9
Photoconductive layer: SiF$_4$ gas (containing 10 vol. % H$_2$)
B$_2$H$_6$ gas (diluted to 500 vol. ppm with H$_2$)
SiF$_4$/H$_2$ (10):B$_2$H$_6$ (500)/H$_2$ (feed ratio) = 70:1

What we claim is:

1. A photoconductive member comprising: a support, a photoconductive layer consitituted of an amorphous material containing silicon atoms as a matrix and containing hydrogen atoms or halogen atoms, and an intermediate layer provided between them, said intermediate layer having a function to bar penetration of carriers from the side of the support into the photoconductive layer and to permit passage from the photoconductive layer to the support of photocarriers generated in the photoconductive layer by projection of electromagnetic waves and movement of the photocarriers toward the side of the support, and said intermediate layer being constituted of an amorphous material containing silicon atoms and carbon atoms as constituents and wherein said intermediate layer is non-photoconductive in the visible light region and is from 30 to 1,000 Angstroms in thickness.

2. A photoconductuve member according to claim 1, wherein amorphous material constituting the intermediate layer contains carbon atoms in the range of 60–90 atomic percent.

3. A photoconductive member according to claim 1, wherein said amorphous material constituting the intermediate layer further contains hydrogen atoms as a constituent.

4. A photoconductive member according to claim 3, wherein said amorphous material contains hydrogen atoms in the range of 2–35 atomic percent.

5. A photoconductive member according to claim 1, wherein said amorphous material constituting the intermediate layer contains carbon atoms in the range of 30–90 atomic percent and further hydrogen atoms 2–35 atomic percent as a constituent.

6. A photoconductive member according to claim 1, wherein said amorphous material constituting the intermediate layer further contains halogen atoms as a constituent.

7. A photoconductive member according to claim 6, wherein said amorphous material contains halogen atoms in the range of 1–20 atomic percent.

8. A photoconductive member according to claim 1, wherein said amorphous material constituting the intermediate layer further contains hydrogen atoms and halogen atoms as constituents.

9. A photoconductive member according to claim 8, wherein said amorphous material contains halogen atoms in the range of 1–20 atomic percent and hydrogen atoms up to 19 atomic percent.

10. A photoconductive member according to claim 1, wherein said intermediate layer is electrically insulative.

11. A photoconductive member according to claim 1, wherein said photoconductive layer has resistance of at least $5 \times 10^9 \Omega$ cm.

12. A photoconductive member according to claim 1, wherein said photoconductive layer is 1–100 microns in thickness.

13. A photoconductive member according to claim 1, wherein said photoconductive layer contains hydrogen atoms in the range of 1–40 atomic percent.

14. A photoconductive member according to claim 1, wherein said photoconductive layer contains halogen atoms in the range of 1–40 atomic percent.

15. A photoconductive member according to claim 1, wherein said photoconductive layer contains hydrogen atoms and halogen atoms in the range of 1–40 atomic percent in total.

16. A photoconductive member according to claim 1, wherein said photoconductive layer contains n-type impurity.

17. A photoconductive member according to claim 16, wherein said n-type impurity is an element in Group V A of the periodic table.

18. A photoconductive member according to claim 17, wherein said element in Group V A of the periodic table is selected from N, P, As, Sb and Bi.

19. A photoconductive member according to claim 16, wherein said photoconductive layer contains n-type impurity in the range of $10^{-8}$–$10^{-3}$ atomic ratio.

20. A photoconductive member according to claim 1, wherein said photoconductive layer contains p-type impurity.

21. A photoconductive member according to claim 20, wherein said p-type impurity is an element in Group III A of the periodic table.

22. A photoconductive member according to claim 21, wherein said element in Group III A is selected from B, Al, Ga, In and Tl.

23. A photoconductive member according to claim 20, wherein said photoconductive layer contains p-type impurity in the range of $10^{-6}$–$10^{-3}$ atomic ratio.

24. A photoconductive member according to claim 1, wherein an upper layer is provided on the upper surface of said photoconductive layer.

25. A photoconductive member according to claim 24, wherein said upper layer is composed of an amorphous material containing silicon atoms as matrix.

26. A photoconductive member according to claim 25, wherein said amorphous material further contains as constitution element at least one selected from the group consisting of carbon, oxygen and nitrogen atoms.

27. A photoconductive member according to claim 25 or 26, wherein said amorphous material further contains hydrogen atoms or halogen atoms or both as a constituent.

28. A photoconductive member according to claim 26, wherein said amorphous material contains carbon atoms in the range of 60–90 atomic percent.

29. A photoconductive member according to claim 25, wherein said upper layer contains carbon atoms in the range of 30–90 atomic percent and hydrogen atoms in the range of 2–35 atomic percent, each being.

30. A photoconductive member according to claim 25, wherein said upper layer contains carbon atoms in the range of 40–90 atomic percent, halogen atoms in the range of 1–20 atomic percent and hydrogen atoms up to 19 atomic percent.

31. A photoconductive member according to claim 24, wherein said upper layer is 30–1000 Å in thickness.

32. A photoconductive member according to claim 24, wherein said upper layer is composed of inorganic insulating materials.

33. A photoconductive member according to claim 24, wherein said upper layer is composed of organic insulating materials.

34. A photoconductive member according to claim 24, wherein said upper layer is non-photoconductive with respect to visible rays.

35. A photoconductive member according to claim 24, wherein said upper layer is electrically insulative.

36. A photoconductive member according to claim 1 or 24, wherein said photoconductive member further comprises a surface protecting layer of 0.5–70 microns in thickness.

37. A photoconductive member according to claim 1, wherein said intermediate layer contains carbon atoms in the range of 40–90 atomic percent, and further halogen atoms in the range of 1–20 atomic percent and hydrogen atoms up to 19 atomic percent.

38. A photoconductive member according to claim 1, wherein halogen atom is selected from F, Cl and Br.

39. A photoconductive member having a support, a photoconductive layer constituted of an amorphous material containing silicon atoms as matrix and containing hydrogen atoms and halogen atoms as a constituent, and an intermediate layer provided between said support and said photoconductive layer, characterized in that said intermediate layer is constituted of an amorphous material containing silicon atoms and carbon atoms as constitution elements and wherein said intermediate layer is non-photoconductive in the visible light region and is from 30 to 1,000 Angstroms in thickness.

40. A photoconductive member according to claim 39, wherein said amorphous material constituting the intermediate layer contains carbon atoms in the range of 60–90 atomic percent.

41. A photoconductive member according to claim 39, wherein said amorphous material constituting the intermediate layer further contains hydrogen atoms as a constituent.

42. A photoconductive member according to claim 41, wherein said amorphous material contains hydrogen atoms in the range of 2–35 atomic percent.

43. A photoconductive member according to claim 39, wherein said amorphous material constituting the intermediate layer contains carbon atoms in the range of 30–90 atomic percent and further hydrogen atoms 2–35 atomic percent as a constituent.

44. A photoconductive member according to claim 39, wherein said amorphous material constituting the intermediate layer further contains halogen atoms as a constituent.

45. A photoconductive member according to claim 44, wherein said amorphous material contains halogen atoms in the range of 1–20 atomic percent.

46. A photoconductive member according to claim 39, wherein said amorphous material constituting the intermediate layer further contains hydrogen atoms and halogen atoms as constituents.

47. A photoconductive member according to claim 46, wherein said amorphous material contains halogen atoms in the range of 1–20 atomic percent and hydrogen atoms up to 19 atomic percent.

48. A photoconductive member according to claim 39, wherein said intermediate layer is electrically insulative.

49. A photoconductive member according to claim 39, wherein said photoconductive layer has resistance of at least $5 \times 10^9 \Omega cm$.

50. A photoconductive member according to claim 39, wherein said photoconductive layer is 1–100 microns in thickness.

51. A photoconductive member according to claim 39, wherein said photoconductive layer contains hydrogen atoms in the range of 1–40 atomic percent.

52. A photoconductive member according to claim 39, wherein said photoconductive layer contains halogen atoms in the range of 1–40 atomic percent.

53. A photoconductive member according to claim 39, wherein said photoconductive layer contains hydrogen atoms and halogen atoms in the range of 1–40 atomic percent in total.

54. A photoconductive member according to claim 39, wherein said photoconductive layer contains n-type impurity.

55. A photoconductive member according to claim 54, wherein said n-type impurity is an element in Group V A of the periodic table.

56. A photoconductive member according to claim 55, wherein said element in Group V A of the periodic table is selected from N, P, As, Sb and Bi.

57. A photoconductive member according to claim 54, wherein said photoconductive layer contains n-type impurity in the range of $10^{-8}$–$10^{-3}$ atomic ratio.

58. A photoconductive member according to claim 39, wherein said photoconductive layer contains p-type impurity.

59. A photoconductive member according to claim 58, wherein said p-type impurity is an element in Group III A of the periodic table.

60. A photoconductive member according to claim 59, wherein said element in Group III A is selected from B, Al, Ga, In and Tl.

61. A photoconductive member according to claim 58, wherein said photoconductive layer contains p-type impurity in the range of $10^{-6}$–$10^{-3}$ atomic ratio.

62. A photoconductive member according to claim 39, wherein an upper layer is provided on the upper surface of an photoconductive layer.

63. A photoconductive member according to claim 62, wherein said upper layer is composed of an amorphous material containing silicon atoms as matrix.

64. A photoconductive member according to claim 63, wherein said amorphous material further contains as constitution element at least one selected from the group consisting of carbon, oxygen and nitrogen atoms.

65. A photoconductive member according to claim 63 or 64, wherein said amorphous material further contains hydrogen atoms or halogen atoms or both as a constituent.

66. A photoconductive member according to claim 64, wherein said amorphous material contains carbon atoms in the range of 60–90 atomic percent.

67. A photoconductive member according to claim 63, wherein said upper layer contains carbon atoms in the range of 30–90 atomic percent and hydrogen atoms in the range of 2–35 atomic percent each being.

68. A photoconductive member according to claim 63, wherein said upper layer contains carbon atoms in the range of 40–90 atomic percent, halogen atoms in the range of 1–20 atomic percent and hydrogen atoms up to 19 atomic percent.

69. A photoconductive member according to claim 62, wherein said upper layer is 30–1000 Å in thickness.

70. A photoconductive member according to claim 62, wherein said upper layer is composed of inorganic insulating materials.

71. A photoconductive member according to claim 62, wherein said upper layer is composed of organic insulating materials.

72. A photoconductive member according to claim 62, wherein said upper layer is non-photoconductive with respect to visible rays.

73. A photoconductive member according to claim 62, wherein said upper layer is electrically insulative.

74. A photoconductive member according to claim 39 or 62, wherein said photoconductive member further comprises a surface protecting layer of 0.5–70 microns in thickness.

75. A photoconductive member according to claim 39, wherein said intermediate layer contains carbon atoms in the range of 40–90 atomic percent, and further halogen atoms in the range of 1–20 atomic percent and hydrogen atoms up to 19 atomic percent.

76. A photoconductive member having a support, a photoconductive layer constituted of an amorphous material containing silicon atoms as matrix and containing hydrogen atoms or halogen atoms as a constituent, and a non-photoconductive layer in the visible light region constituted of an amorphous material containing silicon atoms and carbon atoms as constitution elements in contact with said photoconductive layer, wherein the non-photoconductive layer is from 30 to 1,000 Angstroms in thickness.

77. A photoconductive member according to claim 76, wherein the amount of carbon atoms in said amorphous material of the non-photoconductive layer ranges from 60–90 atomic percent.

78. A photoconductive member according to claim 76, wherein said amorphous material of the non-photoconductive layer contains hydrogen atoms as a constituent.

79. A photoconductive member according to claim 78, wherein said hydrogen atoms are present in the range of 2-35 atomic percent.

80. A photoconductive member according to claim 76, wherein said amorphous material of the non-photoconductive layer contains carbon atoms in the range of 30-90 atomic percent and hydrogen atoms in the range of 2-35 atomic percent.

81. A photoconductive member according to claim 76, wherein said amorphous material of the non-photoconductive layer containing carbon atoms further contains halogen atoms as a constituent.

82. A photoconductive member according to claim 81, wherein said halogen atoms are present in the range of 1-20 atomic percent.

83. A photoconductive member according to claim 76, wherein said amorphous material of the non-photoconductive layer further contains hydrogen atoms and halogen atoms as constituents.

84. A photoconductive member according to claim 83, wherein said halogen atoms are present in the range of 1-20 atomic percent and said hydrogen atoms are present up to 19 atomic percent.

85. A photoconductive member according to claim 76, wherein said non-photoconductive layer is electrically insulative.

86. A photoconductive member according to claim 76, wherein said photoconductive layer has resistance of at least $5 \times 10^9$ ohm cm.

87. A photoconductive member according to claim 76, wherein said photoconductive layer is 1-100 microns in thickness.

88. A photoconductive member according to claim 76, wherein said photoconductive layer contains hydrogen atoms in the range of 1-40 atomic percent.

89. A photoconductive member according to claim 76, wherein said photoconductive layer contains halogen atoms in the range of 1-'atomic percent.

90. A photoconductive member according to claim 76, wherein said photoconductive layer contains hydrogen atoms and halogen atoms in the range of 1-40 atomic percent in total.

91. A photoconductive member according to claim 76, wherein said photoconductive layer contains N-type impurity.

92. A photoconductive member according to claim 91, wherein said N-type impurity is an element in Group V A of the Periodic Table.

93. A photoconductive member according to claim 92, wherein said element in Group V A of the Periodic Table is selected from N, P, As, Sb and Bi.

94. A photoconductive member according to claim 91, wherein said photoconductive layer contains N-type impurity in the range of $10^{-8}$ to $10^{-3}$ atomic ratio.

95. A photoconductive member according to claim 76, wherein said photoconductive layer contains P-type impurity.

96. A photoconductive member according to claim 95, wherein said P-type impurity is an element in Group III A of the Periodic Table.

97. A photoconductive member according to claim 96, wherein said element in Group III A is selected from B, Al, Ga, In and Tl.

98. A photoconductive member according to claim 95, wherein said photoconductive layer contains P-type impurity in the range of $10^{-6}$ to $10^{-3}$ atomic ratio.

* * * * *

UNITED STATES PATENT AND TRADEMARK OFFICE
CERTIFICATE OF CORRECTION

PATENT NO. : 4,394,425                                    Page 1 of 7

DATED : July 19, 1983

INVENTOR(S) : SHIMIZU, ET AL.

It is certified that error appears in the above-identified patent and that said Letters Patent is hereby corrected as shown below:

Abstract, line 14, "atoms a" should be --atoms as--.
Col. 1, line 61, "orgainc" should be --organic.
Col. 2, line 12, "followings" should be --following--.
Col. 2, line 24, "amorphout" should be --amorphous--.
Col. 3, line 43, "embodiment" should be --embodiments--.
Col. 4, line 24, "berring" should be --barring--.
Col. 4, line 40, "base" should be --basis--.
Col. 6, line 13, "factor" should be --factors--.
Col. 6, line 25, "factors" should be --factor--.
Col. 7, line 18, "diposition" should be --deposition--.
Col. 7, line 62, "a n-type" should be --an n-type--.
Col. 8, line 42, "function that" should be --function as that--.
Col. 8, line 54, "easily" should be --easy--.
Col. 10, line 10, "alone a" should be --alone as--.
Col. 10, line 44, "of" should be --or--.
Col. 11, line 44, "embodiment" should be --embodiments--.
Col. 12, line 18, "of", second occurrence should be -- or --.
Col. 12, line 38, "silanes gas" should be -- silane gases --.
Col. 12, line 64, "are" should be --is--.

UNITED STATES PATENT AND TRADEMARK OFFICE
CERTIFICATE OF CORRECTION

PATENT NO. : 4,394,425

DATED : July 19, 1983

INVENTOR(S) : SHIMIZU, ET AL.

It is certified that error appears in the above-identified patent and that said Letters Patent is hereby corrected as shown below:

Col. 12, line 67, "As other" should be --As with other--.
Col. 15, line 31, "contains" should be --containing--.
Col. 16, line 67, "are" should be --is--.
Col. 17, line 2, "As" should be --As in--.
Col. 17, line 27, "intermediate 502" should be --intermediate layer 502--.
Col. 18, line 21, "both of" should be --both--.
Col. 19, line 12, after "from" insert --the--.
Col. 19, line 18, "embodiment" should be --embodiments--.
Col. 19, line 50, after "resistivity" insert --,--.
Col. 20, line 56, "comprises" should be --comprise--.
Col. 21, line 67, "both" should be -- both, impurities--.
Col. 22, line 5, "an elements" should be --an element--.
Col. 22, line 8, "a n-type" should be --an n-type--.
Col. 22, line 15, "703, which is" should be --703 is--.
Col. 22, line 39, "to described" should be --to that described--.
Col. 24, line 17, "Wnen" should be --When--.
Col. 25, line 42, "caused" should be --caused by--.
Col. 26, line 54, "extent until" should be --extent that--.
Col. 27, line 30, "immediately" should be --immediately by--.

UNITED STATES PATENT AND TRADEMARK OFFICE
CERTIFICATE OF CORRECTION

PATENT NO. : 4,394,425

DATED : July 19, 1983

INVENTOR(S) : SHIMIZU, ET AL.

It is certified that error appears in the above-identified patent and that said Letters Patent is hereby corrected as shown below:

Col. 28, line 16, "for" should be --to--.
Col. 28, line 43, "similarly" should be --similar--.
Col. 28, line 45, "lead" should be --leak--.
Col. 28, line 56, "power source" should be --a power source--.
Col. 29, line 32, "also closing" should be --closing also--.
Col. 29, line 50, "a electron-beam" should be --an electron-beam--.
Col. 30, line 10, "a upper" should be --an upper--.
Col. 30, line 16, "1 x 10$^{-5}$" should be --1 x 10$^{-5}$ torr--.
Col. 30, line 22, "place" should be --placed--.
Col. 30, line 34, "Kv. As a result,a" should be --KV,a--.
Col. 31, line 5, "to 100°C" should be --of 100°C--.
Col. 31, line 20, "Examples" should be --Example--.
Col. 32, line 28, "formng" should be --forming--.
Col. 34, line 29, "immediately" should be --immediately by--.
Col. 37, line 52, "depending" should be --dependency--.
Col. 38, line 25, "When" should be --Then--.
Col. 39, line 12, "introduct" should be --introduce--.
Col. 39, line 18, "adjusted" should be --adjustment--.
Col. 39, line 55, "simiarly" should be --similarly--.

UNITED STATES PATENT AND TRADEMARK OFFICE
CERTIFICATE OF CORRECTION

PATENT NO. : 4,394,425　　　　　　　　　　　　Page 4 of 7
DATED　　 : July 19, 1982
INVENTOR(S): SHIMIZU, ET AL.

It is certified that error appears in the above-identified patent and that said Letters Patent is hereby corrected as shown below:

Col. 40, line 4,　"⊕" should be -- ⊖ --.
Col. 40, line 13, "previously" should be --previously charged--.
Col. 42, line 12, "a" should be --an-- first occurrence.
Col. 45, line 43, "When" should be --Then--.
Col. 46, line 58, "an" should be --a--.
Col. 48, line 12, "(SiC)" should be --(Si/C)--.
Col. 49, line 15, after "immediately" insert --by--.
Col. 49, line 37, "an" should be --a--.
Col. 49, line 53, "valve" should be --valves--.
Col. 50, line 11, after "5 x $10^{-7}$" insert --torr.--.
Col. 50, line 39, "1801" should be --1810--.
Col. 51, line 15, after "immediately" insert --by--.
Col. 51, line 50, "a" should be --an-- first occurrence.
Col. 52, line 31, "a-si:F" should be --a-Si:F--.
Col. 52, line 34, after "to" insert --that--.
Col. 52, line 57, "a" should be --an--.
Col. 53, line 53, "of" should be --for--.

UNITED STATES PATENT AND TRADEMARK OFFICE
CERTIFICATE OF CORRECTION

PATENT NO. : 4,394,425

DATED : July 19, 1982

INVENTOR(S) : SHIMIZU, ET AL.

It is certified that error appears in the above-identified patent and that said Letters Patent is hereby corrected as shown below:

Col. 53, line 58, "Examples" should be --Example--.
Col. 53, line 64, after "described" insert --in--.
Col. 54, line 6, Insert --)-- after "$H_2$"
Col. 54, line 66, "substrage" should be --substrate--.
Col. 55, line 19, "to describe" should be --to that described--.
Col. 55, line 40, "gage" should be --gauge--.
Col. 56, line 26, "Examples" should be --Example--.
Col. 56, last line after "$B_2H_6$" delete "ratio" first occurrence--.
Col. 57, line 15, "alumelchromel" should be --alumel-chromel--.
Col. 57, line 59, "condition" should be --conditions--.
Col. 57, line 60, after "power" insert --source--.
Col. 58, line 42, "chage" should be --charge--.
Col. 58, line 60, after "immediately" insert --by--.
Col. 59, line 28, "a" should be --an-- first occurrence.
Col. 60, line 11, after "1513" insert --was--.
Col. 60, line 34, "1501 to" should be --1501 adjusted to--.
Col. 60, line 44, "Examples" should be --Example--.
Col. 61, line 17, "When" should be --Then--.
Col. 62, line 42, "A" should be --Å--.

UNITED STATES PATENT AND TRADEMARK OFFICE
CERTIFICATE OF CORRECTION

PATENT NO. : 4,394,425  
DATED : July 19, 1982  
INVENTOR(S) : SHIMIZU, ET AL.

Page 6 of 7

It is certified that error appears in the above-identified patent and that said Letters Patent is hereby corrected as shown below:

Col. 62, line 54, "valve" should be --valves-- first occurrence.  
Col. 64, line 7, after "to" insert --that--.  
Col. 64, line 36, "atmosphere" should be --atmospheric--.  
Col. 64, line 60, "image" should be --images--.  
Col. 65, Table 17, Intermediate layer, Col. heading, "Layer thickness (A)" should be --Layer thickness (Å)--.  
Col. 66, Table 17, Upper Layer, Col. heading, "Layer thickness (A)" should be --Layer thickness (Å)--.  
Col. 65, line 39, "spuare" should be --square--.  
Col. 66, line 63, "flowmeters" should be --flowmeter--.  
Col. 66, line 67, "information" should be --in formation--.  
Col. 67, line 24, "tungstent" should be --tungsten--.  
Col. 67, line 38, after "immediately" should be --by--.  
Col. 68, line 8, after "apparently" insert --seen--.  
Col. 68, line 27, "in" should be --is--.  
Col. 69, line 13, "inport" should be --input--.  
Col. 70, line 8, "valves" should be --value-- first occurrence.  
Col. 70, line 23, "Examples" should be --Example--.

UNITED STATES PATENT AND TRADEMARK OFFICE
CERTIFICATE OF CORRECTION

PATENT NO. : 4,394,425

Page 7 of 7

DATED : July 19, 1983

INVENTOR(S) : SHIMIZU, ET AL.

It is certified that error appears in the above-identified patent and that said Letters Patent is hereby corrected as shown below:

Col. 70, line 60, "a" should be --an--.
Col. 71, line 17, "KV." should be --KV,--.
Col. 71, line 18, delete "a".
Col. 71, line 24, "1000A" should be --1000Å--.
Col. 72, line 32, "porjected" should be --projected--.
Col. 72, line 55, "as" should be --at--.
Col. 72, line 62, "effecgted" should be --effected--.
Col. 73, line 28, "/-" should be --and--.
Col. 73, line 43, "(99.999%) should be --(purity: 99.99%)--.
Col. 74, line 36, after "immediately" should be --by--.
Col. 76, line 20, "was" should be --way--.
Col. 76, Table 21, Col. heading, "Layer thickness (A)" should be --Layer thickness (Å)--.
Claim 2, line 1, "photoconductuve" should be --photoconductive--.
Claim 29, line 4, delete ", each being".
Claim 31, line 2, "1000A" should be --1000Å--.
Claim 62, line 3, "an" should be --said--.
Claim 67, line 4, delete "each being".
Claim 69, line 2, "A" should be --Å--.
Claim 89, line 3, after "1-" insert --40--.

Signed and Sealed this

Twenty-fourth Day of April 1984

[SEAL]

Attest:

GERALD J. MOSSINGHOFF

Attesting Officer

Commissioner of Patents and Trademarks